US012433092B2

(12) United States Patent
Kim et al.

(10) Patent No.: US 12,433,092 B2
(45) Date of Patent: Sep. 30, 2025

(54) DISPLAY DEVICE

(71) Applicant: Samsung Display Co., LTD., Yongin-si (KR)

(72) Inventors: Youn Joon Kim, Seoul (KR); Jin Ho Ju, Seoul (KR); Hye Min Park, Cheongju-si (KR); Jong Hyun Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 490 days.

(21) Appl. No.: 17/851,629

(22) Filed: Jun. 28, 2022

(65) Prior Publication Data
US 2023/0134887 A1 May 4, 2023

(30) Foreign Application Priority Data

Nov. 2, 2021 (KR) ........................ 10-2021-0148429

(51) Int. Cl.
*H10K 50/844* (2023.01)
*H10K 59/131* (2023.01)

(52) U.S. Cl.
CPC ......... *H10K 50/844* (2023.02); *H10K 59/131* (2023.02)

(58) Field of Classification Search
CPC .. H10K 50/844; H10K 59/131; H10K 59/124; H01L 27/124; H01L 27/1255; H01L 27/1248
See application file for complete search history.

(56) References Cited

U.S. PATENT DOCUMENTS

| | | | |
|---|---|---|---|
| 2014/0097006 A1* | 4/2014 | Park .......................... | C23F 1/18 174/257 |
| 2018/0158895 A1* | 6/2018 | Lee ...................... | H10K 59/124 |
| 2018/0190750 A1* | 7/2018 | Choi .................. | H10K 59/1213 |
| 2019/0115412 A1* | 4/2019 | Cha .................... | H10K 59/1216 |
| 2019/0123128 A1* | 4/2019 | Park .................. | H10K 59/1213 |
| 2019/0189941 A1* | 6/2019 | Kim ...................... | H10K 59/123 |
| 2019/0267440 A1* | 8/2019 | Park .................. | H10K 59/1216 |
| 2019/0278145 A1 | 9/2019 | Tanaka et al. | |
| 2020/0043955 A1 | 2/2020 | Suzuki et al. | |
| 2020/0176657 A1* | 6/2020 | Jang .................... | H01L 25/0753 |
| 2020/0243632 A1* | 7/2020 | Lee ...................... | G09G 3/3241 |
| 2020/0243633 A1* | 7/2020 | Kang ................. | H10K 59/1216 |

(Continued)

FOREIGN PATENT DOCUMENTS

| | | |
|---|---|---|
| KR | 10-2019-0071855 | 6/2019 |
| KR | 10-2022-0092698 | 7/2022 |

*Primary Examiner* — Bitew A Dinke
(74) *Attorney, Agent, or Firm* — Innovation Counsel LLP

(57) ABSTRACT

A display device includes a protective layer comprising a first area, a second area, a third area, and a fourth area; a first island part comprising a buffer layer disposed on a substrate; and a semiconductor layer disposed on the buffer layer; a second island part comprising a first gate insulating layer disposed on the first area; and a first metal layer disposed on the first gate insulating layer; a third island part comprising a second gate insulating layer disposed on the second area; and a second metal layer disposed on the second gate insulating layer; and a fourth island part comprising an interlayer dielectric layer disposed on the third area and a third metal layer disposed on the interlayer dielectric layer, and disposed in the fourth area of the protective layer.

23 Claims, 39 Drawing Sheets

(56) References Cited

U.S. PATENT DOCUMENTS

| | | | |
|---|---|---|---|
| 2020/0266260 A1* | 8/2020 | Park | H01L 27/1255 |
| 2020/0321292 A1* | 10/2020 | Park | H10K 59/131 |
| 2021/0028258 A1* | 1/2021 | Lee | H10K 59/131 |
| 2021/0066433 A1* | 3/2021 | Cha | H10K 59/131 |
| 2021/0134923 A1* | 5/2021 | Kim | H10K 50/844 |
| 2021/0151542 A1* | 5/2021 | Choe | H10K 59/126 |
| 2021/0191552 A1* | 6/2021 | Bok | G06F 1/1643 |
| 2021/0202633 A1* | 7/2021 | Song | H10K 59/124 |
| 2021/0249491 A1* | 8/2021 | Kim | H10K 59/1213 |
| 2021/0249498 A1* | 8/2021 | Cho | H10K 50/80 |
| 2021/0265451 A1* | 8/2021 | Son | H10K 59/131 |
| 2021/0320163 A1* | 10/2021 | Bang | H10K 59/131 |
| 2021/0384481 A1* | 12/2021 | Sun | H10K 71/00 |
| 2022/0199748 A1* | 6/2022 | Kim | H10K 59/121 |
| 2022/0208899 A1 | 6/2022 | Yoon et al. | |
| 2022/0310005 A1* | 9/2022 | Chen | H10K 59/8791 |
| 2022/0328600 A1* | 10/2022 | Dong | H10K 59/1216 |

\* cited by examiner

1500: Vint1, SL1, SL2, EL, SL3, Vint2
1700: DL1, VDDL, CNE1, CNE4, CNE7

1200: 1210, 1220, 1230, 1240, 1250, 1260, 1270

1200: 1210, 1220, 1230, 1240, 1250, 1260, 1270
1300: 1310, 1320, 1330, 1340, 1350, 1360, 1370
1330: 1330a, 1330b
1340: 1340a, 1340b
1370: 1370a, 1370b

1300: 1310, 1320, 1330, 1340, 1350, 1360, 1370
1330: 1330a, 1330b
1340: 1340a, 1340b
1370: 1370a, 1370b
1500: Vint1, SL1, SL2, EL, SL3, Vint2, 1510
SL1: 1540a, 1540b
SL2: 1520, 1530a, 1530b      1540: 1540a, 1540b
EL: 1350, 1560                1530: 1530a, 1530b
SL3: 1570a, 1570b             1570: 1570a, 1570b 1300: 1310, 1320, 1330, 1340, 1350, 1360, 1370
1330: 1330a, 1330b
1340: 1340a, 1340b
1370: 1370a, 1370b
1500: Vint1, SL1, SL2, EL, SL3, Vint2, 1510
SL1: 1540a, 1540b
SL2: 1520, 1530a, 1530b    1540: 1540a, 1540b
EL: 1350, 1560              1530: 1530a, 1530b
SL3: 1570a, 1570b          1570: 1570a, 1570b

DISPLAY DEVICE

CROSS REFERENCE TO RELATED APPLICATION(S)

This application claims priority to and benefits of Korean Patent Application No. 10-2021-0148429 under 35 U.S.C. § 119, filed on Nov. 2, 2021, in the Korean Intellectual Property Office (KIPO), the entire contents of which are incorporated herein by reference.

BACKGROUND

1. Technical Field

The disclosure relates to a display device.

2. Description of the Related Art

Display devices become more and more important as multimedia technology evolves. In accordance with it, a variety of types of display devices including a self-luminous display device such as organic light-emitting display (OLED) devices and liquid-crystal display (LCD) devices are being used.

Among such display devices, in a display device including self-luminous elements such as an organic light-emitting display device, each of the pixel of the display panel includes a light-emitting element can emit light by themselves. Accordingly, such a display device can display images without a backlight unit that supplies light to the display panel.

SUMMARY

Aspects of the disclosure provide a display device having an improved reliability by suppressing or preventing transmission of an external shock applied to the display device.

It should be noted that objects of the disclosure are not limited to the above-mentioned object; and other objects of the disclosure will be apparent to those skilled in the art from the following descriptions.

According to an embodiment of the disclosure, the reliability of a display device can be improved.

It should be noted that effects of the disclosure are not limited to those described above and other effects of the disclosure will be apparent to those skilled in the art from the following descriptions.

According to an embodiment of the disclosure, a display device comprises a protective layer comprising a first area located on a substrate, a second area located on the first area, a third area located on the second area, and a fourth area located on the third area; a first island part disposed in the first area of the protective layer, the first island part comprising a buffer layer disposed on the substrate; and a semiconductor layer disposed on the buffer layer; a second island part disposed in the second area of the protective layer, the island part comprising a first gate insulating layer disposed on the first area; and a first metal layer disposed on the first gate insulating layer; a third island part disposed in the third area of the protective layer, the third island part comprising a second gate insulating layer disposed on the second area; and a second metal layer disposed on the second gate insulating layer; and a fourth island part disposed in the fourth area of the protective layer, the fourth island part comprising an interlayer dielectric layer disposed on the third area; and a third metal layer disposed on the interlayer dielectric layer.

In an embodiment, the first island part may further comprise a bottom metal layer disposed between the substrate and the buffer layer, and a part of the first metal layer of the second island part may be electrically connected to the bottom metal layer.

In an embodiment, the protective layer may comprise an organic insulating material, and the buffer layer, the first gate insulating layer, the second gate insulating layer, and the interlayer dielectric layer may comprise an inorganic insulating material.

In an embodiment, the first area, the second area, the third area, and the fourth area of the protective layer may comprise a same material.

In an embodiment, at least two of the first area, the second area, the third area, and the fourth area of the protective layer may comprise different materials.

In an embodiment, the first island part and the second island part may be spaced apart from each other, the first area of the protective layer being disposed between the first and second island parts, the second island part and the third island part may be spaced apart from each other, the second area of the protective layer being disposed between the second and third island parts, and the third island part and the fourth island part may be spaced apart from each other, the third area of the protective layer being disposed between the third and fourth island parts.

In an embodiment, the buffer layer of the first island part may have a profile conforming to a profile of the semiconductor layer in a plan view, the first gate insulating layer of the second island part may have a profile conforming to a profile of the first metal in a plan view, the second gate insulating layer of the third island part may have a profile conforming to a profile of the second metal layer in a plan view, and the interlayer dielectric layer of the fourth island part may have a profile conforming to a profile of the third metal layer in a plan view.

In an embodiment, the buffer layer of the first island part may completely overlap the semiconductor layer in a plan view, the first gate insulating layer of the second island part may completely overlap the first metal layer in a plan view, the second gate insulating layer of the third island part may completely overlap the second metal layer in a plan view, and the interlayer dielectric layer of the fourth island part may completely overlap the third metal layer in a plan view.

In an embodiment, the protective layer may comprise an inorganic insulating material, and wherein the buffer layer, the first gate insulating layer, the second gate insulating layer and the interlayer dielectric layer may comprise an organic insulating material.

According to another embodiment of the disclosure a display device comprises a first inorganic insulating layer disposed on a substrate; a first conductive layer disposed on the first inorganic insulating layer; a first organic insulating layer disposed on the first conductive layer; a second inorganic insulating layer disposed on the first organic insulating layer; a second conductive layer disposed on the second inorganic insulating layer; and a second organic insulating layer disposed on the second conductive layer, wherein the first inorganic insulating layer has a profile conforming to a profile of the first conductive layer in a plan view, the second inorganic insulating layer has a profile conforming to a profile of the second conductive layer in a plan view, a side surface of the first inorganic insulating layer and a side surface of the first conductive layer contact the first organic insulating layer, and a side surface of the second inorganic insulating layer and a side surface of the second conductive layer contact the second organic insulating layer.

In an embodiment, the display device may further comprise a third inorganic insulating layer disposed on the second organic insulating layer; a third conductive layer disposed on the third inorganic insulating layer; a third organic insulating layer disposed on the third conductive layer; a fourth inorganic insulating layer disposed on the third organic insulating layer; a fourth conductive layer disposed on the fourth inorganic insulating layer; and a fourth organic insulating layer disposed on the fourth conductive layer, wherein the third inorganic insulating layer may have a profile conforming to a profile of the third conductive layer in a plan view, the fourth inorganic insulating layer may have a profile conforming to a profile of the fourth conductive layer in a plan view, a side surface of the third inorganic insulating layer and a side surface of the third conductive layer may contact the third organic insulating layer, and a side surface of the fourth inorganic insulating layer and a side surface of the fourth conductive layer may contact the fourth organic insulating layer.

In an embodiment, the first organic insulating layer may include a first open area exposing a part of the first conductive layer, the second organic insulating layer may include a second open area exposing a part of the second conductive layer, the third organic insulating layer may include a third open area exposing a part of the third conductive layer, and the fourth organic insulating layer may include a fourth open area exposing a part of the fourth conductive layer.

In an embodiment, a part of the first conductive layer exposed by the first open area may directly contact the second inorganic insulating layer.

In an embodiment, a part of the first conductive layer that is exposed by the first open area and does not directly contact the second inorganic insulating layer, may directly contact the second organic insulating layer.

In an embodiment, a part of the third conductive layer exposed by the third open area may directly contact the fourth inorganic insulating layer.

In an embodiment, the display device may further comprise a bottom metal layer disposed between the substrate and the first inorganic insulating layer, wherein the first inorganic insulating layer may expose a part of the bottom metal layer, and the first organic insulating layer may cover a part of the bottom metal layer exposed by the first inorganic insulating layer.

In an embodiment, the first inorganic insulating layer may completely overlap the first conductive layer in a plan view, the second inorganic insulating layer may completely overlap the second conductive layer in a plan view, the third inorganic insulating layer may completely overlap the third conductive layer in a plan view, and the fourth inorganic insulating layer may completely overlap the fourth conductive layer a plan view.

According to another embodiment of the disclosure, a display device comprises a protective layer disposed on a surface of a substrate and comprising an organic insulating material; and a buffer layer, a semiconductor layer, a first gate insulating layer, a first metal layer, a second gate insulating layer, a second metal layer, an interlayer dielectric layer and a third metal layer disposed sequentially in a first direction perpendicular to the surface of the substrate in the protective layer, wherein each of the buffer layer, the semiconductor layer, the first gate insulating layer, the first metal layer, the second gate insulating layer, the second metal layer, the interlayer dielectric layer and the third metal layer has a side surface intersecting a plane parallel to the surface of the substrate, the side surface of the buffer layer is connected to the side surface of the semiconductor layer, the side surface of the first gate insulating layer is connected to the side surface of the first metal layer, the side surface of the second gate insulating layer being connected to the side surface of the second metal layer, and the side surface of the interlayer dielectric layer is connected to the side surface of the third metal layer.

In an embodiment, each of an angle between the side surface of the semiconductor layer and a plane perpendicular to the first direction, an angle between the side surface of the first metal layer and the plane perpendicular to the first direction, an angle between the side surface of the second metal layer and the plane perpendicular to the first direction, and an angle between the side surface of the third metal layer and the plane perpendicular to the first direction may be in a range of about 49° to about 79°, and each of an angle between the side surface of the buffer layer and the plane perpendicular to the first direction, an angle between the side surface of the first gate insulating layer and the plane perpendicular to the first direction, an angle between the side surface of the second gate insulating layer and the plane perpendicular to the first direction, and an angle between the side surface of the interlayer dielectric layer and the plane perpendicular to the first direction may be in a range of about 79° to about 90°.

In an embodiment, each of an angle between the side surface of the semiconductor layer and a plane perpendicular to the first direction, an angle between the side surface of the first metal layer and the plane perpendicular to the first direction, an angle between the side surface of the second metal layer and the plane perpendicular to the first direction, and an angle between the side surface of the third metal layer and the plane perpendicular to the first direction may be in a range of about 49° to about 79°, and each of an angle between the side surface of the buffer layer and the plane perpendicular to the first direction, an angle between the side surface of the first gate insulating layer and the plane perpendicular to the first direction, an angle between the side surface of the second gate insulating layer and the plane perpendicular to the first direction, and an angle between the side surface of the interlayer dielectric layer and the plane perpendicular to the first direction may be equal to or less than about 49°.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
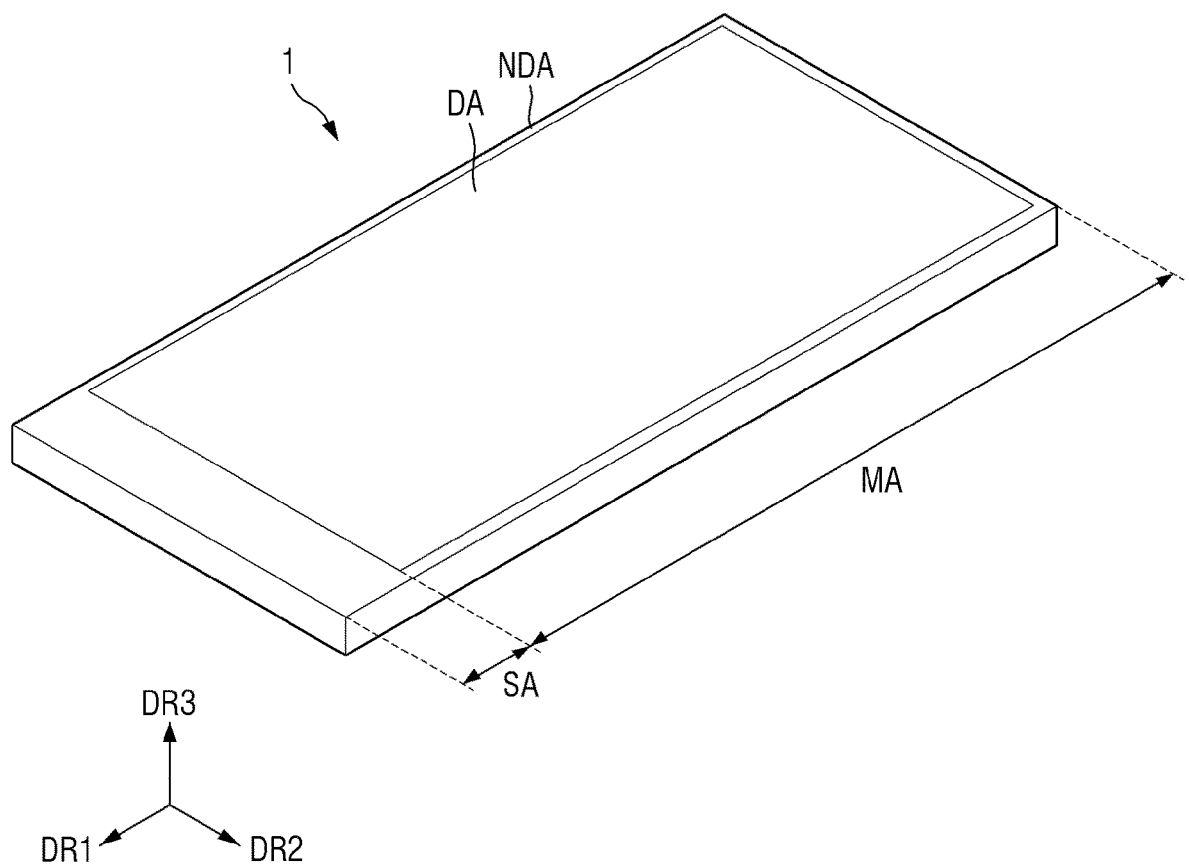
FIG. 1 is a schematic perspective view of a display device according to an embodiment of the disclosure.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be more thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification. It will be understood that the terms "contact," "connected to," and "coupled to" may include a physical and/or electrical contact, connection, or coupling.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Features of various embodiments of the disclosure may be combined partially or totally. As will be clearly appreciated by those skilled in the art, technically various interactions and operations are possible. Various embodiments can be practiced individually or in combination.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The phrase "at least one of" is intended to include the meaning of "at least one selected from the group of" for the purpose of its meaning and interpretation. For example, "at least one of A and B" may be understood to mean "A, B, or A and B."

Throughout the disclosure, like reference numerals refer to like parts throughout the various figures and embodiments of the disclosure.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described with reference to the accompanying drawings.

Figure 2:
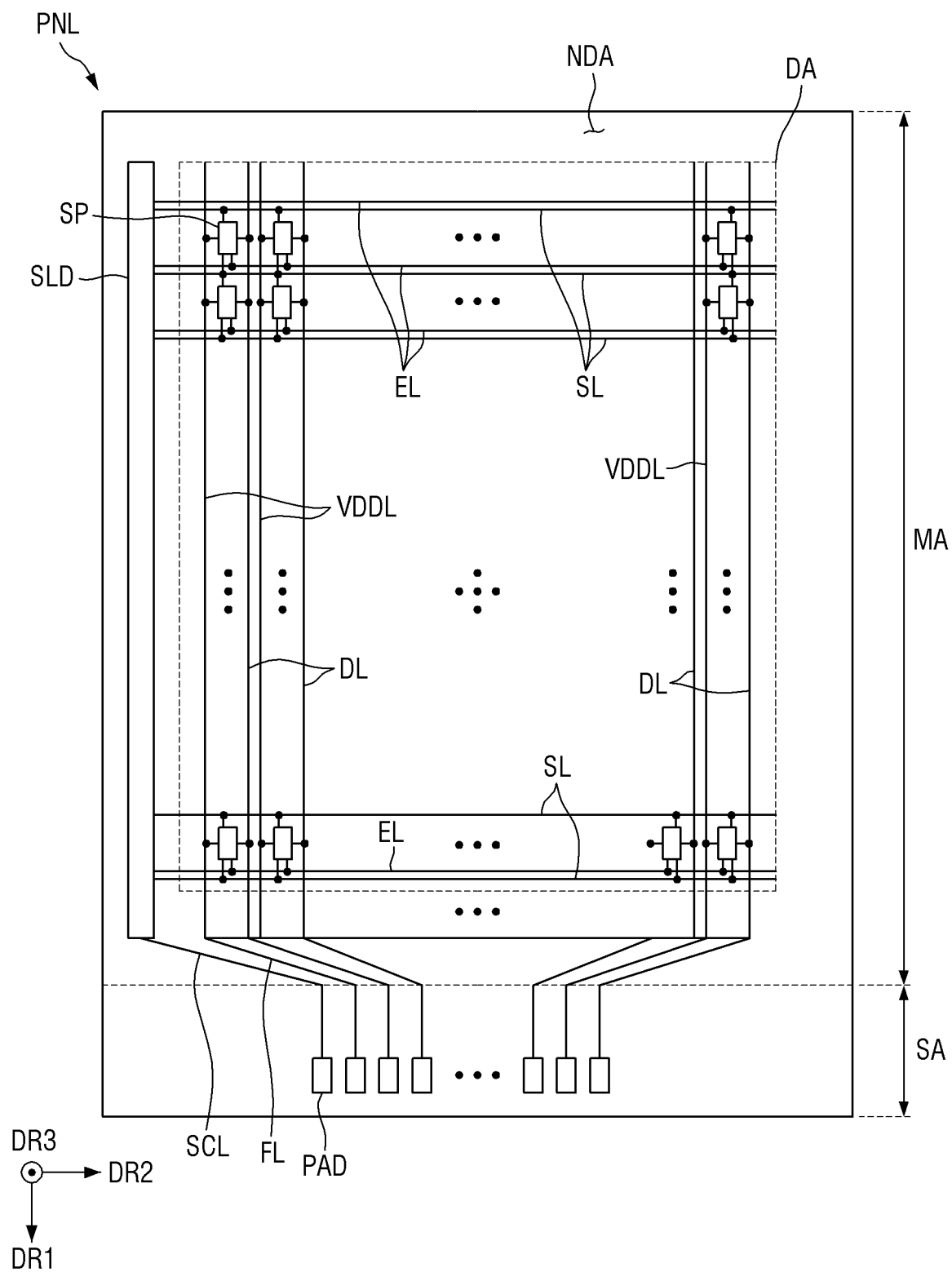
FIG. 2 is a schematic plan view showing the display panel of the display device according to the embodiment of FIG. 1.
Figure 3:
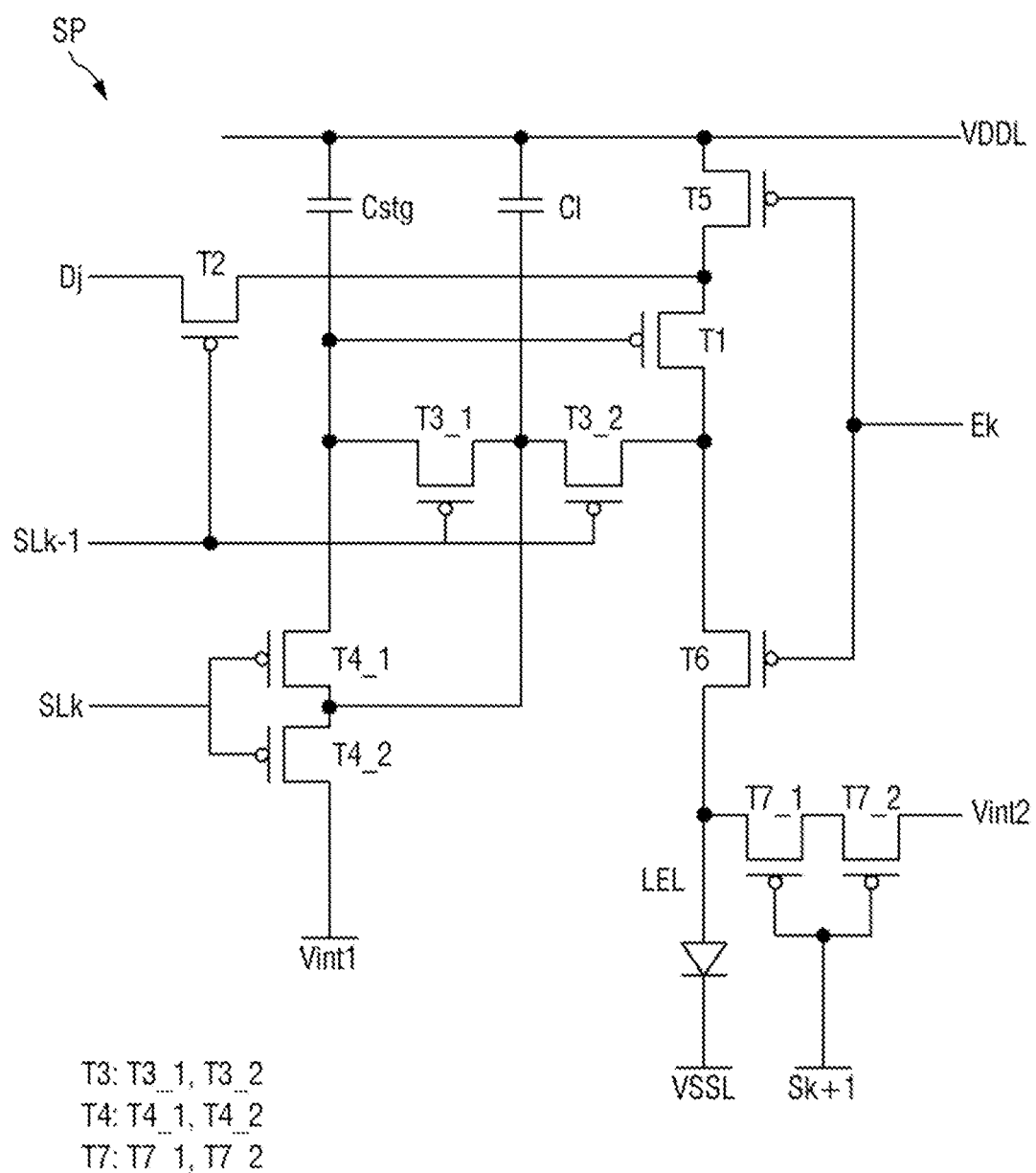
FIG. 3 is a schematic diagram of an equivalent circuit showing a circuit structure of a sub-pixel of FIG. 2.

FIG. 1 is a schematic perspective view of a display device according to an embodiment of the disclosure. FIG. 2 is a schematic plan view illustrating the display panel of the display device according to the embodiment of FIG. 1. FIG. 3 is a schematic diagram of an equivalent circuit illustrating a circuit structure of a sub-pixel of FIG. 2. Referring to FIGS. 1 and 2, a display device 1 according to the embodiment is a device that displays moving images or still images, and may refer to any electronic device that provides a display screen. The display device 1 may include portable electronic devices for providing a display screen, such as a mobile phone, a smartphone, a tablet personal computer (PC), an electronic watch, a smartwatch, a watch phone, a mobile communications terminal, an electronic notebook, an electronic book, a portable multimedia player (PMP), a navigation device, a game console, and a digital camera, as well as a television set, a laptop computer, a monitor, an electronic billboard, the Internet of Things devices, etc.

The display device 1 has a three-dimensional shape. In the drawings, the direction parallel to a first side of the display device 1 is referred to as a first direction DR1, the direction parallel to a second side of the display device 1 is referred to as a second direction DR2, and the thickness direction of the display device 1 is referred to as a third direction DR3. As used herein, a direction may refer to two directions toward a side and an opposite side unless specifically stated otherwise. If it is necessary to discern between two opposite directions, the side in one of the two directions may be referred to as "a side in the direction," while the opposite side in the two directions may be referred to as "an opposite side in the direction." In FIG. 1, the side indicated by the arrow of a direction is referred to as a side in the direction, while the opposite side is referred to as an opposite side in the direction. The first direction DR1 and the second direction DR2 may intersect each other or may be perpendicular to each other. The second direction DR2 and the third direction DR3 may intersect each other or may be perpendicular to each other. The first direction DR1 and the third direction DR3 may intersect each other or may be perpendicular to each other.

In some embodiments, the display device 1 may have a rectangular shape in which the vertical sides are longer than the horizontal sides when viewed from the top as shown in FIG. 1, but the disclosure is not limited thereto. For example, the corners where the first sides and the second sides of the display device 1 meet each other may be rounded to have a curvature, or the shape may not be limited to the rectangular shape, and the corners may be formed in any other polygonal shape, a circular shape, or an oval shape.

The display device 1 according to the embodiment may include a display panel PNL.

The display panel PNL displays images thereon. Any kind of display panel may be employed as the display panel PNL according to the embodiment, such as an organic light-emitting display panel including an organic light-emitting layer, a micro light-emitting diode (LED) display panel using micro LEDs, a quantum-dot light-emitting display panel using quantum-dot light-emitting diodes including quantum-dot light-emitting layer, and an inorganic light-emitting display panel using inorganic light-emitting elements including an inorganic semiconductor. Referring to FIG. 1, the display panel PNL may display images on a side in the third direction DR3.

In some embodiments, the display panel PNL may include a main area MA and a subsidiary area SA disposed on a side of the main area MA in the first direction DR1.

The main area MA may have a shape generally similar to the appearance of the display device 1 when viewed from the top. The main area MA may be a flat area located in a plane.

The subsidiary area SA is extended from the main area MA. The width of the subsidiary area SA in the second direction DR2 may be, but is not limited to being, equal to the width of the main area MA in the second direction DR2. For example, the width of the subsidiary area SA in the second direction DR2 may be less than the width of the main area MA in the second direction DR2. Pads PAD electrically connected to a circuit board providing a control signal to the display device 1 may be disposed in the subsidiary area SA.

The display panel PNL may include a display area DA where images are displayed, and a non-display area NDA where no image is displayed. The display area DA and the non-display area NDA of the display panel PNL may also be applied to the display device 1. The display area DA of the display panel PNL is disposed in the main area MA. Specifically, the display area DA may be located at the center portion of the main area MA except for edge portions.

The non-display area NDA may be disposed around the display area DA. That is to say, the remaining portion of the display panel PNL excluding the display area DA becomes the non-display area NDA of the display panel PNL. In an embodiment, the border of the display area DA of the main area MA and the entire subsidiary area SA may be the non-display area NDA. It is, however, to be understood that the disclosure is not limited thereto. The subsidiary area SA may also include the display area DA.

In the display area DA, sub-pixels SP, as well as first supply voltage lines VDDL, data lines DL, scan lines SL, and emission lines EL connected to the sub-pixels SP may be disposed.

The first supply voltage lines VDDL may supply the supply voltage to the sub-pixels SP. In some embodiments, the first supply voltage lines VDDL may be extended in the first direction DR1 and be spaced apart from and parallel to one another in the second direction DR2 in the display area DA. In some embodiments, the first supply voltage lines VDDL formed in parallel in the first direction DR1 in the display area DA may be connected to one another in the non-display area NDA. Although not shown in the drawings, in some embodiments, supply voltage lines extended in the second direction DR2 and connected to the first supply voltage lines VDDL may be further located in the display area DA.

The data lines DL may provide data signals to the sub-pixels SP. In some embodiments, the data lines DL may be extended in the first direction DR1, may be spaced apart from one another in the second direction DR2, and may be formed in parallel to the first supply voltage lines VDDL.

The scan lines SL may provide scan signals to the sub-pixels SP. In some embodiments, the scan lines SL may be formed in parallel to one another in the second direction DR2 to cross the first supply voltage lines VDDL and the data lines DL.

The emission lines EL may provide voltages required for emitting light to the sub-pixels SP. In some embodiments, the emission lines EL may be formed in parallel in the second direction DR2 to be parallel to the scan lines SL.

The sub-pixels SP may receive signals from the first supply voltage lines VDDL, the data lines DL, the scan lines SL, and the emission lines EL and may emit light to output images in the display area DA. Each of the sub-pixels SP may be connected to at least one of the first supply voltage lines VDDL, at least one of the scan lines SL, at least one of the data lines DL, and at least one of the emission lines EL. In the example shown in FIG. 2, each of the sub-pixels SP is connected to two scan lines SL, a data line DL, an emission line EL, and the first supply voltage line VDDL. It is, however, to be understood that the disclosure is not limited thereto. For example, each of the sub-pixels SP may be connected to three scan lines SL rather than two scan lines SL.

A scan driver SLD, fan-out lines FL and the pads PAD may be disposed in the non-display area NDA.

The scan driver SLD may apply scan signals to the scan lines SL and may apply emission signals to the emission lines EL. The scan driver SLD may be disposed at the opposite end of the non-display area NDA of the main area MA in the second direction DR2, but the disclosure is not limited thereto. For example, the scan driver SLD may be disposed at each of the ends of the non-display area NDA of the main area MA in the second direction DR2. Although not shown in the drawings, the scan driver SLD may include a scan signal output part and an emission signal output part. The scan signal output part may generate scan signals and sequentially output the scan signals to the scan lines SL. The emission signal output part may generate emission signals and sequentially output the emission signals to the emission lines EL.

The scan driver SLD may receive a scan control signal and an emission control signal through a scan control line SCL. Although the electrical connection between the scan control line SCL and the display driver circuit is not shown in the drawings, the scan control line SCL may be electrically connected to the display driver circuit to receive the scan control signal and the emission control signal.

The fan-out lines FL may electrically connect the data lines DL with the pads PAD of the subsidiary area SA. As described above, in case that the width of the subsidiary area SA in the second direction DR2 is smaller than the width of the main area MA in the second direction DR2, the fan-out lines FL may converge on the central portion of the subsidiary area SA in the second direction DR2 between the main area MA and the subsidiary area SA.

The pads PAD may be electrically connected to a circuit board to be described later to receive a control signal from the circuit board and may transmit it to the display panel PNL. The pads PAD may be disposed at an end of the subsidiary area SA in the first direction DR1 and may be arranged side by side in the second direction DR2 at an interval.

Although not shown in the drawings, the display device 1 may further include a circuit board, and the pads PAD may be electrically connected to the circuit board. The circuit board may supply a power signal and various control signals to the display panel PNL. The circuit board may be disposed at an end of the subsidiary area SA in the first direction DR1 to be electrically connected to the pads PAD.

Referring to FIG. 3, the sub-pixel SP may be connected to a k−1-th scan line SLk−1, a k-th scan line SLk, a k+1-th scan line SLk+1, and a j-th data line Dj, where k is a natural number equal to or greater than two, and j is a natural number equal to or greater than one. The scan signal of the k−1-th scan line SLk−1 may provide a data write gate signal. The scan signal of the k-th scan line SLk may provide a data initialization gate signal. The scan signal of the k+1-th scan line SLk+1 may provide a light-emitting element initialization gate signal. The sub-pixel SP may be connected to a first supply voltage line VDDL applying a first supply voltage, a first initialization voltage line Vint1 applying a first initialization voltage, a second initialization voltage line Vint2 applying a second initialization voltage, and a second supply voltage line VSSL applying a second supply voltage having a level lower than that of the first supply voltage.

The sub-pixel SP includes thin-film transistors, a light-emitting element LEL, and capacitors. The thin-film transistors include a driving transistor and switching transistors. The driving transistor may receive the first supply voltage or the second supply voltage to apply it to the light-emitting element LEL, and the switching transistors may transmit a data signal to the driving transistor. A first thin-film transistor T1 may be the driving transistor, and a second thin-film transistor T2, a third thin-film transistor T3, a fourth thin-film transistor T4, a fifth thin-film transistor T5, a sixth thin-film transistor T6 and a seventh thin-film transistor T7 may be the switching transistors.

The light-emitting element LEL may include a first electrode, a second electrode and an emissive layer, and the capacitors may include a storage capacitor Cstg and a stabilizing capacitor C1.

The first thin-film transistor T1 may include a first gate electrode, a first active area, a first electrode, a second electrode, etc. The first thin-film transistor T1 controls a drain-source current flowing between the first electrode and the second electrode in response to the data voltage applied to the first gate electrode. The driving current flowing through the channel of the first thin-film transistor T1 is proportional to the square of the difference between the threshold voltage and the voltage between the first gate electrode and the first electrode of the first thin-film transistor T1 as shown in Equation 1 below:

[Equation 1]

$$Ids = k' \times (Vgs - Vth)^2$$

where k' denotes a proportional coefficient determined by the structure and physical properties of the first thin-film transistor T1, Vgs denotes the gate-source voltage of the first thin-film transistor T1, Vth denotes the threshold voltage of the first thin-film transistor T1, and Ids denotes the driving current.

The light-emitting element LEL may emit light in response to the driving current. The amount of the light emitted from the light-emitting element LEL may be proportional to the driving current. The light-emitting element LEL may include a first electrode, a second electrode, and an emissive layer disposed between the first electrode and the second electrode. The first electrode may be an anode electrode, and the second electrode may be a cathode electrode.

The first electrode of the light-emitting element LEL may be connected to a first electrode of a 7-1-th transistor T7_1 of the seventh thin-film transistor T7 and a second electrode of the fifth thin-film transistor T5, while the second electrode of the light-emitting element LEL may be connected to the second supply voltage line VSSL.

The second thin-film transistor T2 is turned on by the scan signal of the k−1-th scan line SLk−1 to connect the first electrode of the first thin-film transistor T1 with the j-th data line Dj. The second thin-film transistor T2 may include a second gate electrode, a second active area, a first electrode, and a second electrode. The second gate electrode of the second thin-film transistor T2 may be connected to the k−1-th scan line SLk−1, the first electrode of the second thin-film transistor T2 may be connected to the first electrode of the first thin-film transistor T1, and the second electrode of the second thin-film transistor T2 may be connected to the j-th data line Dj.

The third thin-film transistor T3 may be implemented as a dual transistor including a 3-1-th thin-film transistor T3_1 and a 3-2-th thin-film transistor T3_2. The 3-1-th thin-film transistor T3-1 and the 3-2-th thin-film transistor T3-2 are turned on by the scan signal from the k−1-th scan line SLk−1 to connect the first gate electrode with the second electrode of the first thin-film transistor T1. That is to say, in case that the 3-1-th transistor T3_1 and the 3-2-th transistor T3_2 are turned on, the first gate electrode and the second electrode of the first thin-film transistor T1 are connected with each other, and thus the first thin-film transistor T1 works as a diode. The 3-1-th thin-film transistor T3_1 may include a 3-1-th gate electrode, a 3-1-th active area, a first electrode and a second electrode, and the 3-2-th thin-film transistor T3_2 may include a 3-2-th gate electrode, a 3-2-th active area, a first electrode, and a second electrode. The 3-1-th gate electrode of the 3-1-th thin-film transistor T3_1 may be connected to the k−1-th scan line SLk−1, the first electrode of the 3-1-th thin-film transistor T3_1 may be connected to the second electrode of the 3-2-th thin-film transistor T3_2, and the second electrode of the 3-1-th thin-film transistor T3_1 may be connected to the first gate electrode of the first thin-film transistor T1. The 3-2-th gate electrode of the 3-2-th thin-film transistor T3_2 may be connected to the k−1-th scan line SLk−1, the first electrode of the 3-2-th thin-film transistor T3_2 may be connected to the second electrode of the first thin-film transistor T1, and the second electrode of the 3-2-th thin-film transistor T3_2 may be connected to the first gate electrode of the 3-1-th thin-film transistor T3_1.

The fourth thin-film transistor T4 may be implemented as a dual transistor including a 4-1-th thin-film transistor T4_1 and a 4-2-th thin-film transistor T4_2. The 4-1-th thin-film transistor T4-1 and the 4-2-th thin-film transistor T4-2 are turned on by the scan signal from the k-th scan line Sk to connect the first gate electrode of the first thin-film transistor T1 with the first initialization voltage line Vint1. The first gate electrode of the first thin-film transistor T1 may be discharged to the initialization voltage of the first initialization voltage line Vint1. The 4-1-th thin-film transistor T4_1 may include a 4-1-th gate electrode, a 4-1-th active area, a first electrode and a second electrode, and the 4-2-th thin-film transistor T4_2 may include a 4-2-th gate electrode, a 4-2-th active area, a first electrode, and a second electrode. The 4-1-th gate electrode of the 4-1-th thin-film transistor T4_1 may be connected to the k-th scan line Sk, the first electrode of the 4-1-th thin-film transistor T4_1 may be connected to the first electrode of the first thin-film transistor T1, and the second electrode of the 4-1-th thin-film transistor T4_1 may be connected to the first gate electrode of the 4-2-th thin-film transistor T4_2. The 4-2-th gate electrode of the 4-2-th thin-film transistor T4_2 may be connected to the k-th scan line Sk, the first electrode of the 4-2-th thin-film transistor T4_2 may be connected to the second electrode of the 4-1-th thin-film transistor T4_1, and the second electrode of the 4-2-th thin-film transistor T4_2 may be connected to the first initialization voltage line Vint1.

The fifth thin-film transistor T5 is turned on by the emission control signal of a k-th emission line Ek to connect the first electrode of the first thin-film transistor T1 with the first supply voltage line VDDL. The fifth thin-film transistor T5 may include a fifth gate electrode, a fifth active area, a first electrode, and a second electrode. The fifth gate electrode of the fifth thin-film transistor T5 is connected to the k-th emission line Ek, the first electrode of the fifth thin-film transistor T5 is connected to the first supply voltage line VDDL, and the second electrode of the fifth thin-film transistor T5 is connected to the first electrode of the first thin-film transistor T1. In case that the fifth thin-film transistor T5 as well as the sixth thin-film transistor ST6, which will be described later, are turned on, the driving current can be supplied to the light-emitting element LEL.

The sixth thin-film transistor T6 is connected between the second electrode of the first thin-film transistor T1 and the first electrode of the light-emitting element LEL. The sixth thin-film transistor T6 is turned on by the emission control signal of the k-th emission line Ek to connect the second electrode of the first thin-film transistor T1 with the first electrode of the light-emitting element LEL. The sixth thin-film transistor T6 may include a sixth gate electrode, a sixth active area, a first electrode, and a second electrode. The sixth gate electrode of the sixth thin-film transistor T6 is connected to the k-th emission line Ek, the first electrode of the sixth thin-film transistor T6 is connected to the second electrode of the first thin-film transistor T1, and the second electrode of the sixth thin-film transistor T6 is connected to the first electrode of the light-emitting element LEL.

The seventh thin-film transistor T7 may be implemented as a dual transistor including a 7-1-th thin-film transistor T7_1 and a 7-2-th thin-film transistor T7_2. The 7-1-th thin-film transistor T7_1 and the 7-2-th thin-film transistor T7_2 are turned on by the scan signal from the k+1-th scan line SLk+1 to connect the first electrode of the light-emitting element LEL with a second initialization voltage line Vint2. The first electrode of the light-emitting element LEL may be discharged to the second initialization voltage. The 7-1-th thin-film transistor T7_1 may include a 7-1-th gate electrode, a 7-1-th active area, a first electrode and a second electrode, and the 7-2-th thin-film transistor T7_2 may include a 7-2-th gate electrode, a 7-2-th active area, a first electrode, and a second electrode. The 7-1-th gate electrode of the 7-1-th thin-film transistor T7_1 may be connected to the k+1-th scan line SLk+1, the first electrode of the 7-1-th thin-film transistor T7_1 may be connected to the first electrode of the light-emitting element LEL, and the second electrode of the 7-1-th thin-film transistor T7_1 may be connected to the first electrode of the 7-2-th thin-film transistor T7_2. The 7-2-th gate electrode of the 7-2-th thin-film transistor T7_2 may be connected to the k+1-th scan line SLk+1, the first electrode of the 7-2-th thin-film transistor T7_2 may be connected to the second electrode of the 7-1-th thin-film transistor T7_1, and the second electrode of the 7-2-th thin-film transistor T7_2 may be connected to the second initialization voltage line Vint2.

The storage capacitor Cstg is formed between the first gate electrode of the first thin-film transistor T1 and the first supply voltage line VDDL. An electrode of the storage capacitor Cstg may be connected to the first gate electrode of the first thin-film transistor T1, while another electrode thereof may be connected to the first supply voltage line VDDL.

The stabilizing capacitor C1 is formed between the second electrode of the 3-2-th thin-film transistor T3_2 and the first supply voltage line VDDL. An electrode of the stabilizing capacitor C1 may be connected to the second electrode of the 3-2-th thin-film transistor T3_2, while another electrode thereof may be connected to the first supply voltage line VDDL.

In case that the first electrode of each of the first thin-film transistor T1, the second thin-film transistor T2, the third thin-film transistor T3, the fourth thin-film transistor T4, the fifth thin-film transistor T5, the sixth thin-film transistor T6, and the seventh thin-film transistor T7 is a source electrode, the second electrode thereof may be a drain electrode. As another example, in case that the first electrode of each of the first thin-film transistor T1, the second thin-film transistor T2, the third thin-film transistor T3, the fourth thin-film transistor T4, the fifth thin-film transistor T5, the sixth thin-film transistor T6, and the seventh thin-film transistor T7 is a drain electrode, the second electrode thereof may be a source electrode.

Each of the first thin-film transistor T1, the second thin-film transistor T2, the third thin-film transistor T3, the fourth thin-film transistor T4, the fifth thin-film transistor T5, the sixth thin-film transistor T6, and the seventh thin-film transistor T7 may include the active area as described above. Each of the first thin-film transistor T1, the second thin-film transistor T2, the third thin-film transistor T3, the fourth thin-film transistor T4, the fifth thin-film transistor T5, the sixth thin-film transistor T6, and the seventh thin-film transistor T7 may include, but are not limited to, the active area made of polycrystalline silicon.

In case that the active area of each of the first thin-film transistor T1, the second thin-film transistor T2, the third thin-film transistor T3, the fourth thin-film transistor T4, the fifth thin-film transistor T5, the sixth thin-film transistor T6, and the seventh thin-film transistor T7 is made of polycrystalline silicon, the process of forming it may be a low-temperature polycrystalline silicon process. In addition, the first thin-film transistor T1, the second thin-film transistor T2, the third thin-film transistor T3, the fourth thin-film transistor T4, the fifth thin-film transistor T5, the sixth thin-film transistor T6, and the seventh thin-film transistor T7 are formed as (or formed of) p-type thin-film transistors in the example shown in FIG. 3, the disclosure is not limited thereto. Some or all of them may be formed as n-type thin-film transistors.

Hereinafter, a planar arrangement and a cross-sectional structure of the above-described sub-pixel SP will be described in detail.

Figure 4:
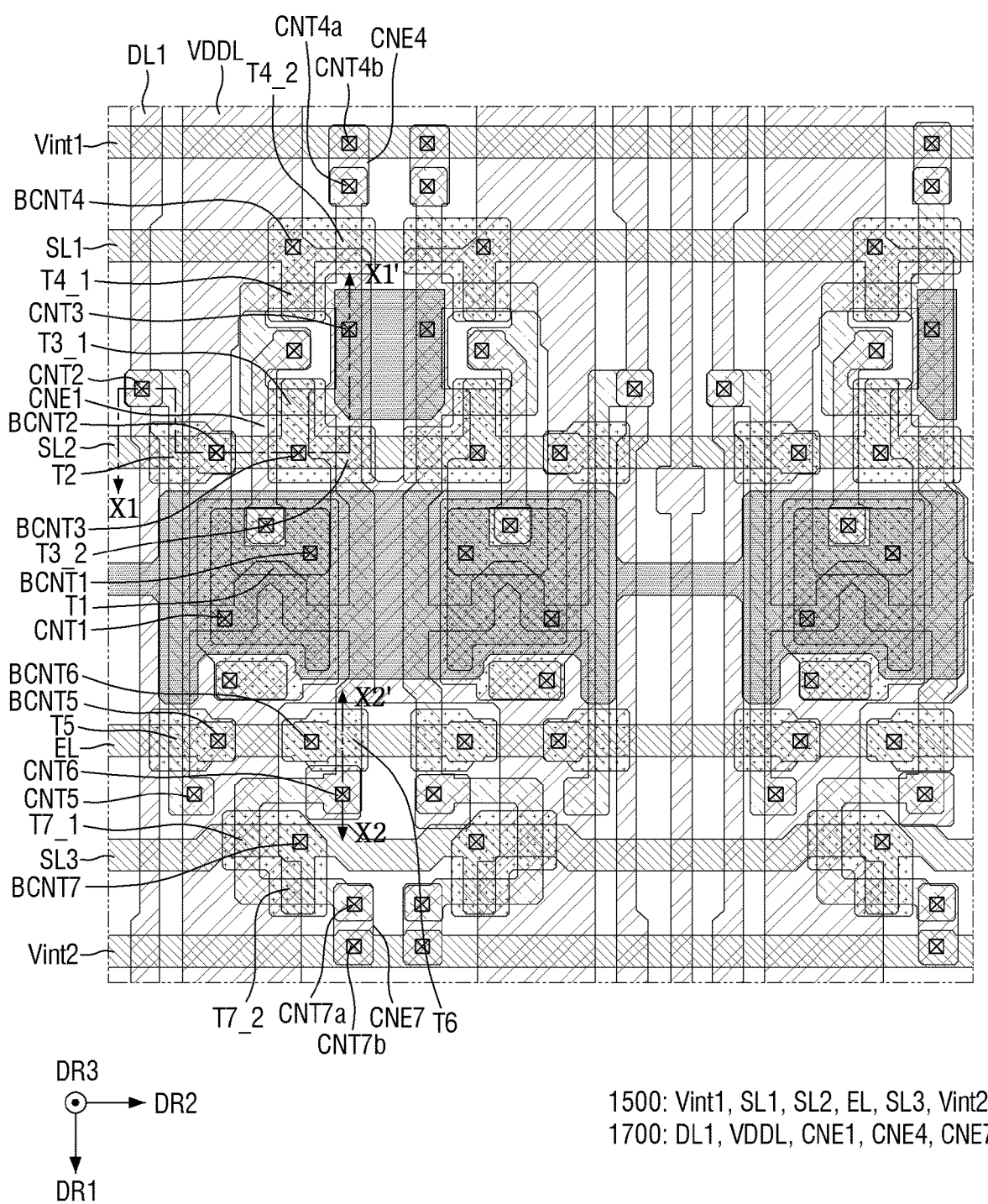
FIG. 4 is a schematic view showing the layout of the sub-pixel of FIG. 2.
Figure 5:
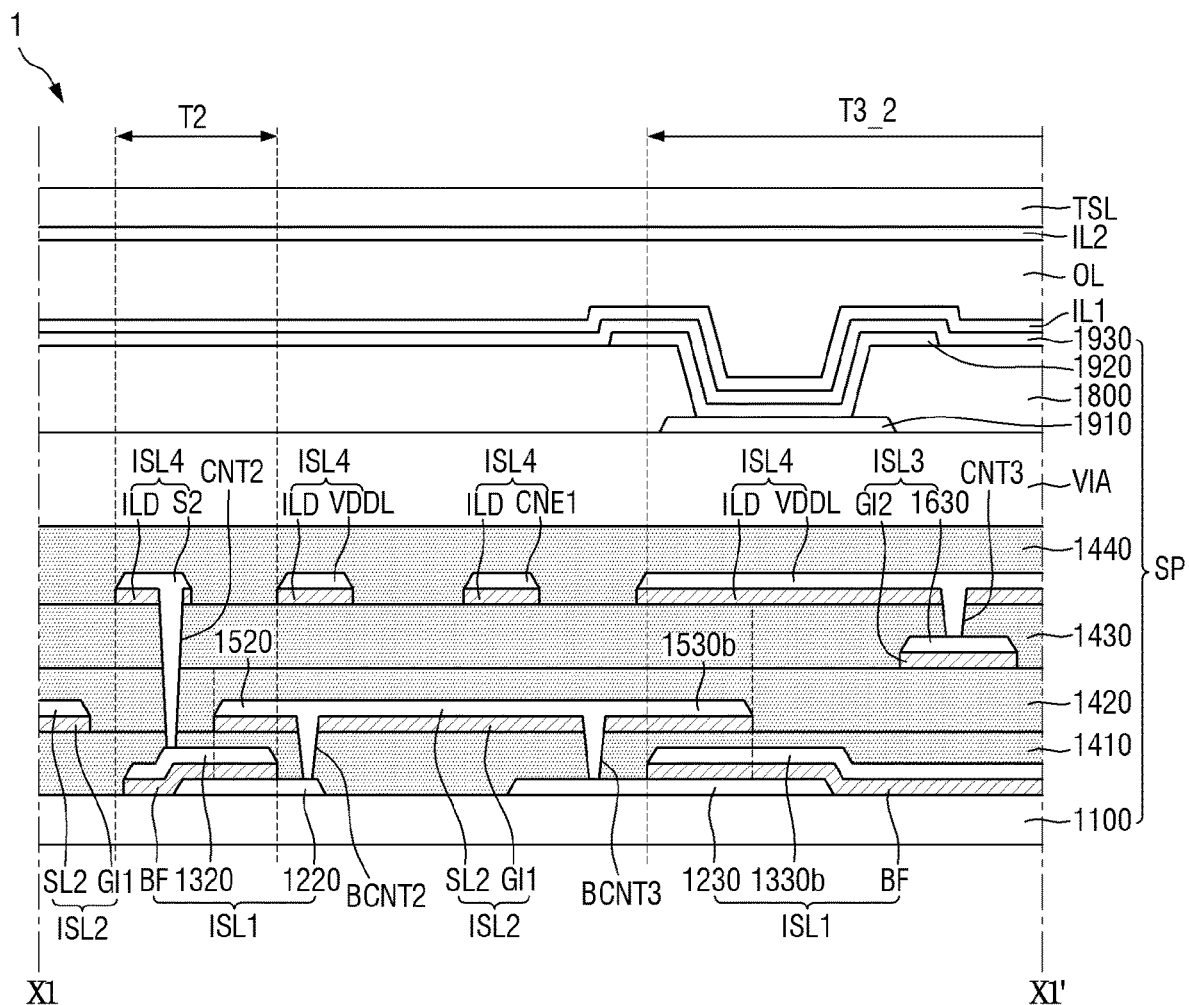
FIG. 5 is a schematic cross-sectional view taken along line X1-X1' of FIG. 4.
Figure 6:
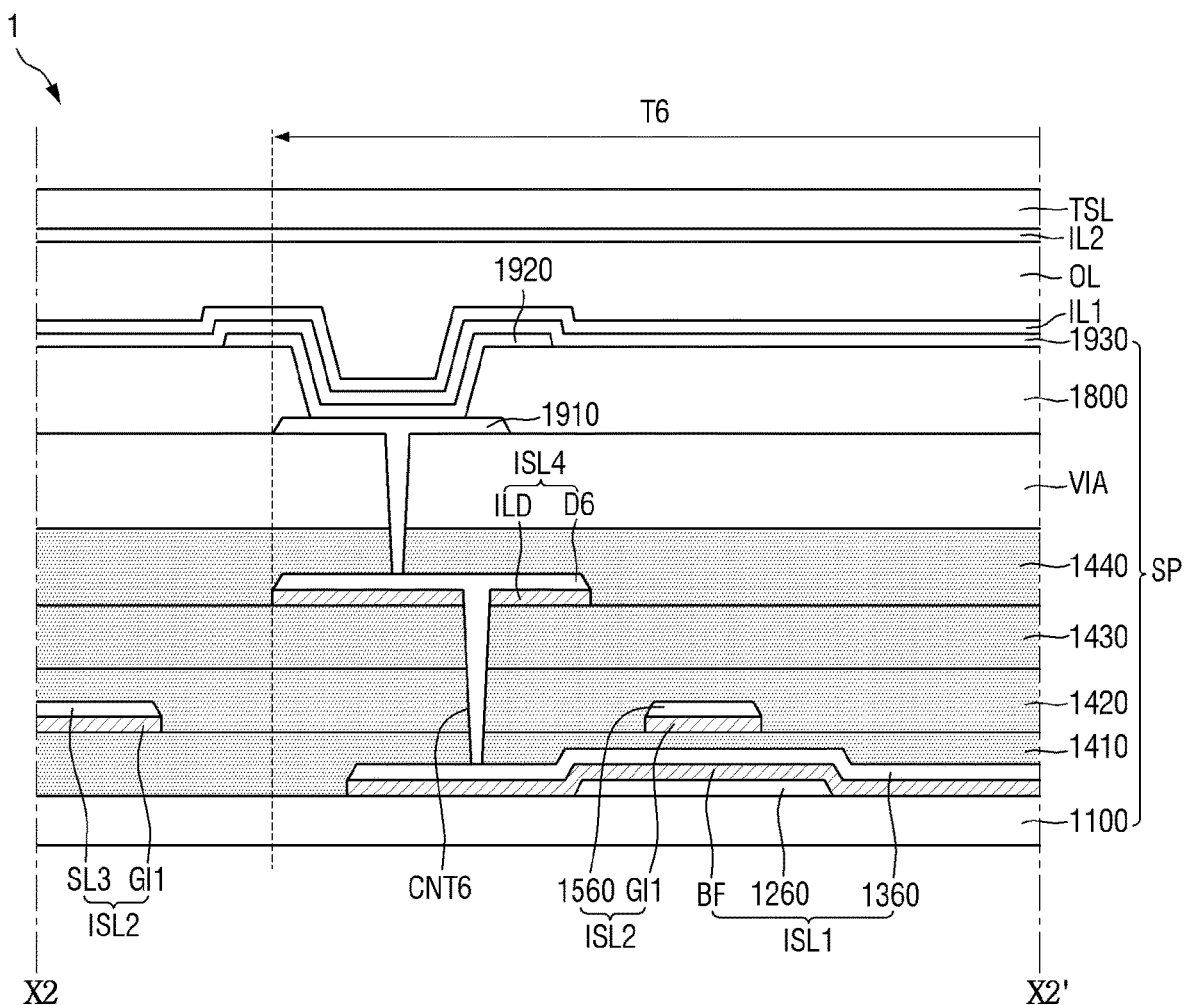
FIG. 6 is a schematic cross-sectional view taken along line X2-X2' of FIG. 4.

FIG. 4 is a schematic view illustrating the layout of the sub-pixel of FIG. 2. FIG. 5 is a schematic cross-sectional view taken along line X1-X1' of FIG. 4. FIG. 6 is a schematic cross-sectional view taken along line X2-X2' of FIG. 4.

Referring to FIGS. 4 to 6, as described above, each sub-pixel SP includes transistors T1, T2, T3, T4, T5, T6 and T7, capacitors Cstg and Cl (see FIG. 3), and a light-emitting element LEL.

The layers of the sub-pixel SP may be disposed in the order of a substrate 1100, a bottom metal layer 1200, a buffer layer BF, a semiconductor layer 1300, a first protective layer 1410, a first gate insulating layer GI1, a first metal layer 1500, a second protective layer 1420, a second gate insulating layer GI2, a second metal layer 1600, a third protective layer 1430, an interlayer dielectric layer ILD, a third metal layer 1700, a fourth protective layer 1440, a via insulating layer VIA, a first electrode 1910 of the light-emitting element LEL, a pixel-defining film 1800, an emissive layer 1920 of the light-emitting element LEL, and a second electrode 1930 of the light-emitting element LEL. Each of the layers described above may be made up of a single film, or a stack of multiple films. Other layers may be further disposed between the layers. Each of the layers may include an upper surface and a lower surface parallel to a plane perpendicular to the third direction DR3, and side surfaces connecting the upper surface with the lower surface and crossing the plane perpendicular to the third direction DR3. As used herein, the third direction DR3 may be perpendicular to the upper surface of the substrate 1100, and the plane perpendicular to the third direction DR3 may be parallel to the upper surface of the substrate 1100.

Figure 7:
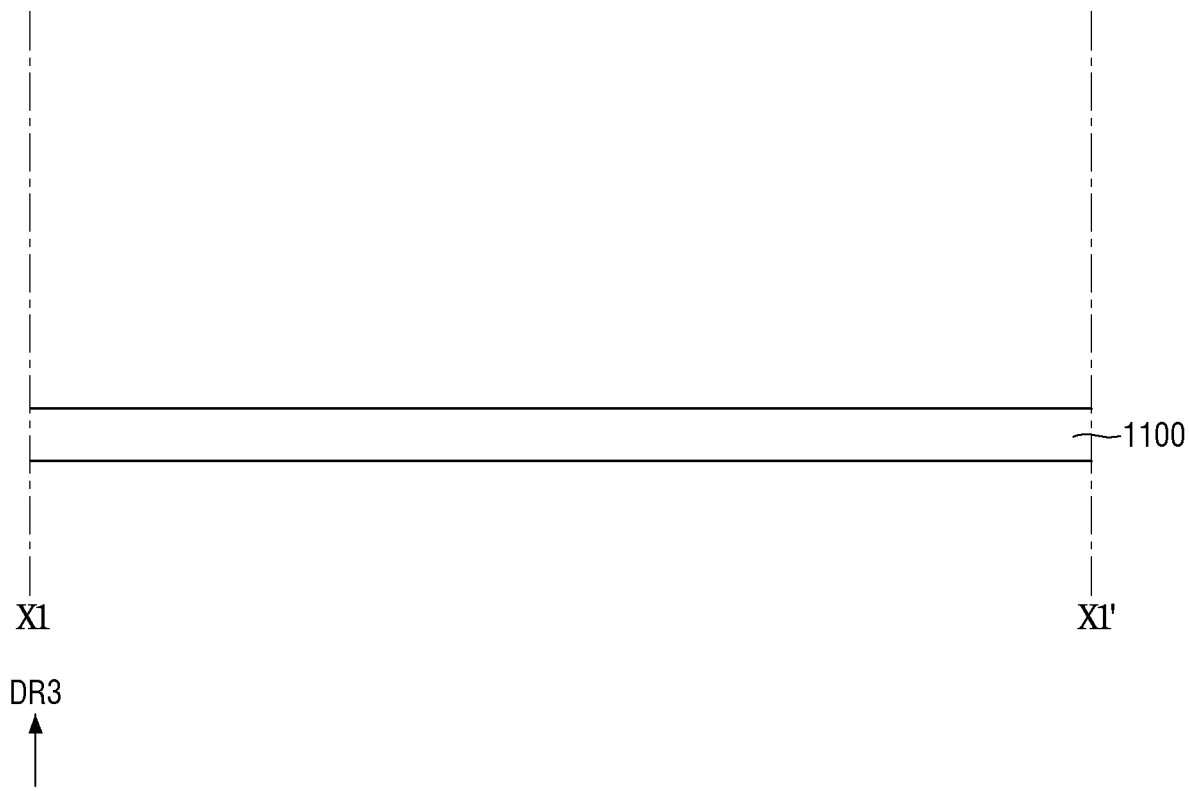
FIGS. 7 to 27 are schematic cross-sectional views and layout views for illustrating processing steps of a method of fabricating the display device according to the embodiment of FIG. 1.

The sub-pixel SP may include a substrate 1100, a protective layer 1400 disposed on the substrate 1100, island parts disposed in the protective layer 1400, a via insulating layer VIA on the protective layer 1400, a light-emitting element LEL on the via insulating layer VIA, and a pixel-defining film 1800. In an embodiment, first to seventh contact holes CNT1, CNT2, CNT3, CNT4a, CNT4b, CNT5, CNT6, CNT7a, and CNT7b may be disposed as shown in FIG. 7.

The protective layer 1400 can protect the layers on the substrate 1100 from external shocks. The protective layer 1400 may include a first protective layer 1410, a second protective layer 1420, a third protective layer 1430, and a fourth protective layer 1440. The first protective layer 1410 of the protective layer 1400 may be a first area of the protective layer 1400, the second protective layer 1420 may be a second area of the protective layer 1400, the third protective layer 1430 may be a third area of the protective layer 1400, and the fourth protective layer 1440 may be a fourth area of the protective layer 1400. In some embodiments, the protective layer 1400 may be made of, but is not limited to, an organic insulating material such as polyimide, polyamide, acrylic resin, benzocyclobutene, hexamethyldisiloxane (HMDSO), and phenol resin.

The layers of the sub-pixel SP may include a conductive layer, an inorganic insulating layer, and an organic insulating layer. The conductive layer may contain a conductive material and may include at least one of the semiconductor layer 1300, the first metal layer 1500, the second metal layer 1600, and the third metal layer 1700. The inorganic insulating layer may contain an inorganic insulating material and may include at least one of the buffer layer BF, the first gate insulating layer GI1, the second gate insulating layer GI2, the interlayer dielectric film ILD, and the via insulating layers VIA. The organic insulating layer may contain an organic insulating material and may include at least one of the protective layer 1400, for example, the first protective layer 1410, the second protective layer 1420, the third protective layer 1430, and the fourth protective layer 1440.

In some embodiments, the conductive layer may include, but is not limited to, a first conductive layer, a second conductive layer, a third conductive layer, and a fourth conductive layer. For example, the first conductive layer may refer to the semiconductor layer 1300, the second conductive layer may refer to the first metal layer 1500, the third conductive layer may refer to the second metal layer 1600, and the third conductive layer may refer to the third metal layer 1700. It should be understood, however, that the disclosure is not limited thereto.

In some embodiments, the inorganic insulating layer may include, but is not limited to, a first inorganic insulating layer, a second inorganic insulating layer, a third inorganic insulating layer, and a fourth inorganic insulating layer. For example, the first inorganic insulating layer may refer to the buffer layer BF, the second inorganic insulating layer may refer to the first gate insulating layer GI1, the third inorganic insulating layer may refer to the second gate insulating layer GI2, and the fourth inorganic insulating layer may refer to the interlayer dielectric film ILD. It should be understood, however, that the disclosure is not limited thereto.

In some embodiments, the organic insulating layer may include, but is not limited to, a first organic insulating layer, a second organic insulating layer, a third organic insulating layer, and a fourth organic insulating layer. For example, the first organic insulating layer may refer to the first protective layer 1410, the second organic insulating layer may refer to the second protective layer 1420, the third organic insulating layer may refer to the third protective layer 1430, and the fourth organic insulating layer may refer to the fourth protective layer 1440. It should be understood, however, that the disclosure is not limited thereto.

The island parts may encompass adjacent layers on the substrate 1100. Specifically, the island parts are disposed between the two adjacent organic insulating layers and encompass the conductive layer and the inorganic insulating layer adjacent to each other. As will be described later, the profile of the conductive layer and the profile of the inorganic insulating layer when viewed from the top may conform to each other. For example, the island parts may include a first island part ISL1 including the bottom metal layer 1200, the buffer layer BF, and the semiconductor layer 1300, a second island part ISL2 including the first gate insulating layer GI1 and the first metal layer 1500, a third island part ISL3 including the second gate insulating layer GI2 and the second metal layer 1600, and a fourth island part ISL4 including the interlayer dielectric film ILD and the third metal layer 1700.

The first island part ISL1 may be disposed in the first protective layer 1410 of the protective layer 1400, the second island part ISL2 may be disposed in the second protective layer 1420, the third island part ISL3 may be disposed in the third protective layer 1430, and the fourth island part ISL4 may be disposed in the fourth protective layer 1440.

The first island part ISL1, the second island part ISL2, the third island part ISL3, and the fourth island part ISL4 may be spaced apart from each other in the third direction DR3 with the protective layer 1400 interposed therebetween. Specifically, the first island part ISL1 may be disposed in the first protective layer 1410 and may be spaced apart from the second island part ISL2 in the third direction DR3 with the first protective layer 1410 interposed therebetween. The second island part ISL2 may be disposed in the second protective layer 1420 and may be spaced apart from the third island part ISL3 in the third direction DR3 with the second protective layer 1420 therebetween. The third island part ISL3 may be disposed in the third protective layer 1430 and may be spaced apart from the fourth island part ISL4 in the third direction DR3 with the third protective layer 1430 therebetween.

The side profile of the island parts may be partially bent toward the inner side of the island parts. This will be described in more detail later.

Hereinafter, the layers of the substrate 1100 will be described.

The substrate 1100 can support the layers disposed thereon. In case that the substrate 1100 is a flexible substrate having flexibility, the substrate 1100 may include, but is not limited to, polyimide. In case that the substrate 1100 is a rigid substrate having rigidity, the substrate 1100 may include, but is not limited to, glass.

A surface of the substrate 1100 in the third direction DR3 may be the upper surface directly contacting the bottom metal layer 1200 to be described later. An opposite surface thereof in the third direction DR3 may be the lower surface where the layers are not disposed.

The bottom metal layer 1200 together with the first metal layer 1500 can adjust the channel region of the active area of the semiconductor layer 1300 or prevent light from passing through the active area, and can prevent damage to the device due to electrostatic discharge. The bottom metal layer 1200 may include a first bottom metal layer 1210, a second bottom metal layer 1220, a third bottom metal layer 1230, a fourth bottom metal layer 1240, a fifth bottom metal layer 1250, a sixth bottom metal layer 1260, and a seventh bottom metal layer 1270 (see FIG. 11). The bottom metal layer 1200 may be disposed to overlap each active area of the semiconductor layer 1300, and may be electrically connected to the first metal layer 1500 through a bottom contact hole. For example, as shown in FIG. 5, the second bottom metal layer 1220 of the bottom metal layer 1200 may overlap a second active area 1320 in the third direction DR3, and may be electrically connected to the first metal layer 1500 through a second bottom contact hole BCNT2. The third bottom metal layer 1230 of the bottom metal layer 1200 may overlap a 3-2-th active area 1330b in the third direction DR3, and may be electrically connected to the first metal layer 1500 through a third bottom contact hole BCNT3. The arrangement of the bottom metal layer 1200 will be described in detail later.

A surface of the bottom metal layer 1200 in the third direction DR3 may be the upper surface directly contacting the buffer layer BF to be described later, and an opposite surface thereof in the third direction DR3 may be the lower surface directly contacting the upper surface of the substrate 1100. The side surfaces of the bottom metal layer 1200 may connect the upper surface with the lower surface of the bottom metal layer 1200. The surface of the bottom metal layer 1200 may directly contact the first protective layer 1410 to be described later, and the opposite surface thereof may directly contact the buffer layer BF to be described later.

The bottom metal layer 1200 may include a metal. For example, in some embodiments, the bottom metal layer 1200 may include, but is not limited to, at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). In some embodiments, the bottom metal layer 1200 may include, but is not limited to, a pigment that can block light, such as carbon black. The bottom metal layer 1200 may be eliminated in some implementations.

Figure 12:
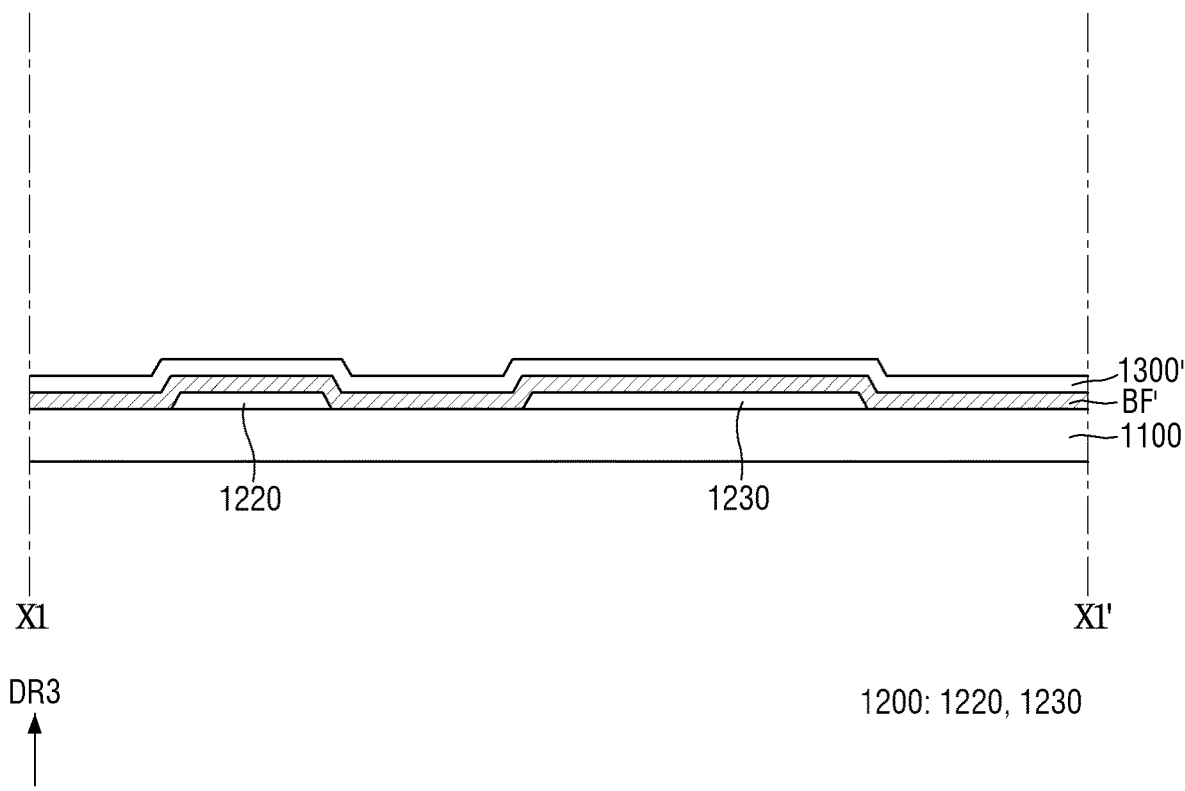
Figure 13:
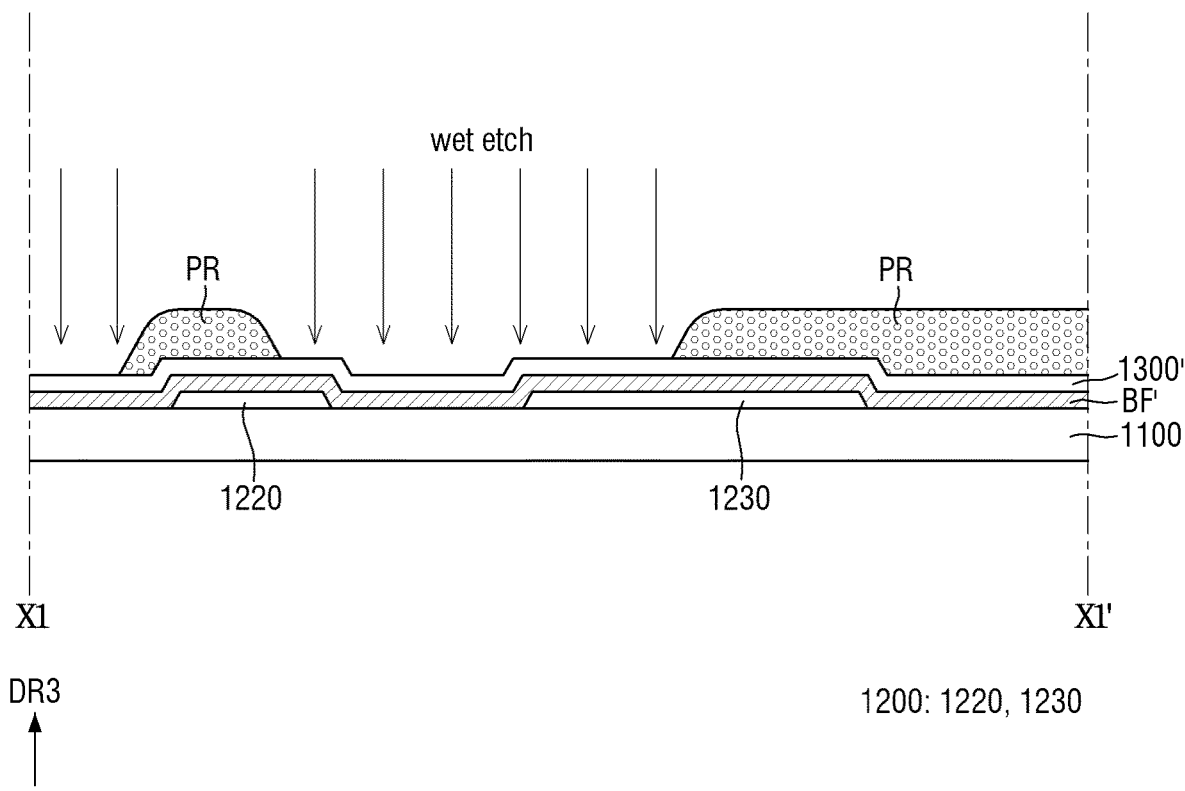
Figure 14:
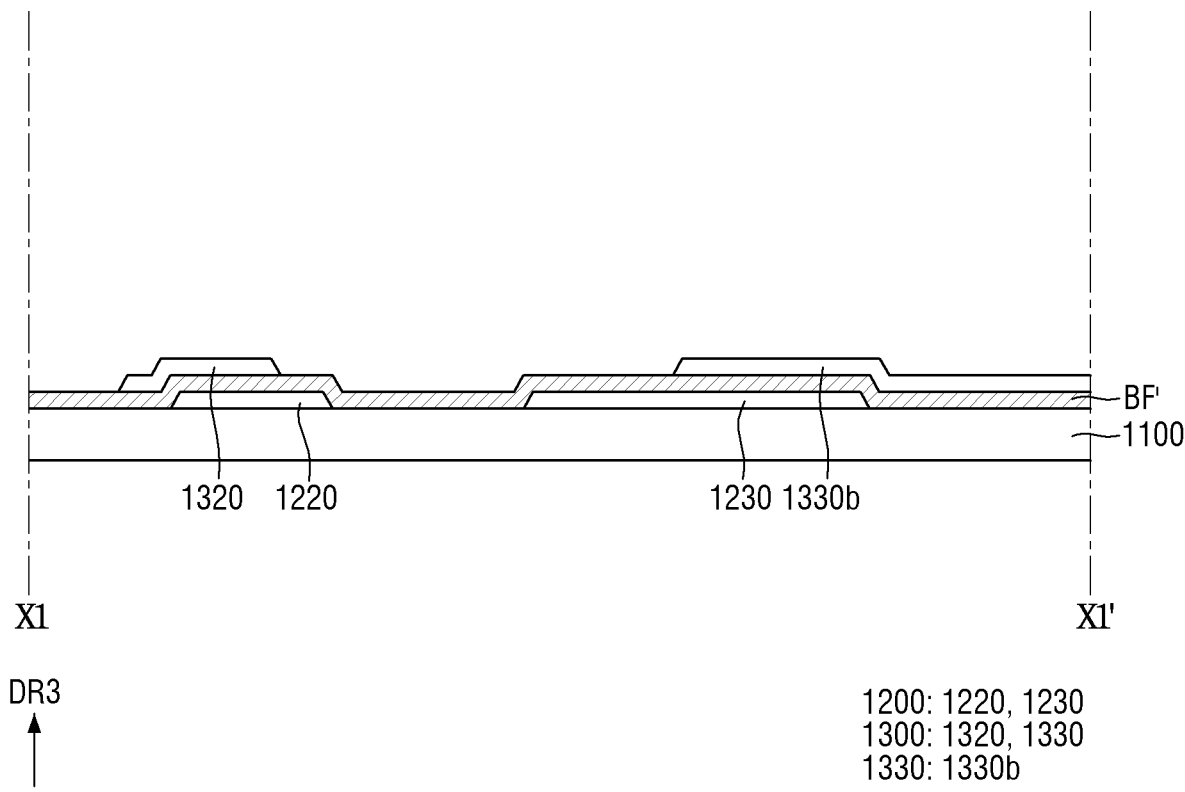

The buffer layer BF can prevent diffusion of metal atoms or impurities from the substrate 1100 into the semiconductor layer 1300. The buffer layer BF may be disposed over the bottom metal layer 1200 disposed on the substrate 1100 to cover a part of the substrate 1100 and the bottom metal layer 1200. In other words, the buffer layer BF may expose a part of the substrate 1100 and the bottom metal layer 1200 in the third direction DR3. For example, as shown in FIG. 5, the buffer layer BF may expose a part of the upper surface of the second bottom metal layer 1220, a part of the upper surface of the third bottom metal layer 1230, and a part of the upper surface of the substrate 1100 in the third direction DR3. The buffer layer BF may be a result of dry etching a buffer material layer BF' (see FIG. 12) by using the semiconductor layer 1300 as an etch stop layer during a process of fabricating the display device 1 to be described later.

A surface of the buffer layer BF in the third direction DR3 may be the upper surface directly contacting the semiconductor layer 1300 to be described later, and an opposite surface thereof in the third direction DR3 may be the lower surface directly contacting the upper surface of the bottom metal layer 1200. The side surfaces of the buffer layer BF may connect the upper surface with the lower surface of the buffer layer BF. More specifically, the upper surface of the buffer layer BF may directly contact the semiconductor layer 1300 but may not contact the first protective layer 1410 to be described later. In other words, the buffer layer BF may completely overlap the semiconductor layer 1300 in the third direction DR3. In addition, a part of the lower surface of the buffer layer BF may directly contact the upper surface of the bottom metal layer 1200, and another part thereof may directly contact the upper surface of the substrate 1100. The side surface of the buffer layer BF may directly contact the first protective layer 1410.

In some embodiments, the buffer layer BF may be made of, but is not limited to, an inorganic insulating material such as silicon oxide and silicon nitride.

The semiconductor layer 1300 may be disposed on the buffer layer BF to receive signals from the scan lines SL and the data lines DL described above, and may transmit the signals to the first electrodes and the second electrodes of the first thin-film transistor T1, the second thin-film transistor T2, the third thin-film transistor T3, the fourth thin-film transistor T4, the fifth thin-film transistor T5, the sixth thin-film transistor T6, and the seventh thin-film transistor T7. In the following description, the first electrode of each of the first thin-film transistor T1, the second thin-film transistor T2, the third thin-film transistor T3, the fourth thin-film transistor T4, the fifth thin-film transistor T5, the sixth thin-film transistor T6, and the seventh thin-film transistor T7 may be the source electrode, while the second electrode thereof may be the drain electrode.

The semiconductor layer 1300 may include the active areas of the first thin-film transistor T1, the second thin-film transistor T2, the third thin-film transistor T3, the fourth thin-film transistor T4, the fifth thin-film transistor T5, the sixth thin-film transistor T6, and the seventh thin-film transistor T7, as described above. For example, the second thin-film transistor T2 includes the second active area 1320 and the 3-2-th thin-film transistor T3_2 includes the 3-2-th active area 1330b as shown in FIG. 5, and the sixth thin-film transistor T6 includes a sixth active area 1360 as shown in FIG. 6.

Each of the active areas may include a channel region overlapping the first metal layer 1500 in the third direction DR3, a drain region located on a side of the channel region, and a source region located on an opposite side of the channel region. Although the drain region and the source region are not depicted in the drawings, for example, the second active area 1320 may include a second channel region overlapping a second gate region 1520 to be described later, a second drain region located on a side of the second channel region, and a second source region located on an opposite side of the second channel region. The 3-2-th active area 1330b may include a 3-2-th channel region overlapping a 3-2-th gate region 1530b to be described later, a 3-2-th drain region located on a side of the 3-2-th channel region, and a 3-2-th source region located on an opposite side of the 3-2-th channel region. The sixth active area 1360 may include a sixth channel region overlapping a sixth gate region 1560 to be described later, a sixth drain region located on a side of the sixth channel region, and a sixth source region located on an opposite side of the sixth channel region.

A surface of the semiconductor layer 1300 in the third direction DR3 may be the upper surface directly contacting the first protective layer 1410 to be described later, and an opposite surface thereof in the third direction DR3 may be the lower surface directly contacting the upper surface of the buffer layer BF. In other words, the lower surface of the semiconductor layer 1300 and the upper surface of the buffer layer BF may completely overlap each other in the third direction DR3. The side surfaces of the semiconductor layer 1300 may connect the upper surface of the semiconductor layer 1300 with the lower surface of the semiconductor layer 1300. The side surfaces of the semiconductor layer 1300 may be connected to the side surfaces of the buffer layer BF. The side surfaces of the semiconductor layer 1300 and the side surfaces of the buffer layer BF will be described in detail.

In some embodiments, the semiconductor layer 1300 may include, but is not limited to, polycrystalline silicon. For example, the semiconductor layer 1300 may include amorphous silicon or an oxide semiconductor.

The first island part ISL1 may include the bottom metal layer 1200, the buffer layer BF, and the semiconductor layer 1300. For example, as shown in FIG. 5, the first island part ISL1 may include the buffer layer BF, the second active area 1320, and the second bottom metal, or the buffer layer BF, the 3-2-th active area 1330b, and the third bottom metal, and may include the buffer layer BF, the sixth active area 1360, and a sixth bottom metal as shown in FIG. 6. In some embodiments, the first island part ISL1 may include, but is not limited to, the bottom metal layer 1200, the buffer layer BF, and the semiconductor layer 1300. For example, in case that the bottom metal layer 1200 is eliminated in some embodiments, the first island part ISL1 may include the buffer layer BF and the semiconductor layer 1300.

The first protective layer 1410 can protect the bottom metal layer 1200 and the semiconductor layer 1300 from external shocks applied to the display device 1, and can reduce strain applied to the buffer layer BF. In other words, the first protective layer 1410 may protect the first island part from external shocks. The first protective layer 1410 may be the first area of the protective layer 1400. The first protective layer 1410 may be disposed over the bottom metal layer 1200, the buffer layer BF, the substrate 1100 disposed on the substrate 1100 to cover the upper surface of the substrate 1100 exposed by the bottom metal layer 1200 and the buffer layer BF, the upper surface of the bottom metal layer 1200 exposed by the buffer layer BF, and the upper surface of the semiconductor layer 1300. In addition, the first protective layer 1410 may directly contact the side surface of the semiconductor layer 1300, the side surface of the buffer layer BF, and a side surface of the bottom metal layer 1200. In other words, the first protective layer 1410 may cover the side surface of the semiconductor layer 1300, the side surface of the buffer layer BF, and the side surface of the bottom metal layer 1200.

A surface of the first protective layer 1410 in the third direction DR3 may be the upper surface on which the first gate insulating layer GI1 to be described later is disposed. An opposite surface of the first protective layer 1410 in the third direction DR3 may be the lower surface directly contacting the upper surface of the substrate 1100 exposed by the bottom metal layer 1200 and the buffer layer BF, the upper surface of the bottom metal layer 1200 exposed by the buffer layer BF, and the upper surface of the semiconductor region.

In some embodiments, the first protective layer 1410 may be made of, but is not limited to, an organic insulating material such as polyimide, polyamide, acrylic resin, benzocyclobutene, hexamethyldisiloxane, and phenol resin.

The first gate insulating layer GI1 may insulate the semiconductor layer 1300 from the first metal layer 1500 to be described later. The first gate insulating layer GI1 may be disposed on the first protective layer 1410 to cover a part of the upper surface of the first protective layer 1410. In other words, the first gate insulating layer GI1 may expose a part of the upper surface of the first protective layer 1410 in the third direction DR3. The first gate insulating layer GI1 may be a result of dry etching a first gate insulating material layer GI1' (see FIG. 20) using the first metal layer 1500 as an etch stop layer during the process of fabricating the display device 1 to be described later.

A surface of the first gate insulating layer GI1 in the third direction DR3 may be the upper surface directly contacting the first metal layer 1500 to be described later, and an opposite surface thereof in the third direction DR3 may be the lower surface directly contacting with the upper surface of the first protective layer 1410. The side surface of the first gate insulating layer GI1 may connect the upper surface with the lower surface of the first gate insulating layer GI1. More specifically, the upper surface of the first gate insulating layer GI1 may directly contact the first metal layer 1500 but may not directly contact the second protective layer 1420 to be described later. In other words, the first gate insulating layer GI1 and the first metal layer 1500 may completely overlap each other in the third direction DR3. The side surface of the first gate insulating layer GI1 may directly contact the second protective layer 1420.

In some embodiments, the first gate insulating layer GI1 may be made of, but is not limited to, an inorganic insulating material such as silicon oxide and silicon nitride.

The first metal layer 1500 may be disposed on the first gate insulating layer GI1. The first metal layer 1500 may be disposed directly on the upper surface of the first gate insulating layer GI1. That is to say, the first metal layer 1500 may directly contact the upper surface of the first gate insulating layer GI1.

The first metal layer 1500 may include a first initialization voltage line Vint1 for supplying a first initialization voltage, a first scan line SL1 for supplying a data write gate signal, a second scan line SL2 for supplying a data initialization gate signal, a third scan line SL3 for supplying an initialization gate signal to the light-emitting element LEL, an emission line EL for supplying an emission control signal, and a second initialization voltage line Vint2 for supplying the second initialization voltage. The first initialization voltage line Vint1, the first scan line SL1, the second scan line SL2, the third scan line SL3, the emission line EL, and the second initialization voltage line Vint2 may be extended in the second direction DR2 and may be spaced apart from each other in the first direction DR1, as shown in FIG. 4. In addition, the first metal layer 1500 may include a first gate region 1510, a second gate region 1520, a third gate region 1530, a fourth gate region 1540, a fifth gate region 1550, a sixth gate region 1560, and a seventh gate region 1570 (see FIG. 23). The first gate region 1510, the second gate region 1520, the third gate region 1530, the fourth gate region 1540, the fifth gate region 1550, the sixth gate region 1560, and the seventh gate region 1570 of the first metal layer 1500 may be the gate electrodes of the first thin-film transistor T1, the second thin-film transistor T2, the third thin-film transistor T3, the fourth thin-film transistor T4, the fifth thin-film transistor T5, the sixth thin-film transistor T6, and the seventh thin-film transistor T7, respectively. In the gate regions of the first metal layer 1500, the respective active areas of the semiconductor layer 1300 may overlap the first metal layer 1500 in the third direction DR3. For example, as shown in FIG. 5, the second gate region 1520 of the first metal layer 1500 overlapping the second active area 1320 of the semiconductor layer 1300 in the third direction DR3 may be the second gate electrode of the second thin-film transistor T2, and the 3-2-th gate region 1530b overlapping the 3-2-th active area 1330b of the semiconductor layer 1300 in the third direction DR3 may be the 3-2-th gate electrode of the 3-2-th thin-film transistor T3_2. As shown in FIG. 6, the sixth gate region 1560 of the first metal layer 1500 overlapping the sixth active area 1360 of the semiconductor layer 1300 in the third direction DR3 may be the sixth gate electrode of the sixth thin-film transistor T6. The arrangement of the first metal layer 1500 will be described in detail later.

The first metal layer 1500 may be electrically connected to the bottom metal layer 1200 through a bottom contact hole penetrating the first protective layer 1410. For example, as shown in FIG. 5, the second bottom metal layer 1220 may be electrically connected to the second scan line SL2 through the second bottom contact hole BCNT2, and the third bottom metal layer 1230 may be electrically connected to the second scan line SL2 through the third bottom contact hole BCNT3.

A surface of the first metal layer 1500 in the third direction DR3 may be the upper surface directly contacting the second protective layer 1420 to be described later, and an opposite surface thereof in the third direction DR3 may be the lower surface directly contacting the upper surface of the first gate insulating layer GI1. In other words, the lower surface of the first metal layer 1500 and the upper surface of the first gate insulating layer GI1 may completely overlap each other in the third direction DR3. The side surfaces of the first metal layer 1500 may connect the upper surface of the first metal layer 1500 with the lower surface of the first metal layer 1500. The side surface of the first metal layer 1500 and the side surface of the first gate insulating layer GI1 may be connected to each other. The relationship between the side surfaces of the first metal layer 1500 and the side surfaces of the first gate insulating layer GI1 may be substantially identical to the relationship between the side surfaces of the semiconductor layer 1300 and the side surfaces of the buffer layer BF.

The first metal layer 1500 may include a metal. For example, in some embodiments, the first metal layer 1500 may include, but is not limited to, at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The second island part ISL2 may include the first gate insulating layer GI1 and the first metal layer 1500. For example, the second island part may include the second scan line SL2 and the first gate insulating layer GI1 as shown in FIG. 5, and may include the third scan line SL3 and the first gate insulating layer GI1 as shown in FIG. 6. The second island part ISL2 may be spaced apart from the first island part ISL1 in the third direction DR3 with the first protective layer 1410 interposed therebetween.

The second protective layer 1420 can protect the first metal layer 1500 from external shocks applied to the display device 1, and can reduce strain applied to the first gate insulating layer GI1. In other words, the second protective layer 1420 may protect the second island part from external shocks. The second protective layer 1420 may be the second area of the protective layer 1400. The second protective layer 1420 may be disposed over the first gate insulating layer GI1 and the first metal layer 1500 disposed on the first protective layer 1410, and may cover the upper surface of the first protective layer 1410 and the upper surface of the first metal layer 1500 exposed by the first gate insulating layer GI1. In addition, the second protective layer 1420 may directly contact the side surfaces of the first metal layer 1500 and the side surfaces of the first gate insulating layer GI1. In other words, the second protective layer 1420 may cover the side surfaces of the first metal layer 1500 and the side surfaces of the first gate insulating layer GI1.

A surface of the second protective layer 1420 in the third direction DR3 may be the upper surface on which the second gate insulating layer GI2 to be described later is disposed. An opposite surface of the second protective layer 1420 in the third direction DR3 may be the lower surface directly contacting the upper surface of the first protective layer 1410 exposed by the first gate insulating layer GI1 and the upper surface of the first metal layer 1500.

In some embodiments, the second protective layer 1420 may be made of, but is not limited to, an organic insulating material such as polyimide, polyamide, acrylic resin, benzocyclobutene, hexamethyldisiloxane, and phenol resin.

The second gate insulating layer GI2 may insulate the first metal layer 1500 from the second metal layer 1600 to be described later. The second gate insulating layer GI2 may be disposed on the second protective layer 1420 to cover a part of the upper surface of the second protective layer 1420. In other words, the second gate insulating layer GI2 may expose a part of the upper surface of the second protective layer 1420 in the third direction DR3. The second gate insulating layer GI2 may be a result of dry etching the second gate insulating material layer by using the second metal layer 1600 as an etch stop layer during the process of fabricating the display device 1 to be described later.

A surface of the second gate insulating layer GI2 in the third direction DR3 may be the upper surface directly contacting the second metal layer 1600 to be described later, and an opposite surface thereof in the third direction DR3 may be the lower surface directly contacting the upper surface of the second protective layer 1420. The side surfaces of the second gate insulating layer GI2 may connect the upper surface with the lower surface of the second gate insulating layer GI2. More specifically, the upper surface of the second gate insulating layer GI2 may directly contact the second metal layer 1600 but may not directly contact the third protective layer 1430 to be described later. In other words, the second gate insulating layer GI2 and the second metal layer 1600 may completely overlap each other in the third direction DR3. The side surfaces of the second gate insulating layer GI2 may directly contact the third protective layer 1430.

In some embodiments, the second gate insulating layer GI2 may be made of, but is not limited to, an inorganic insulating material such as silicon oxide and silicon nitride.

The second metal layer 1600 may be disposed on the second gate insulating layer GI2. The second metal layer 1600 may be disposed directly on the upper surface of the second gate insulating layer GI2. That is to say, the second metal layer 1600 may directly contact the upper surface of the second gate insulating layer GI2.

The second metal layer 1600 may include a capacitor electrode. For example, the second metal layer 1600 may include a third capacitor electrode 1630 of the third thin-film transistor T3. The third capacitor electrode 1630 may be electrically connected to the first supply voltage line VDDL through a third contact hole CNT3 to receive a voltage equal to the voltage applied to the first supply voltage line VDDL. The third capacitor electrode 1630 may form the stabilizing capacitor C1 together with the 3-2-th active area 1330b by using the first protective layer 1410, the second protective layer 1420, and the second gate insulating layer GI2 between the third capacitor electrode 1630 and the 3-2-th active area 1330b, as a dielectric.

A surface of the second metal layer 1600 in the third direction DR3 may be the upper surface directly contacting the third protective layer 1430 to be described later, and an opposite surface thereof in the third direction DR3 may be the lower surface directly contacting the upper surface of the second gate insulating layer GI2. In other words, the lower surface of the second metal layer 1600 and the upper surface of the second gate insulating layer GI2 may completely overlap each other in the third direction DR3. The side surfaces of the second metal layer 1600 may connect the upper surface of the second metal layer 1600 with the lower surface of the second metal layer 1600. The side surfaces of the second metal layer 1600 and the side surfaces of the second gate insulating layer GI2 may be connected to each other. The relationship between the side surfaces of the second metal layer and the side surfaces of the second gate insulating layer GI2 may be substantially identical to the relationship between the side surfaces of the semiconductor layer 1300 and the side surfaces of the buffer layer BF.

The second metal layer 1600 may include a metal. For example, in some embodiments, the second metal layer 1600 may include, but is not limited to, at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The third island part ISL3 may include the second gate insulating layer GI2 and the second metal layer 1600. For example, the third island part may include the third capacitor electrode 1630 and the second gate insulating layer GI2 as shown in FIG. 5. The third island part ISL3 may be spaced apart from the second island part ISL2 in the third direction DR3 with the second protective layer 1420 interposed therebetween.

The third protective layer 1430 can protect the second metal layer 1600 from external shocks applied to the display device 1, and can reduce strain applied to the second gate insulating layer GI2. In other words, the third protective layer 1430 may protect the third island part from external shocks. The third protective layer 1430 may be the third area of the protective layer 1400. The third protective layer 1430 may be disposed over the second gate insulating layer GI2 and the second metal layer 1600 disposed on the second protective layer 1420, and may cover the upper surface of the second protective layer 1420 and the upper surface of the second metal layer 1600 exposed by the second gate insulating layer GI2. In addition, the third protective layer 1430 may directly contact the side surfaces of the second metal layer 1600 and the side surfaces of the second gate insulating layer GI2. In other words, the third protective layer 1430 may cover the side surfaces of the second metal layer 1600 and the side surfaces of the second gate insulating layer GI2.

A surface of the third protective layer 1430 in the third direction DR3 may be the upper surface on which the interlayer dielectric layer ILD to be described later is disposed. An opposite surface of the third protective layer 1430 in the third direction DR3 may be the lower surface directly contacting the upper surface of the second protective layer 1420 exposed by the second gate insulating layer GI2 and the upper surface of the second metal layer 1600.

In some embodiments, the third protective layer 1430 may be made of, but is not limited to, an organic insulating material such as polyimide, polyamide, acrylic resin, benzocyclobutene, hexamethyldisiloxane, and phenol resin.

The interlayer dielectric layer ILD may insulate the second metal layer 1600 from the third metal layer 1700 to be described later. The interlayer dielectric layer ILD may be disposed on the third protective layer 1430 to cover a part of the upper surface of the third protective layer 1430. In other words, the interlayer dielectric layer ILD may expose a part of the upper surface of the third protective layer 1430 in the third direction DR3. The interlayer dielectric layer ILD may be a result of dry etching the interlayer dielectric layer by using the third metal layer 1700 as an etch stop layer during the process of fabricating the display device 1 to be described later.

A surface of the interlayer dielectric layer ILD in the third direction DR3 may be the upper surface directly contacting the third metal layer 1700 to be described later, and an opposite surface thereof in the third direction DR3 may be the lower surface directly contacting the upper surface of the third protective layer 1430. The side surfaces of the interlayer dielectric layer ILD may connect the upper surface with the lower surface of the interlayer dielectric layer ILD. More specifically, the upper surface of the interlayer dielectric layer ILD may directly contact the third metal layer 1700 but may not directly contact the fourth protective layer 1440 to be described later. In other words, the interlayer dielectric layer ILD and the third metal layer 1700 may completely overlap each other in the third direction DR3. The side surface of the interlayer dielectric layer ILD may directly contact the fourth protective layer 1440.

In some embodiments, the interlayer dielectric layer ILD may be made of, but is not limited to, an inorganic insulating material such as silicon oxide and silicon nitride.

The third metal layer 1700 may be disposed on the interlayer dielectric layer ILD. The third metal layer 1700 may be disposed directly on the upper surface of the interlayer dielectric layer ILD. That is to say, the third metal layer 1700 may directly contact the upper surface of the interlayer dielectric layer ILD.

The third metal layer 1700 may include the first supply voltage line VDDL applying the first supply voltage, a first data line DLI applying a data signal, a fourth connection electrode CNE4 connecting the second electrode of the 4-2-th thin-film transistor T4_2 with the first initialization voltage line Vint1, a seventh connection electrode CNE7 connecting the second electrode of the 7-2-th thin-film transistor T7_2 with the second initialization voltage line Vint2, and source/drain electrodes of the thin-film transistor. The first supply voltage line VDDL and the first data line DLI may be extended in the first direction DR1 and may be spaced apart from each other in the second direction DR2.

The third metal layer 1700 may be electrically connected to the second metal layer 1600 or the semiconductor layer 1300 through a contact hole penetrating through the third protective layer 1430. For example, as shown in FIG. 5, a second source electrode S2 of the third metal layer 1700 may be electrically connected to the second active area 1320 through a second contact hole CNT2 penetrating the third protective layer 1430, the second protective layer 1420, and the first protective layer 1410. The first supply voltage line VDDL may be electrically connected to the third capacitor electrode 1630 through a third contact hole CNT3 penetrating the third protective layer 1430. As shown in FIG. 6, a sixth drain electrode D6 of the third metal layer 1700 may be electrically connected to a sixth active area 1360 through a sixth contact hole penetrating the third protective layer 1430, the second protective layer 1420, and the first protective layer 1410.

A surface of the third metal layer 1700 in the third direction DR3 may be the upper surface directly contacting the fourth protective layer 1440 to be described later, and an opposite surface thereof in the third direction DR3 may be the lower surface directly contacting the upper surface of the interlayer dielectric layer ILD. In other words, the lower surface of the third metal layer 1700 and the upper surface of the interlayer dielectric layer ILD may completely overlap each other in the third direction DR3. The side surfaces of the third metal layer 1700 may connect the upper surface of the third metal layer 1700 with the lower surface of the first metal layer 1500. The side surfaces of the third metal layer 1700 and the side surfaces of the interlayer dielectric layer may be connected to each other. The relationship between the side surfaces of the third metal layer 1700 and the side surfaces of the interlayer dielectric layer ILD may be substantially identical to the relationship between the side surfaces of the semiconductor layer 1300 and the side surfaces of the buffer layer BF.

The third metal layer 1700 may include a metal. For example, the third metal layer 1700 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). In some embodiments, the third metal layer 1700 may have a multilayer structure. For example, the third metal layer 1700 may have a two-layer structure of Ti/Al or a three-layer structure of Ti/Al/Ti.

The fourth island part ISL4 may include the interlayer dielectric layer ILD and the third metal layer 1700. For example, the fourth island part may include the second source electrode S2 and the interlayer dielectric layer ILD, the first supply voltage line VDDL and the interlayer dielectric layer ILD, or the first connection electrode CNE1 and the interlayer dielectric layer ILD as shown in FIG. 5, and may include the sixth drain electrode D6 and the interlayer dielectric layer ILD as shown in FIG. 6. The fourth island part ISL4 may be spaced apart from the third island part ISL3 in the third direction DR3 with the third protective layer 1430 interposed therebetween.

The fourth protective layer 1440 can protect the third metal layer 1700 from external shocks applied to the display device 1, and can reduce strain applied to the interlayer dielectric layer ILD. In other words, the fourth protective layer 1440 may protect the fourth island part from external shocks. The fourth protective layer 1440 may be the fourth area of the protective layer 1400. The fourth protective layer 1440 may be disposed over the interlayer dielectric layer ILD and the third metal layer 1700 disposed on the third protective layer 1430, and may cover the upper surface of the third protective layer 1430 and the upper surface of the third metal layer 1700 exposed by the interlayer dielectric layer ILD. In addition, the fourth protective layer 1440 may directly contact the side surfaces of the third metal layer 1700 and the side surfaces of the interlayer dielectric layer ILD. In other words, the fourth protective layer 1440 may cover the side surfaces of the third metal layer 1700 and the side surfaces of the interlayer dielectric layer ILD.

A surface of the fourth protective layer 1440 in the third direction DR3 may be the upper surface on which the via insulating layer VIA to be described later is disposed. An opposite surface of the fourth protective layer 1440 in the third direction DR3 may be the lower surface directly contacting the upper surface of the third protective layer 1430 and the upper surface of the third metal layer 1700 exposed by the interlayer dielectric layer ILD.

In some embodiments, the fourth protective layer 1440 may be made of, but is not limited to, an organic insulating material such as polyimide, polyamide, acrylic resin, benzocyclobutene, hexamethyldisiloxane, and phenol resin.

In some embodiments, the first protective layer 1410, the second protective layer 1420, the third protective layer 1430, and the fourth protective layer 1440 of the protective layer 1400 may be made of, but is not limited to, a same material. For example, the first protective layer 1410, the second protective layer 1420, the third protective layer 1430, and the fourth protective layer 1440 may be made of different materials. In case that the first protective layer 1410, the second protective layer 1420, the third protective layer 1430, and the fourth protective layer 1440 are made of a same material, the boundaries between the layers may not be perceived. In other words, in case that the layers of the protective layer 1400 are made of the same material, the boundaries between the layers are not perceived, and the layers may be formed integrally. On the other hand, in case that the first protective layer 1410, the second protective layer 1420, the third protective layer 1430, and the fourth protective layer 1440 of the protective layer 1400 are made of different materials, boundaries between the layers may be distinguished.

The via insulating layer VIA may be disposed on the fourth protective layer 1440 along the profile of the fourth protective layer 1440. A surface of the via insulating layer VIA in the third direction DR3 may be the upper surface on which the first electrode 1910 of the light-emitting element LEL is disposed, and an opposite surface thereof in the third direction DR3 may be the lower surface contacting the upper surface of the fourth protective layer 1440. In some embodiments, the via insulating layer VIA may be made up of, but is not limited to, a single layer. For example, in case that the number of metal layers increases, the via insulating layer VIA may be made up of multiple layers.

In some embodiments, the via insulating layer VIA may be made of, but is not limited to, an organic insulating material such as polyimide, polyamide, acrylic resin, benzocyclobutene, hexamethyldisiloxane, and phenol resin.

As described above, the light-emitting element LEL may include the first electrode 1910, the emissive layer 1920, and the second electrode 1930, and may be disposed on the via insulating layer VIA.

The first electrode 1910 of the light-emitting element LEL may be an anode electrode, and as shown in FIG. 6, may be electrically connected to the sixth drain electrode D6 through a contact hole penetrating through the via insulating layer VIA. A surface of the first electrode 1910 in the third direction DR3 may be the upper surface on which the emissive layer is disposed, and an opposite surface thereof in the third direction DR3 may be the lower surface on which the via insulating layer VIA is disposed.

The pixel-defining film 1800 may be disposed over the first electrode 1910 disposed on the via insulating layer VIA. The pixel-defining film 1800 may form an opening partially exposing the first electrode 1910. In some embodiments, the pixel-defining film 1800 may be made of, but is not limited to, an organic insulating material such as polyimide, polyamide, acrylic resin, benzocyclobutene, hexamethyldisiloxane, and phenol resin.

The emissive layer 1920 may be disposed on the first electrode 1910 and the pixel-defining film 1800. In case that the emissive layer 1920 is an organic emissive layer including an organic material, the light-emitting element LEL may be an organic light-emitting diode. In case that the emissive layer 1920 includes a quantum-dot emissive layer, the light-emitting element LEL may be a quantum-dot light-emitting element. In case that the emissive layer 1920 includes an inorganic semiconductor, the light-emitting element LEL may be an inorganic light-emitting element. As another example, the light-emitting element EL may be a micro light-emitting diode.

The second electrode 1930 may be disposed on the emissive layer 1920. The second electrode 1930 may be a cathode electrode.

A thin-film encapsulation layer TFE can prevent external moisture and oxygen from permeating into the light-emitting element LEL. The thin-film encapsulation layer TFE may be disposed on the second electrode of the light-emitting element LEL.

The thin-film encapsulation layer TFE may include at least one organic layer and at least one inorganic layer. At least one organic layer and at least one inorganic layer may be stacked on one another alternately. In some embodiments, as shown in FIGS. 5 and 6, the thin-film encapsulation layer TFE may include a first inorganic layer IL1, an organic layer OL, and a second inorganic layer IL2, and the organic layer OL may be disposed between the first inorganic layer IL1 and the second inorganic layer IL2. It should be understood, however, that the disclosure is not limited thereto.

A touch layer TSL may sense a touch input applied to the display device 1. The touch layer TSL may be disposed on the thin-film encapsulation layer TFE. The touch layer TSL may include a touch protection layer 1400, one or more metal layers, and one or more insulating layers. The metal layers and insulating layers may be stacked on one another alternately. The touch protection layer 1400 may be an organic film. The touch layer TSL may be eliminated in some implementations.

With the above configuration, in the display device 1 according to the embodiment, the insulating layers BF, GI1, GI2, and ILD including the inorganic insulating material and the protective layer 1400 including the organic insulating material are mixed around the device layers 1300, 1500, 1600, and 1700 so that a multi-layered structure including the inorganic insulating material and the organic insulating material is formed. Accordingly, it is possible to improve the reliability of the device by increasing the shock resistance resulting from external shocks.

Hereinafter, a method of fabricating a display device 1 according to an embodiment of the disclosure will be described in detail.

FIGS. 7 to 27 are schematic cross-sectional views and schematic layout views for illustrating processing steps of a method of fabricating the display device according to the embodiment of FIG. 1.

Figure 8:
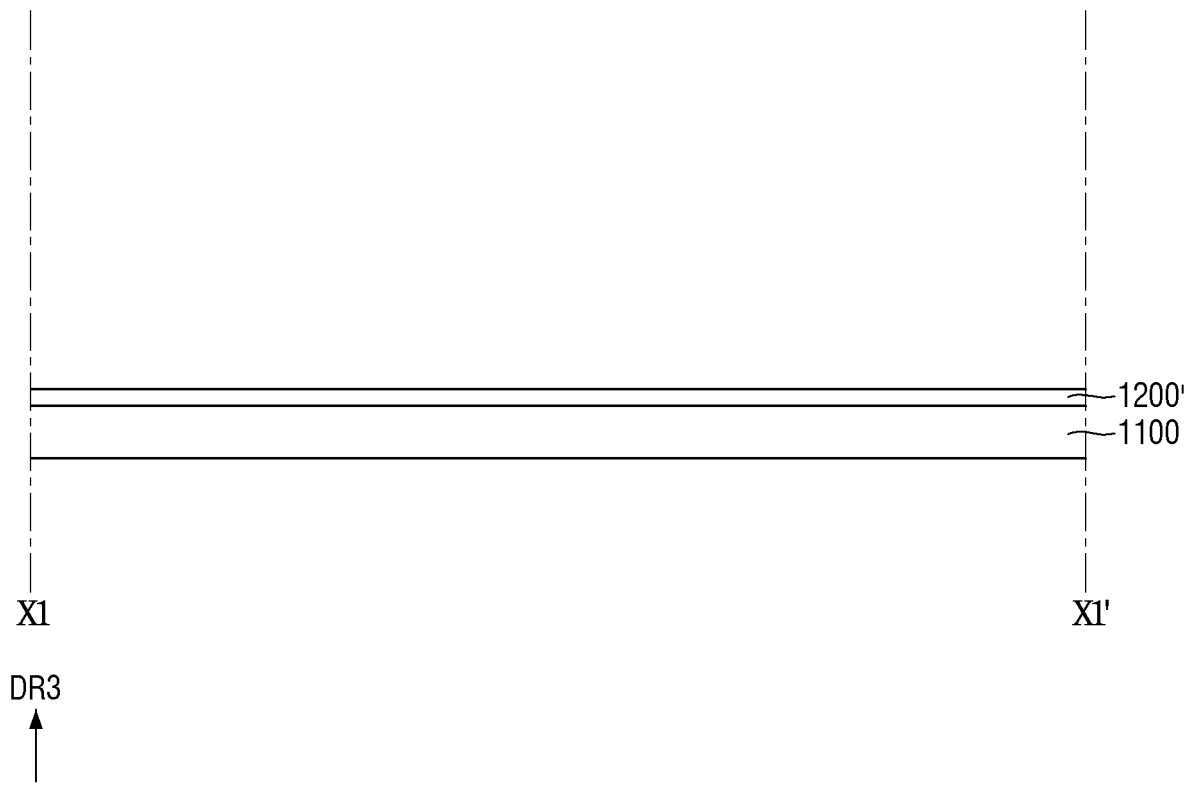

Referring initially to FIGS. 7 and 8, a substrate 1100 is prepared, and a bottom metal material layer 1200' is formed on the substrate 1100. The bottom metal material layer 1200' and a bottom metal layer 1200 may include substantially a same material.

Figure 9:
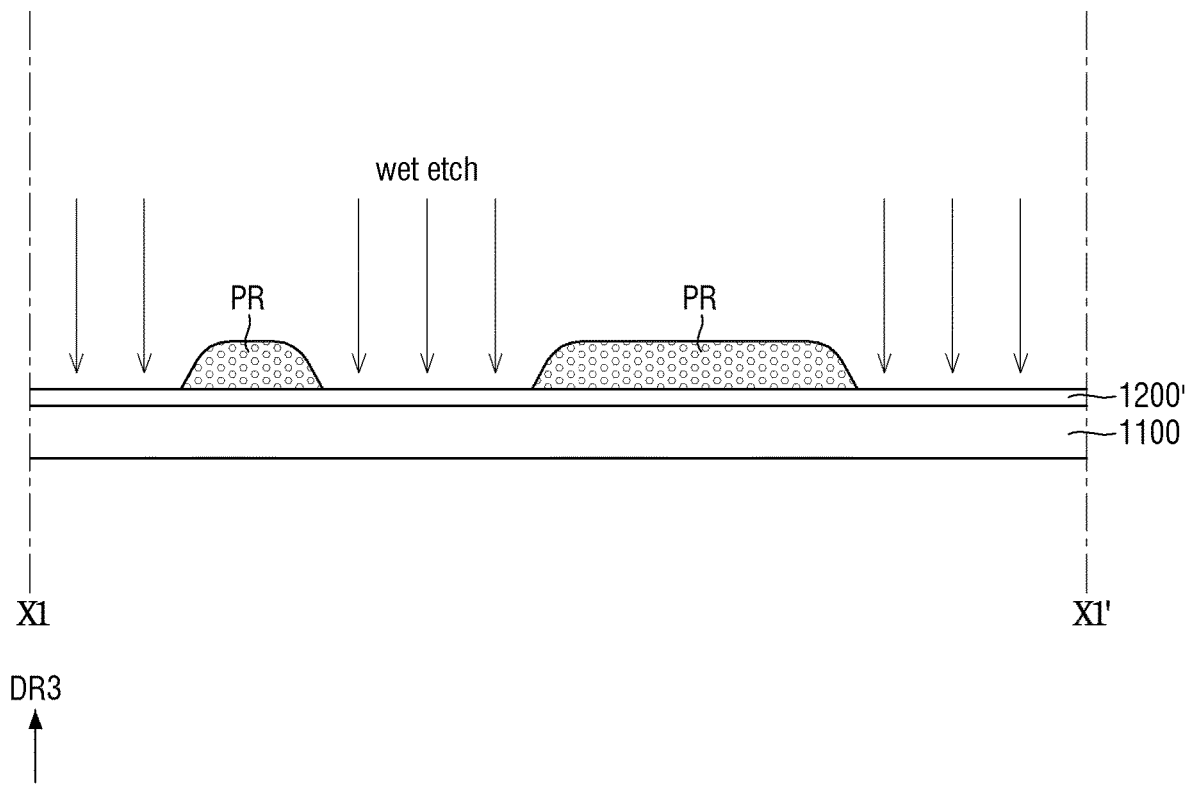
Figure 10:
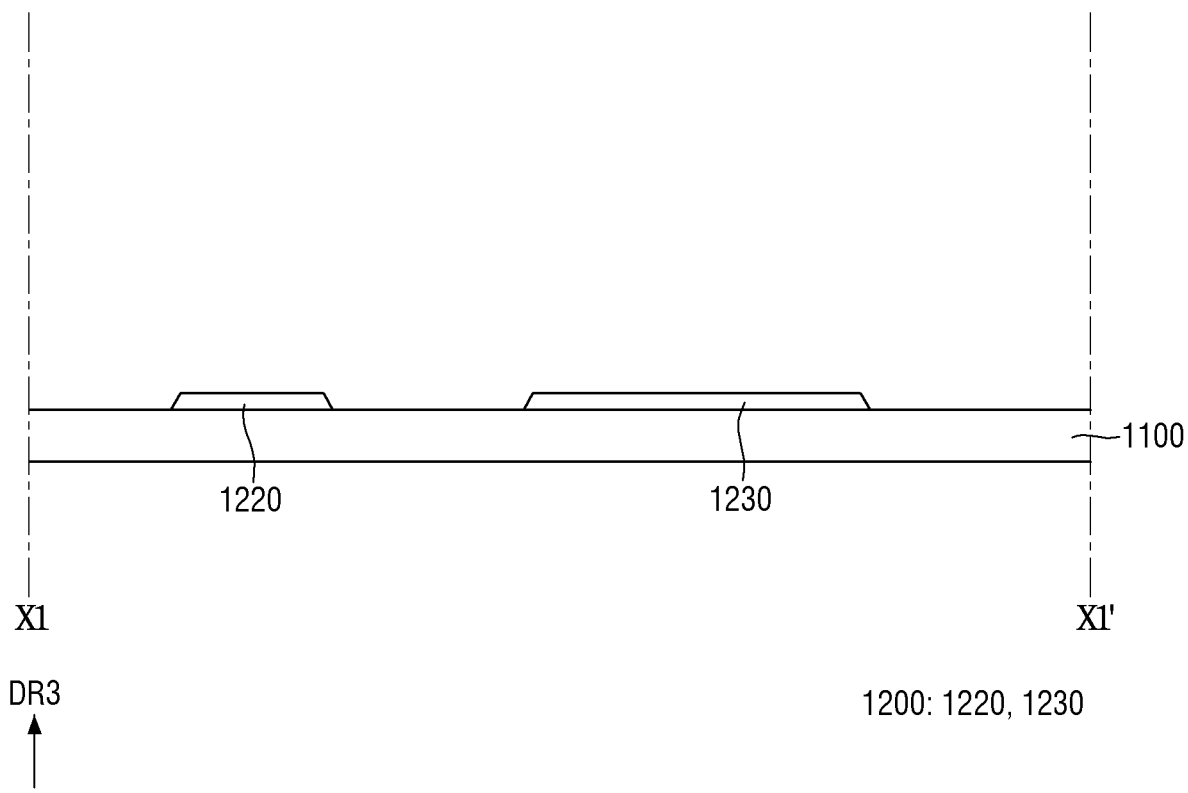

Subsequently, referring to FIGS. 9 to 11, a photoresist pattern PR is formed on the bottom metal material layer 1200', and the bottom metal material layer 1200' is patterned to form the bottom metal layer 1200 by using a photoresist pattern PR as an etch stop layer. For example, a photosensitive organic material is applied on the bottom metal material layer 1200', the photosensitive organic material is exposed to light and developed to form a photoresist pattern PR on the bottom metal material layer 1200', and a part of the bottom metal material layer 1200' that is not covered by the photoresist pattern PR may undergo a wet etching process. The bottom metal layer 1200 may be a residue remaining after the bottom metal material layer 1200' has been etched.

The bottom metal layer 1200 may be a result of the wet etching process performed on the bottom metal material layer 1200', and the side surface of the bottom metal layer 1200 may be inclined. Specifically, the angle between the lower surface of the bottom metal layer 1200 and the side surfaces of the bottom metal layer 1200 may be in a range of about 49° to about 79°.

Figure 11:
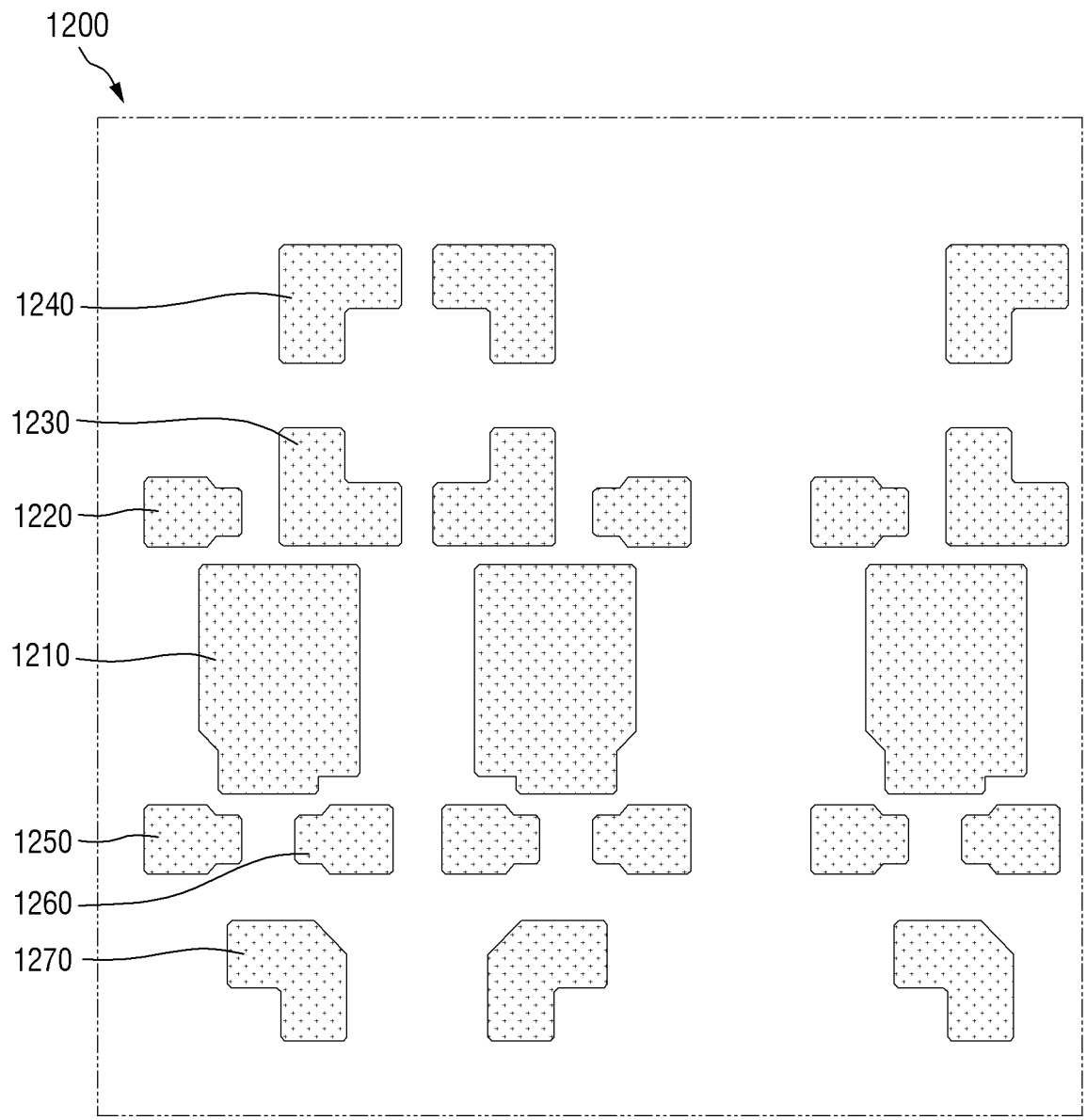

As shown in FIG. 11, the bottom metal layer 1200 may include a first bottom metal layer 1210, a second bottom metal layer 1220, a third bottom metal layer 1230, a fourth bottom metal layer 1240, a fifth bottom metal layer 1250, a sixth bottom metal layer 1260, and a seventh bottom metal layer 1270. The first bottom metal layer 1210, the second bottom metal layer 1220, the third bottom metal layer 1230, the fourth bottom metal layer 1240, the fifth bottom metal layer 1250, the sixth bottom metal layer 1260, and the seventh metal layer 1270 may be spaced apart from each other.

Subsequently, referring to FIGS. 12 to 15, a buffer material layer BF' and a semiconductor material layer 1300' are sequentially formed over the bottom metal layer 1200 formed on the substrate 1100, a photoresist pattern PR is formed on the semiconductor material layer 1300', and the semiconductor material layer 1300' is patterned using the photoresist pattern PR as an etch stop layer to form the semiconductor layer 1300. For example, a photosensitive organic material is applied on the semiconductor material layer 1300', the photosensitive organic material is exposed to light and developed to form a photoresist pattern PR on the semiconductor material layer 1300', and a part of the semiconductor material layer 1300' that is not covered by the photoresist pattern PR may undergo a wet etching process. The semiconductor layer 1300 may be a residue remaining after the semiconductor material layer 1300' has been etched. The semiconductor layer 1300 may expose a part of the buffer material layer BF'.

The semiconductor layer 1300 is a result of the wet etching process performed on the semiconductor material layer 1300', and the side surfaces of the semiconductor layer 1300 may be inclined. Specifically, the angle formed between the lower surface of the semiconductor layer 1300 and the side surface of the semiconductor layer 1300 may be in a range of about 49° to about 79°.

Figure 15:
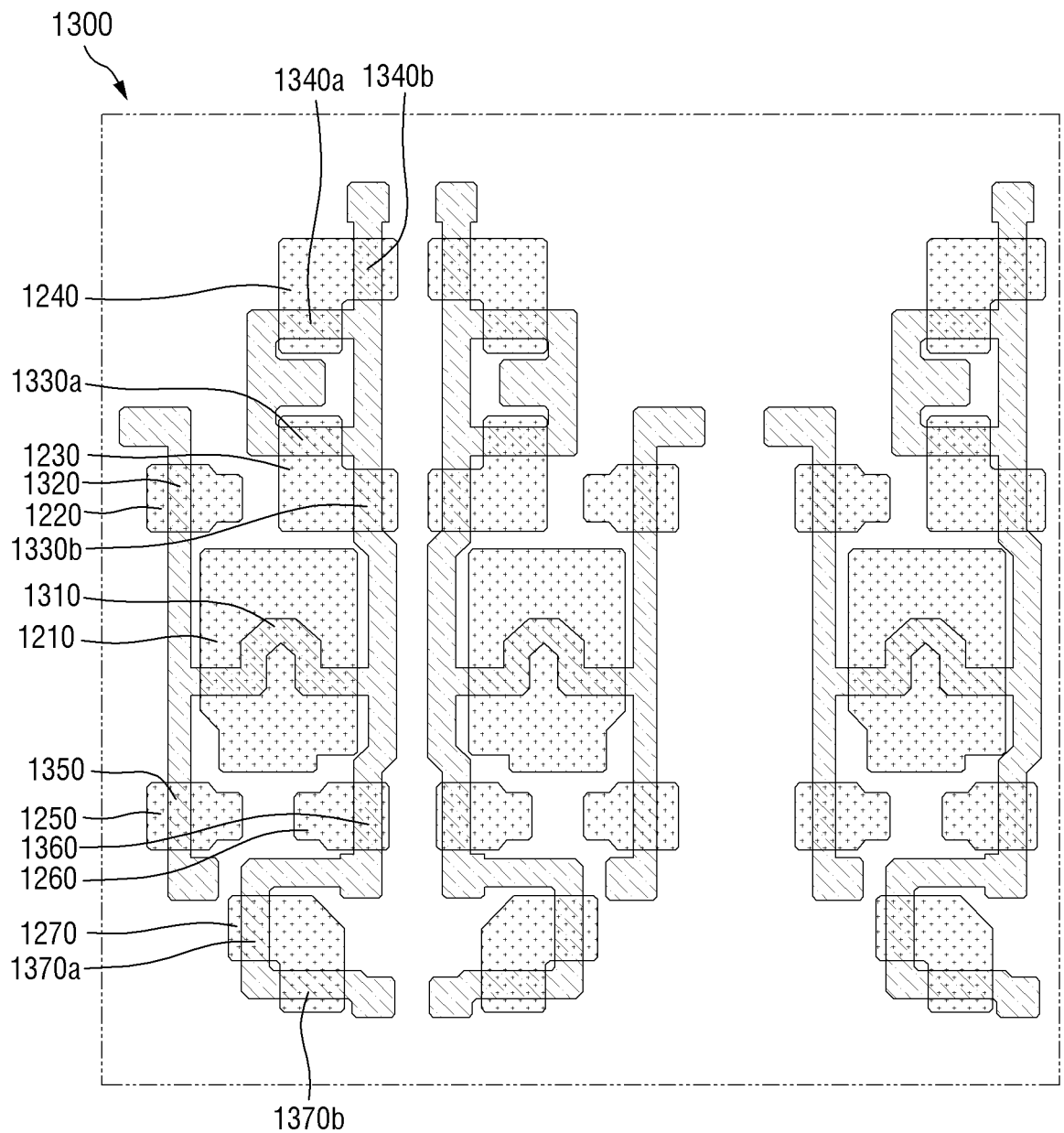
Figure 16:
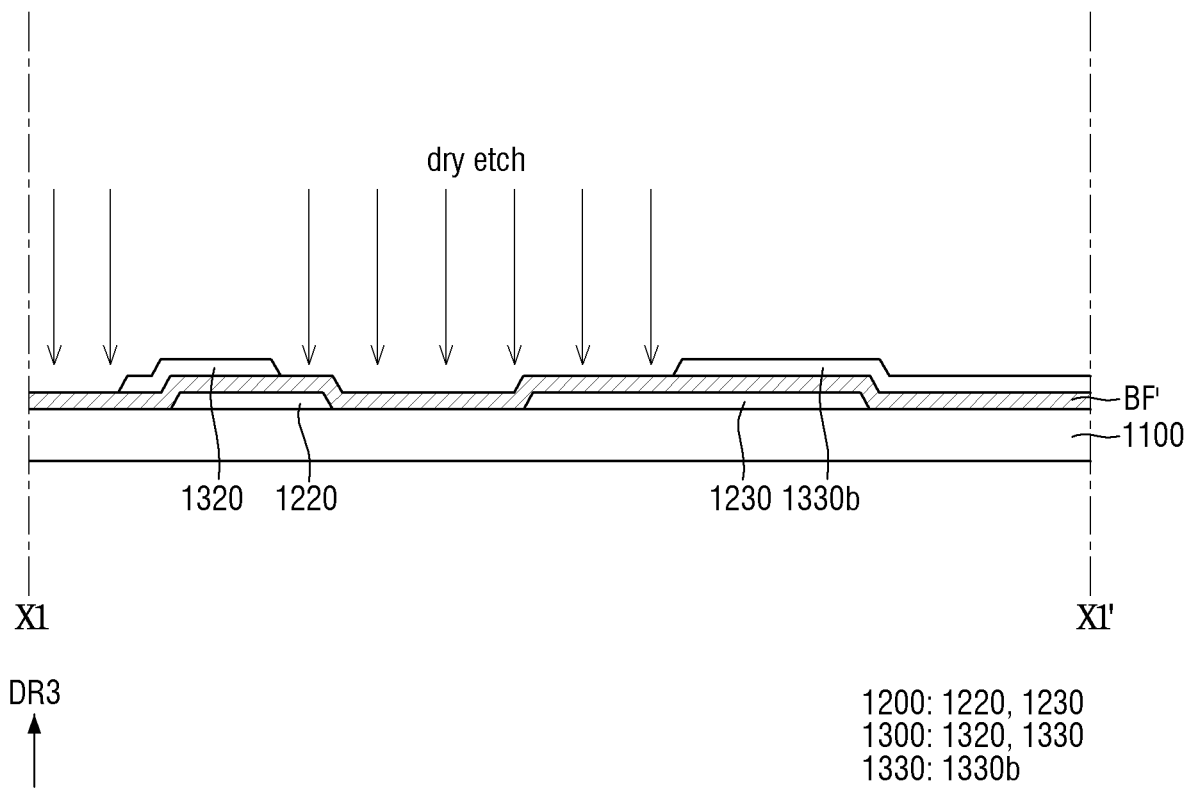

The semiconductor layer 1300 may be formed as a single piece in each sub-pixel SP as shown in FIG. 15. The semiconductor layer 1300 may include a first active area 1310, a second active area 1320, a third active area 1330, a fourth active area 1340, a fifth active area 1350, a sixth active area 1360, and a seventh active area 1370. The third active area 1330 may include a 3-1-th active area 1330a and a 3-2-th active area 1330b. The fourth active area 1340 may include a 4-1-th active area 1340a and a 4-2-th active area 1340b. The seventh active area 1370 may include a 7-1-th active area 1370a and a 7-2-th active area 1370b. A part of the first bottom metal layer 1210 may overlap the first active area 1310 in the third direction DR3. A part of the second bottom metal layer 1220 may overlap the second active area 1320 in the third direction DR3. A part of the third bottom metal layer 1230 may overlap the 3-1-th active area 1330a and the 3-2-th active area 1330b in the third direction DR3. A part of the fourth bottom metal layer 1240 may partially overlap the 4-1-th active area 1340a and the 4-2-th active area 1340b. A part of the fifth bottom metal layer 1250 may overlap the fifth active area 1350 in the third direction DR3. A part of the sixth bottom metal layer 1260 may overlap the sixth active area 1360 in the third direction DR3. A part of the seventh bottom metal layer 1270 may overlap the 7-1-th active area 1370a and the 7-2-th active area 1370b in the third direction DR3.

Subsequently, referring to FIGS. 16 to 19, the buffer material layer BF' is etched using the semiconductor layer 1300 as an etch stop layer to form the buffer layer BF, so that a first island part ISL1 is formed. A first protective layer 1410 is formed over the bottom metal layer 1200, the buffer layer BF, and the semiconductor layer 1300 disposed on the substrate 1100. For example, the process of etching the buffer material layer BF' may be performed as a dry etching process on a part of the buffer material layer BF' exposed by the semiconductor layer 1300 using the semiconductor layer as an etch stop layer.

Figure 17:
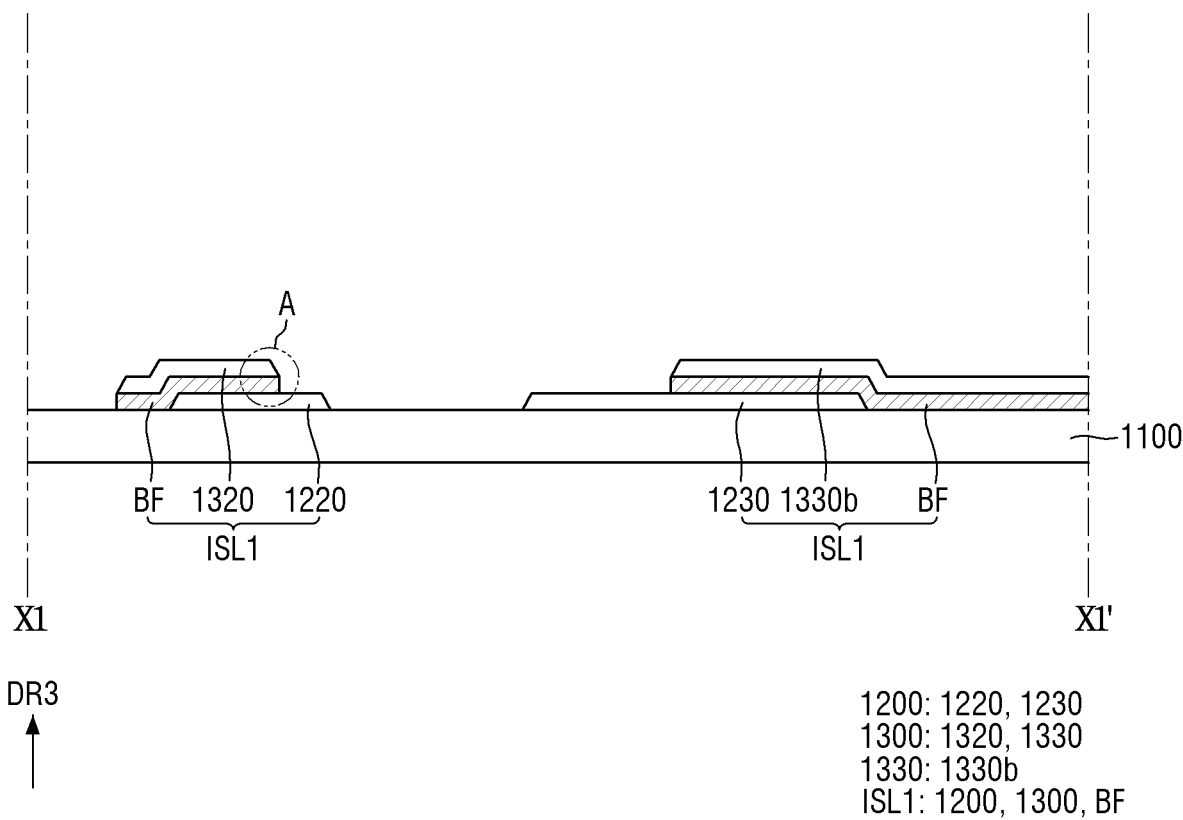

The bottom metal layer 1200, the buffer layer BF, and the semiconductor layer 1300 may form a first island part ISL1. For example, as shown in FIG. 17, the first island part ISL1 may include the second bottom metal layer 1220, the buffer layer BF, and the second active area 1320, or may include the third bottom metal layer 1230, the buffer layer BF, and the 3-2-th active area 1330b. A part of the bottom metal layer 1200 may overlap the buffer layer BF and the semiconductor layer 1300 in the third direction DR3, but another part of the bottom metal layer 1200 may not overlap the buffer layer BF and the semiconductor layer 1300 in the third direction DR3. The other part of the bottom metal layer 1200 may be electrically connected to the first metal layer 1500 through a bottom contact hole.

The buffer layer BF may be a result of etching the buffer material layer BF' by using the semiconductor layer 1300 as an etch stop layer. Side surfaces BF_a of the buffer layer BF and side surfaces 1300_a of the semiconductor layer 1300 may be connected to each other. In some embodiments, the semiconductor layer 1300 and the buffer layer BF may have profiles conforming to each other when viewed from the top. It should be understood, however, that the disclosure is not limited thereto. In other words, due to the differences in physical properties between the buffer layer BF and the semiconductor layer 1300, the deviations of the etching process of the buffer material layer BF', etc., there may be somewhat deviations between the profile of the semiconductor layer 1300 and the profile of the buffer layer BF when viewed from the top. It should be understood, however, that the disclosure is not limited thereto. For example, by adjusting the process conditions, the profile of the semiconductor layer 1300 and the profile of the buffer layer BF when viewed from the top may completely overlap each other in the third direction DR3. In other words, the buffer layer BF may have substantially the same profile as the semiconductor layer 1300 when viewed from the top. As used herein, the phrase that two elements have a same profile when viewed from the top may mean that the two elements have substantially a same shape when viewed from the top. In addition, in case that the two elements have a same shape when viewed from the top, they may have either a same area or different areas.

Figure 18:
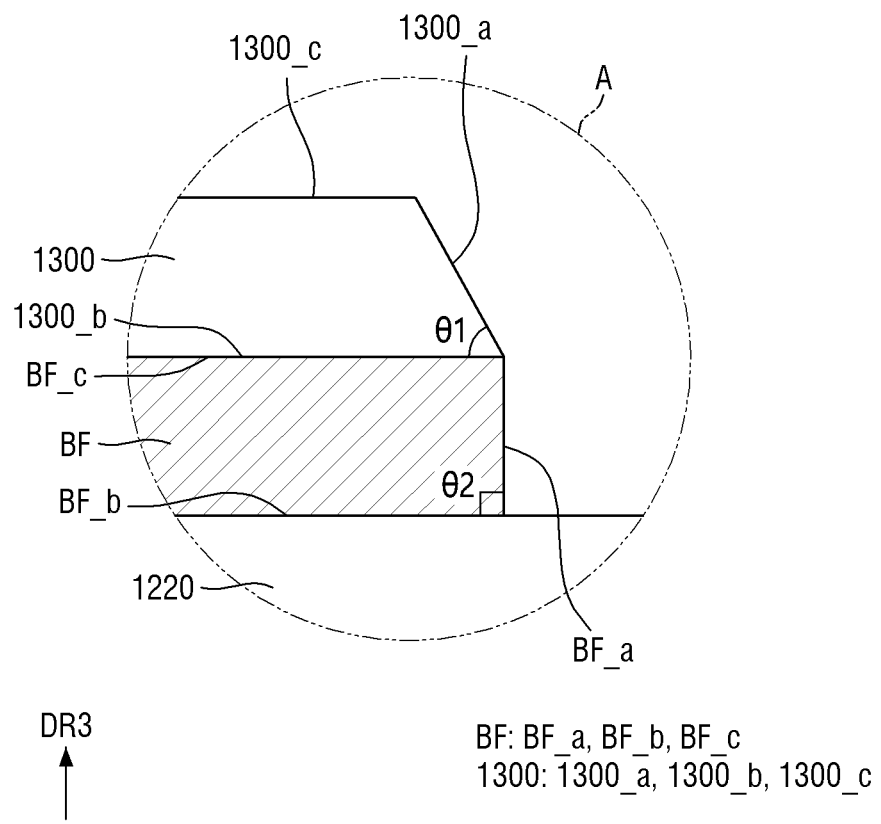
Figure 19:
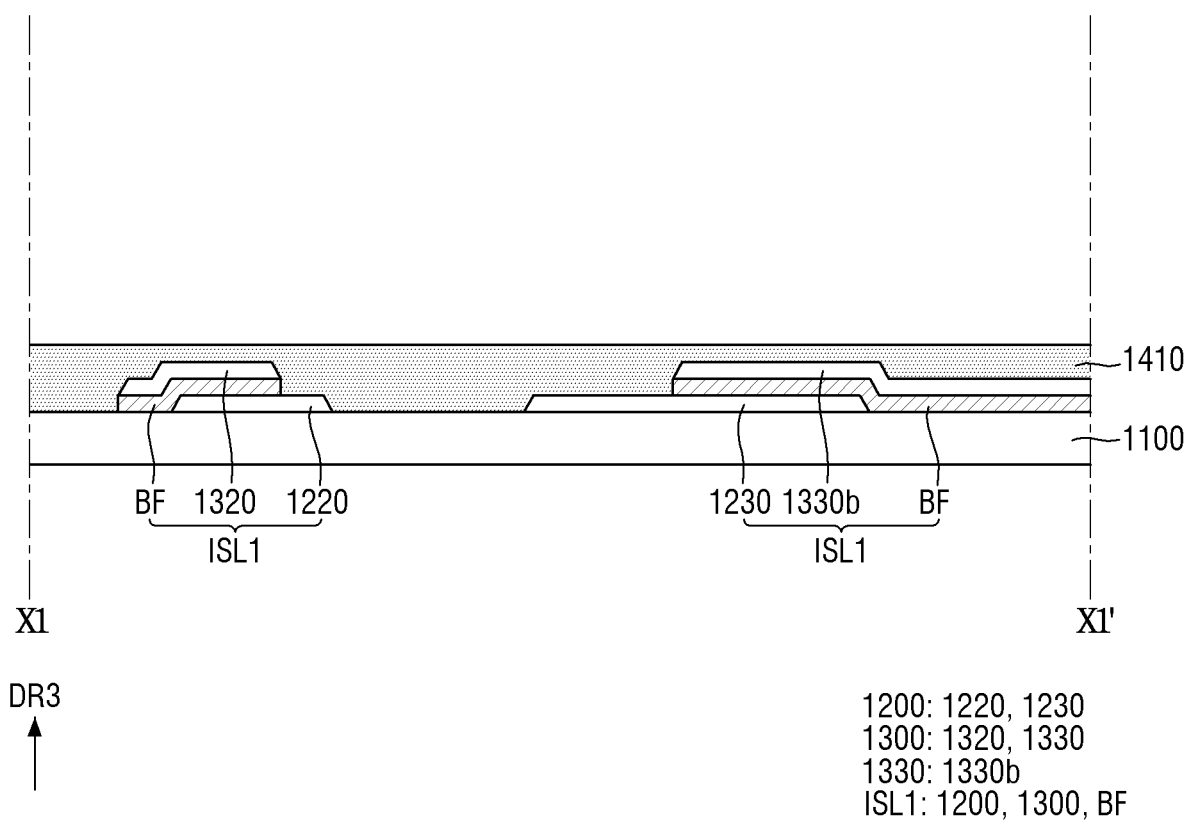

FIG. 18 is a schematic enlarged view of area A of FIG. 17. Referring to FIG. 18, a part of the side profile of the first island part ISL1 may be bent toward the inner side of the first island part ISL1. The side profile of the first island part ISL1 may be formed by connecting the side surface of the buffer layer BF with the side surface of the semiconductor layer 1300. Specifically, a lower surface 1300_b of the semiconductor layer 1300 and an upper surface BF_c of the buffer layer BF may completely overlap each other in the third direction DR3. In addition, the angle θ2 between the side surface BF_a of the buffer layer BF and a lower surface BF_b of the buffer layer BF may be greater than the angle θ1 between the lower surface 1300_b of the semiconductor layer 1300 and the side surface 1300_a of the semiconductor layer 1300. The angle θ1 between the lower surface 1300_b of the semiconductor layer 1300 and the side surface 1300_a of the semiconductor layer 1300 may have a range of about 49° to about 79°, and the angle θ2 between the side surface BF_a of the buffer layer BF and the lower surface BF_b of the buffer layer BF may have a range of about 79° to about 90°. This may be a result of dry etching the buffer material layer BF' by using the semiconductor layer 1300 as an etch stop layer.

The first protective layer 1410 may be disposed over the bottom metal layer 1200, the buffer layer BF, and the semiconductor layer 1300 disposed on the substrate 1100 to cover the first island part ISL1 formed on the substrate 1100. In some embodiments, the first protective layer 1410 may completely cover the upper surface of the semiconductor layer 1300, but the disclosure is not limited thereto. In some embodiments, the first protective layer 1410 may be formed to cover the first island part ISL1 to provide a flat surface, but the disclosure is not limited thereto.

Subsequently, referring to FIGS. 20 to 22, a first gate insulating material layer GI1' is formed on the first protective layer 1410, bottom contact holes penetrating through the first gate insulating layer GI1 and the first protective layer 1410 are formed, and a first conductive material layer 1500' is formed on the first gate insulating layer GI1 in which the bottom contact hole is formed.

Figure 20:
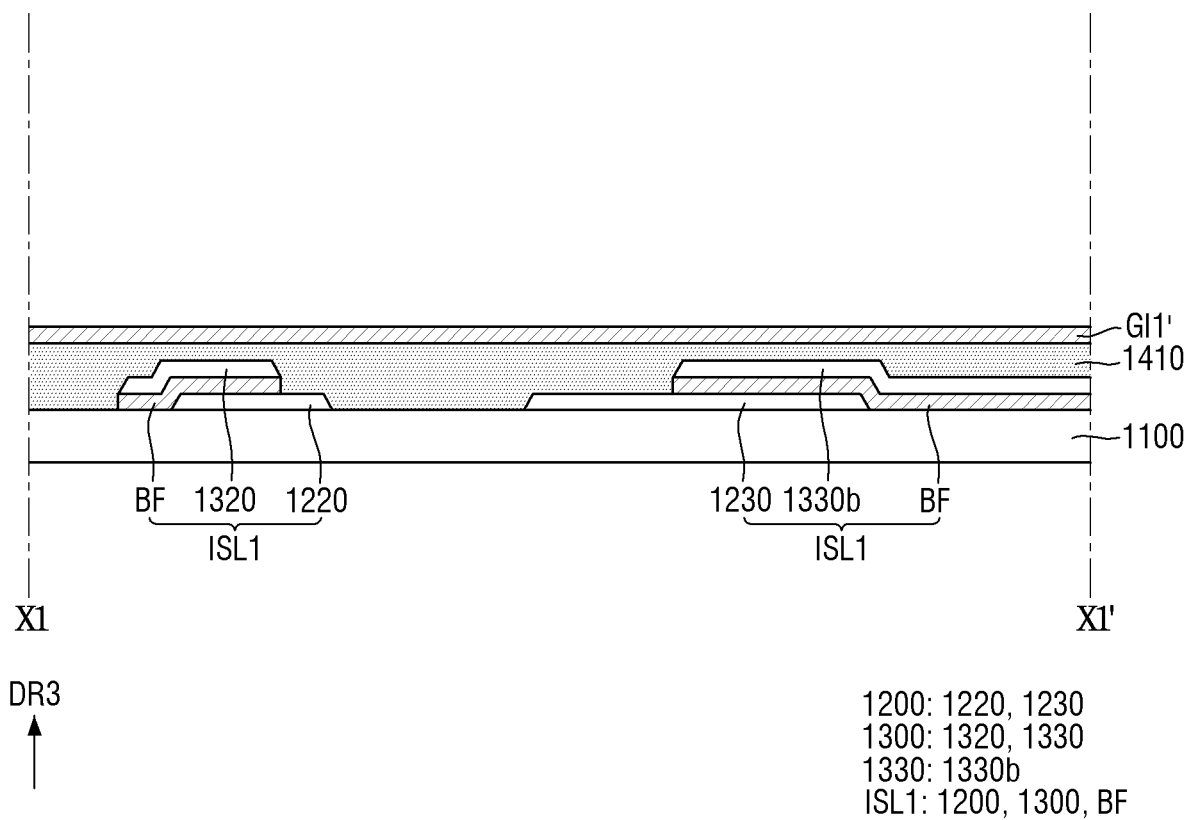

Referring to FIG. 20, the first gate insulating material layer GI1' may be formed to have substantially a same thickness along the profile of the first protective layer 1410.

Figure 21:
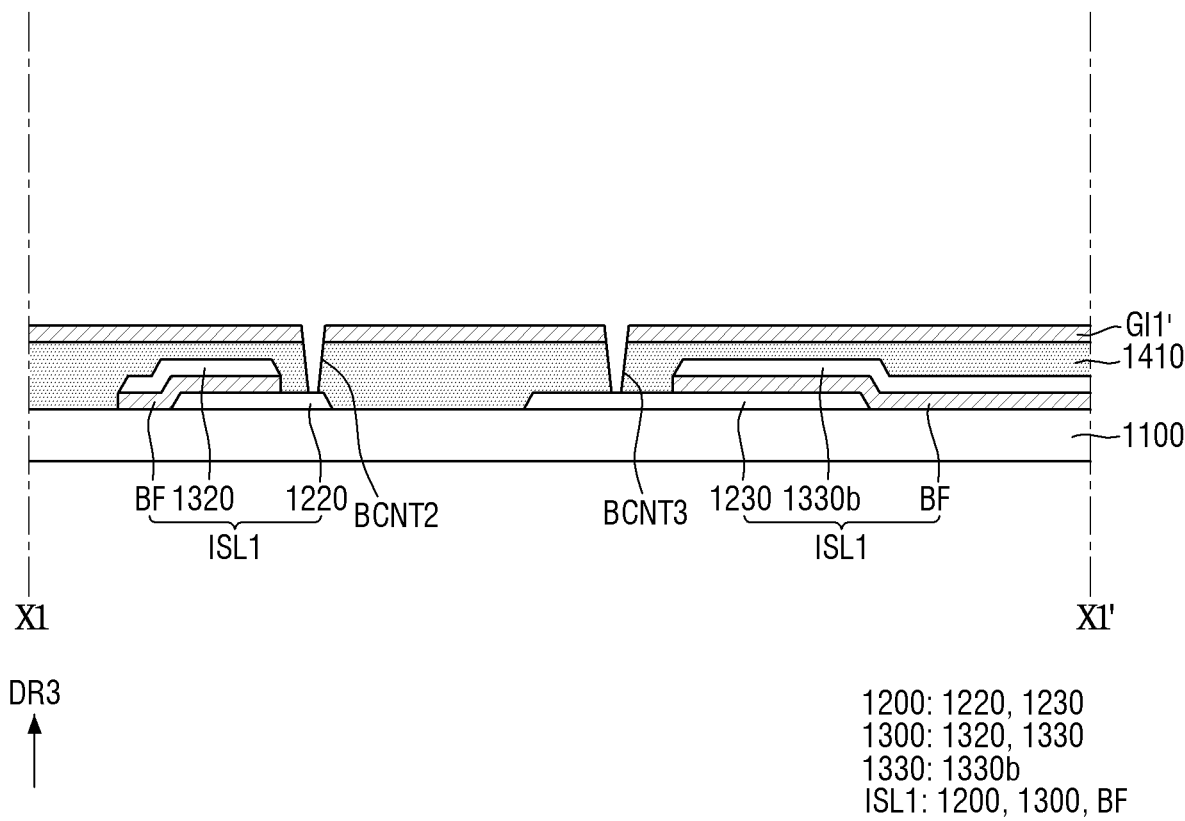

Referring to FIG. 21, after the first gate insulating material layer GI1' is formed on the first protective layer 1410, the bottom contact holes penetrating through the first gate insulating material layer GI1' and the first protective layer 1410 may be formed. For example, a second bottom contact hole BCNT2 may penetrate through the first gate insulating material layer GI1' and the first protective layer 1410 to reach a part of the upper surface of the second bottom metal layer 1220 that does not overlap the buffer layer BF and the semiconductor layer 1300. A third bottom contact hole BCNT3 may penetrate through the first gate insulating material layer GI1' and the first protective layer 1410 to reach a part of the upper surface of the third bottom metal layer 1230 that does not overlap the buffer layer BF and the semiconductor layer 1300.

Figure 22:
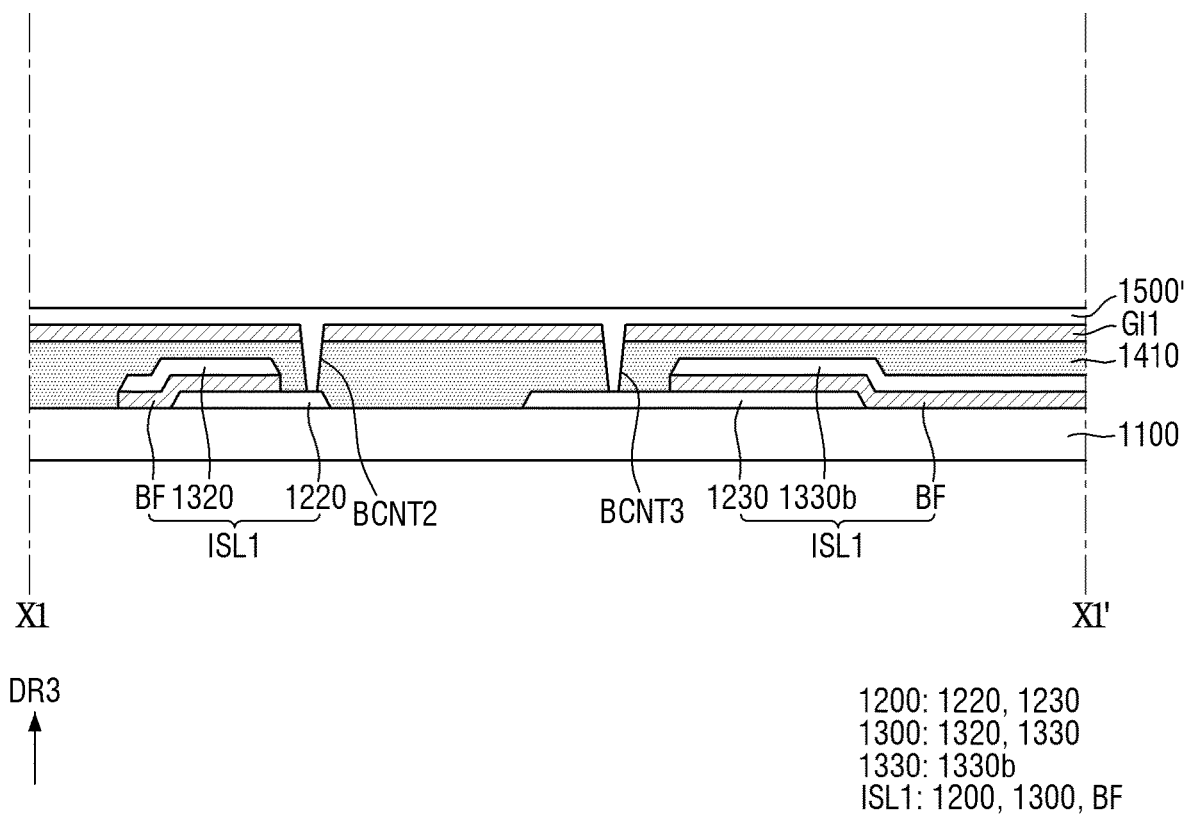

Referring to FIG. 22, the first conductive material layer 1500' may be formed on the first gate insulating material layer GI1' in which the bottom contact holes are formed. The bottom contact holes penetrating through the first gate insulating material layer GI1' and the first protective layer 1410 may be filled with the first conductive material layer 1500'.

Figure 23:
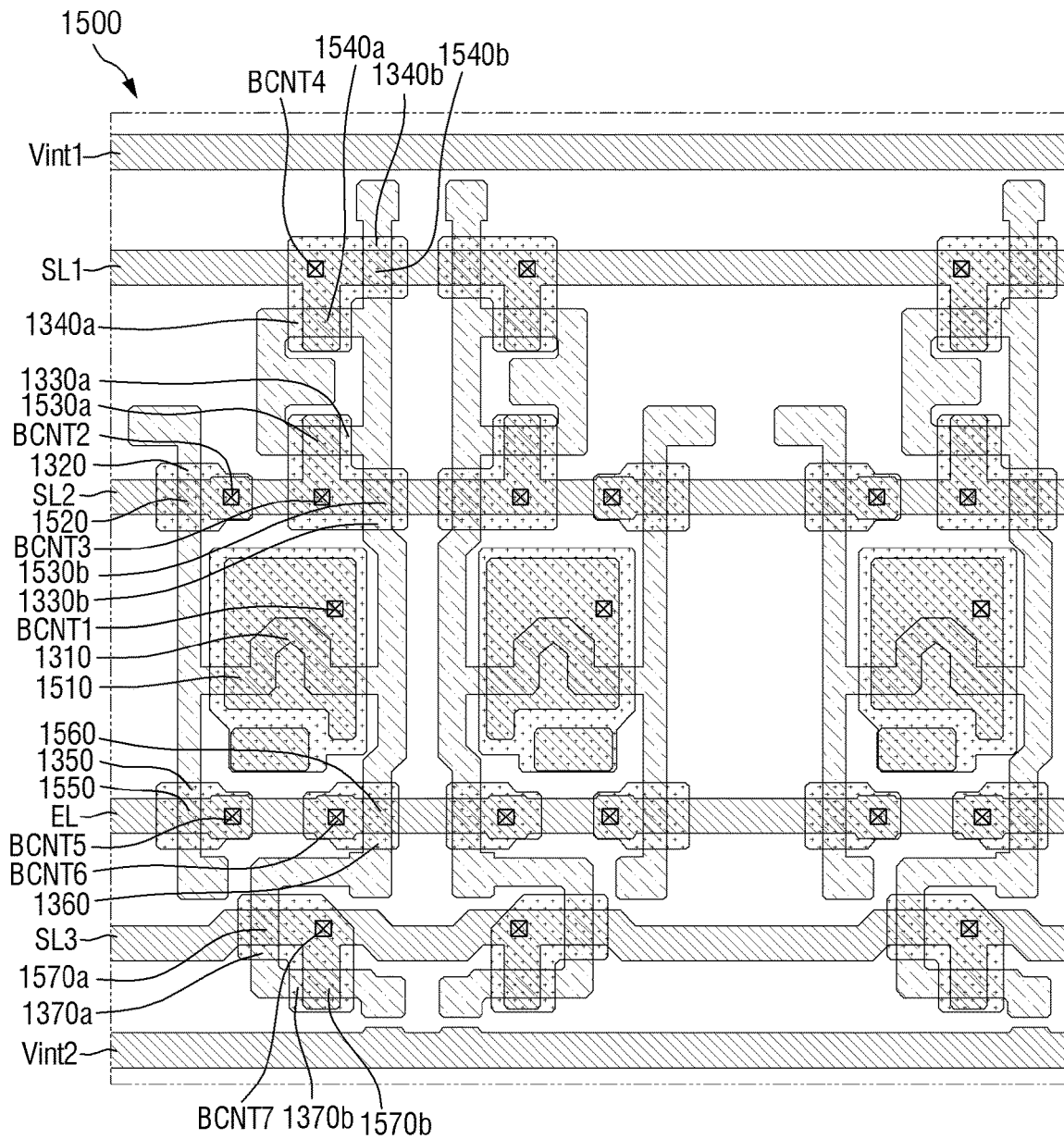
Figure 23:
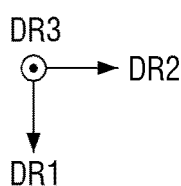
Figure 24:
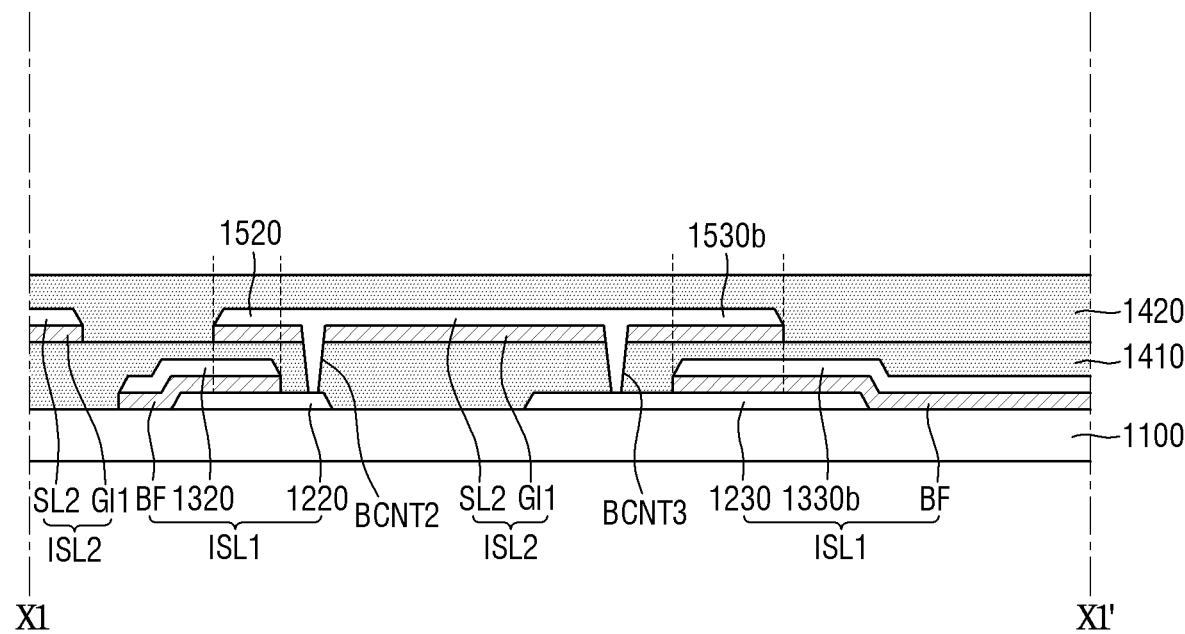

Subsequently, referring to FIGS. 23 and 24, the first conductive material layer 1500' and the first gate insulating material layer GI1' are etched to form a second island part ISL2, and a second protective layer 1420 is formed over the first gate insulating layer GI1 and the first metal layer 1500 disposed on the first protective layer 1410.

The process of etching the first conductive material layer 1500' may be substantially identical to the process of etching the bottom metal layer 1200 or the process of etching the semiconductor layer 1300. Specifically, the process of etching the first conductive material layer 1500 may be performed by applying a photosensitive organic material on the first conductive material layer 1500', exposing it to light and developing it to form a photoresist pattern PR on the first conductive material layer 1500', and wet etching a part of the first conductive material layer 1500' that is not covered by the photoresist pattern PR. The first metal layer 1500 may be a residue remaining after the first conductive material layer 1500' has been etched. Accordingly, a part of the first gate insulating material layer GI1' may be exposed by the first metal layer 1500.

The first metal layer 1500 may include a first initialization voltage line Vint1 for supplying a first initialization voltage, a first scan line SL1 for supplying a data write gate signal, a second scan line SL2 for supplying a data initialization gate signal, a third scan line SL3 for supplying an initialization gate signal to the light-emitting element LEL, a gate region 1510, an emission line EL for supplying an emission control signal, and a second initialization voltage line Vint2 for supplying the second initialization voltage. The first initialization voltage line Vint1, the first scan line SL1, the second scan line SL2, the third scan line SL3, the emission line EL, and the second initialization voltage line Vint2 may be extended in the second direction DR2 and may be spaced apart from each other in the first direction DR1, as shown in FIG. 23.

The first scan line SL1 may include a 4-1-th gate region 1540a overlapping the 4-1-th active area 1340a, and a 4-2-th gate region 1540b overlapping the 4-2-th active area 1340b. In some embodiments, the 4-1-th gate region 1540a may be formed to protrude from the first scan line SL1 to a side in the first direction DR1, but the disclosure is not limited thereto. The first scan line SL1 may be electrically connected to the fourth bottom metal layer 1240 through a fourth bottom contact hole BCNT4.

The second scan line SL2 may include a second gate region 1520 overlapping the second active area 1320, a 3-1-th gate region 1530a overlapping the 3-1-th active area 1330a, and a 3-2-th gate region 1530b overlapping the 3-2-th active area 1330b. In some embodiments, the 3-1-th gate region 1530a may be formed to protrude from the second scan line SL2 to an opposite side in the first direction DR1, but the disclosure is not limited thereto. The second scan line SL2 may be electrically connected to the second bottom metal layer 1220 through a second bottom contact hole BCNT2 and may be electrically connected to the third bottom metal layer 1230 through a third bottom contact hole BCNT3.

The first gate region 1510 may overlap the first active area 1310 and may be electrically connected to the first bottom metal layer 1210 through a first bottom contact hole BCNT1. In some embodiments, the first gate region 1510 may be disposed between the second scan line SL2 and the emission line EL to be spaced apart from the second scan line SL2 and the emission line EL, but the disclosure is not limited thereto.

The emission line EL may include a fifth gate region 1550 overlapping the fifth active area 1350, and a sixth gate region 1560 overlapping the sixth active area 1360. The emission line EL may be electrically connected to the fifth bottom metal layer 1250 through a fifth bottom contact hole BCNT5 and may be electrically connected to the sixth bottom metal layer 1260 through a sixth bottom contact hole BCNT6.

The third scan line SL3 may include a 7-1-th gate region 1570a overlapping the 7-1-th active area 1370a, and a 7-2-th gate region 1570b overlapping the 7-2-th active area 1370b. In some embodiments, the 7-2-th gate region 1570b may be formed to protrude from the third scan line SL3 to a side in the first direction DR1, but the disclosure is not limited thereto. The third scan line SL3 may be electrically connected to the seventh bottom metal layer 1270 through a seventh bottom contact hole BCNT7.

The process of etching the first gate insulating material layer GI1' is performed after the first metal layer 1500 has been formed, and may be the same as the process of etching the buffer layer BF. Specifically, the process of etching the first gate insulating material layer GI1' may be performed by dry etching a part of the first gate insulating material layer GI1' exposed by the first metal layer 1500 by using the first metal layer 1500 as an etch stop layer.

The first gate insulating layer GI1 and the first metal layer 1500 may form a second island part ISL2. For example, as shown in FIG. 24, the second island part ISL2 may include a second scan line SL2 and a first gate insulating layer GI1.

The side profile of the second island part ISL2 may be formed by connecting the side surface of the first gate insulating layer GI1 with the side surface of the first metal layer 1500. The side profile of the second island part ISL2 may be substantially identical to the side profile of the first island part. In other words, the relationship between the side surfaces of the first metal layer 1500 and the side surfaces of the first gate insulating layer GI1 may be substantially identical to the relationship between the side surfaces of the semiconductor layer 1300 and the side surfaces of the buffer layer BF. Specifically, the first gate insulating layer GI1 is a result of etching the first gate insulating material layer GI1' by using the first metal layer 1500 as an etch stop layer, and the side surfaces of the first gate insulating layer GI1 and the side surfaces of the first metal layer 1500 are connected to each other. In some embodiments, the profile of the first metal layer 1500 may conform to the profile of the first gate insulating layer GI1 when viewed from the top. It should be understood, however, that the disclosure is not limited thereto. In other words, due to the differences in physical properties between the first metal layer 1500 and the first gate insulating layer GI1, the deviations of the etching process of the first gate insulating material layer GI1', etc., there may be somewhat deviations in the profile of the first metal layer 1500 and the profile of the first gate insulating layer GI1 when viewed from the top. It should be understood, however, that the disclosure is not limited thereto. For example, by adjusting the process conditions, the profile of the first metal layer 1500 and the profile of the first gate insulating layer GI1 when viewed from the top may completely overlap each other in the third direction DR3.

The first metal layer 1500 is a result of the wet etching process performed on the first conductive material layer 1500', and the side surfaces of the first metal layer 1500 may be inclined. The angle between the lower surface of the first metal layer 1500 and the side surface of the first metal layer 1500 may be in a range of about 49° to about 79°. On the other hand, the angle formed between the lower surface of the first gate insulating layer GI1 and the side surface of the first gate insulating layer GI1 may be in a range of about 79° to about 90°. This may be a result of dry etching the first gate insulating material layer GI1' by using the first metal layer 1500 as an etch stop layer.

The second protective layer 1420 may be disposed over the first gate insulating layer GI1 and the first metal layer 1500 disposed on the first protective layer 1410 to cover the second island part ISL2. In some embodiments, the second protective layer 1420 may completely cover the upper surface of the first metal layer 1500, but the disclosure is not limited thereto. In some embodiments, the second protective layer 1420 may be formed to cover the second island part ISL2 to provide a flat surface, but the disclosure is not limited thereto.

Figure 25:
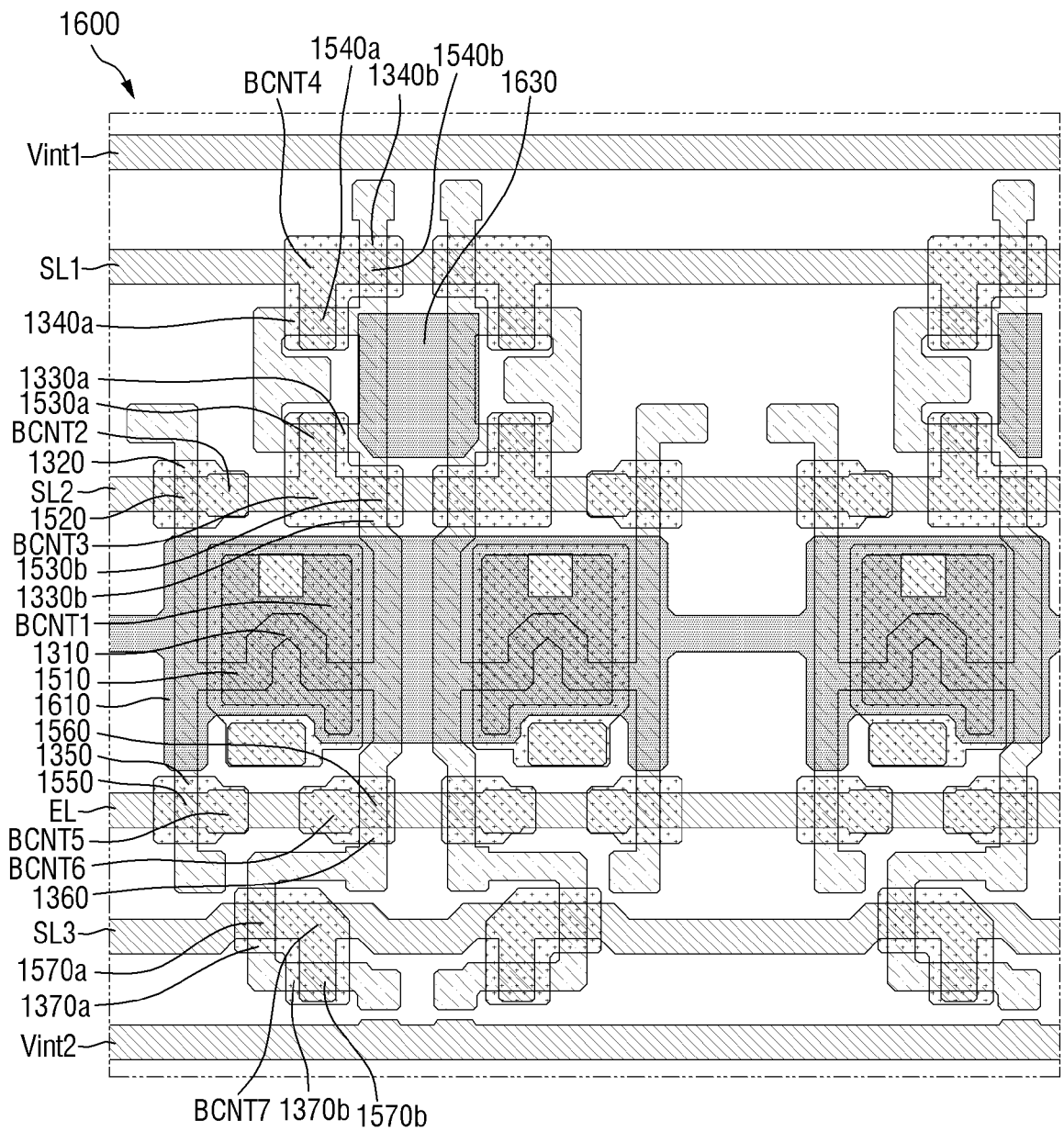
Figure 25:
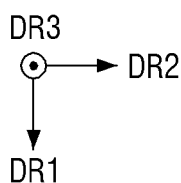
Figure 26:
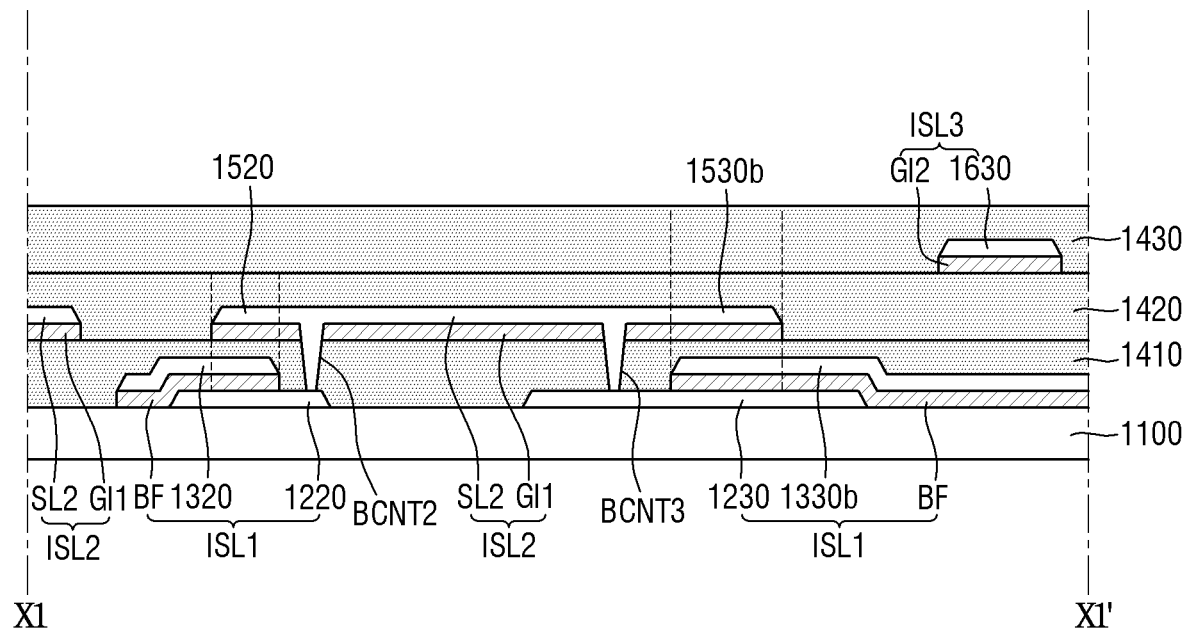

Subsequently, referring to FIGS. 25 and 26, a third island part ISL3 including a second gate insulating layer GI2 and a second metal layer 1600 is formed on the second protective layer 1420, and a third protective layer 1430 is formed to cover the third island part ISL3. For example, similar to the process of forming the second island part ISL2, the process of forming the third island part ISL3 may include forming a second gate material layer and a second conductive material layer sequentially on the second protective layer 1420, forming a second metal layer 1600 by wet etching the second conductive material layer by using a photoresist pattern (PR) layer, and dry etching the second gate insulating material layer by using the second metal layer 1600 as an etch stop layer.

The second metal layer 1600 may form a capacitor electrode. For example, as shown in FIG. 25, a first capacitor electrode 1610 may overlap the first gate region 1510 to form a storage capacitor Cstg, and a third capacitor electrode 1630 may overlap a third active area 1330 to form a stabilizing capacitor C1.

The side profile of the third island part ISL3 may be formed by connecting the side surface of the second gate insulating layer GI2 with the side surface of the second metal layer 1600. The side profile of the third island part ISL3 may be substantially identical to the side profile of the first island part. In other words, the relationship between the side surfaces of the second metal layer 1600 and the side surfaces of the second gate insulating layer GI2 may be substantially identical to the relationship between the side surfaces of the semiconductor layer 1300 and the side surfaces of the buffer layer BF. Specifically, the second gate insulating layer GI2 is a result of etching the second gate insulating material layer by using the second metal layer 1600 as an etch stop layer, and the side surfaces of the second gate insulating layer GI2 and the side surfaces of the second metal layer 1600 are connected to each other. In some embodiments, the profile of the second metal layer 1600 may conform to the profile of the second gate insulating layer GI2 when viewed from the top. It should be understood, however, that the disclosure is not limited thereto. In other words, due to the differences in physical properties between the second gate insulating layer GI2 and the second metal layer 1600, the deviations of the etching process of the second gate insulating material layer GI2, etc., there may be somewhat deviations in the profile of the second metal layer 1600 and the profile of the second gate insulating material layer GI2' when viewed from the top. It should be understood, however, that the disclosure is not limited thereto. For example, by adjusting the process conditions, the profile of the second metal layer 1600 and the profile of the second gate insulating material layer GI2' when viewed from the top may completely overlap each other in the third direction DR3.

The second metal layer 1600 is a result of the wet etching process performed on the second conductive material layer, and the side surfaces of the second metal layer 1600 may be inclined. The angle between the lower surface of the second metal layer 1600 and the side surface of the second metal layer 1600 may be in a range of about 49° to about 79°. On the other hand, the angle formed between the lower surface of the second gate insulating layer GI2 and the side surface of the second gate insulating layer GI2 may be in a range of about 79° to about 90°. This may be a result of dry etching the second gate insulating material layer by using the second metal layer 1600 as an etch stop layer.

The third protective layer 1430 may be disposed over the second gate insulating layer GI2 and the second metal layer 1600 disposed on the second protective layer 1420 to cover the third island part ISL3. In some embodiments, the third protective layer 1430 may completely cover the upper surface of the second metal layer 1600, but the disclosure is not limited thereto. In some embodiments, the third protective layer 1430 may be formed to cover the third island part ISL3 to provide a flat surface, but the disclosure is not limited thereto.

Figure 27:
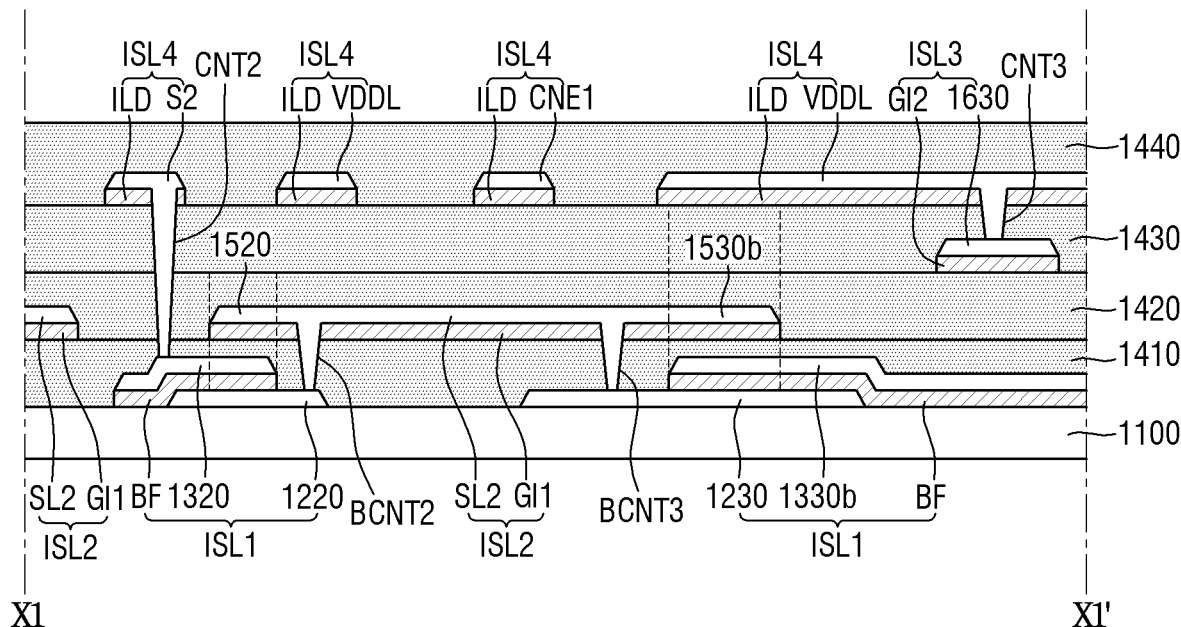

Subsequently, referring to FIG. 27, a fourth island part ISL4 including an interlayer dielectric layer ILD and a third metal layer 1700 is formed on the third protective layer 1430, and a third protective layer 1430 is formed to cover the fourth island part ISL4. For example, similar to the process of forming the second island part ISL2, the process of forming the fourth island part ISL4 may include forming an interlayer material layer on the third protective layer 1430, forming a contact hole penetrating the interlayer material layer, the third protective layer 1430, the second protective layer 1420, and the first protective layer 1410 and forming a third conductive material, forming a third metal layer 1700 by wet etching the third conductive material layer by using a photoresist pattern (PR) layer, and dry etching the interlayer material layer by using the third metal layer 1700 as an etch stop layer to form an interlayer dielectric layer ILD.

The side profile of the fourth island part ISL4 may be formed by connecting the side surface of the interlayer dielectric layer ILD with the side surface of the third metal layer 1700. The side profile of the fourth island part ISL4 may be substantially identical to the side profile of the first island part. In other words, the relationship between the side surfaces of the third metal layer 1700 and the side surfaces of the interlayer dielectric layer ILD may be substantially identical to the relationship between the side surfaces of the semiconductor layer 1300 and the side surfaces of the buffer layer BF. Specifically, the interlayer dielectric layer ILD is a result of etching the interlayer material layer by using the third metal layer 1700 as an etch stop layer, and the side surfaces of the interlayer dielectric layer ILD and the side surfaces of the third metal layer 1700 are connected to each other. In some embodiments, the profile of the third metal layer 1700 may conform to the profile of the interlayer dielectric layer ILD when viewed from the top. It should be understood, however, that the disclosure is not limited thereto. In other words, due to the differences in physical properties between the interlayer dielectric layer ILD and the third metal layer 1700, the deviations of the etching process of the interlayer material layer ILD', etc., there may be somewhat deviations in the profile of the third metal layer 1700 and the profile of the interlayer dielectric layer ILD when viewed from the top. It should be understood, however, that the disclosure is not limited thereto. For example, by adjusting the process conditions, the profile of the third metal layer 1700 and the profile of the interlayer dielectric layer ILD when viewed from the top may completely overlap each other in the third direction DR3.

The third metal layer 1700 is a result of the wet etching process performed on the third conductive material layer, and the side surfaces of the third metal layer 1700 may be inclined. Specifically, the angle between the lower surface of the third metal layer 1700 and the side surface of the third metal layer 1700 may be in a range of about 49° to about 79°. On the other hand, the angle between the lower surface of the interlayer dielectric layer ILD and the side surfaces of the interlayer dielectric layer ILD may have a range of about 79° to about 90°. This may be a result of dry etching the interlayer dielectric material layer by using the third metal layer 1700 as an etch stop layer.

The fourth protective layer 1440 may be disposed over the interlayer dielectric layer ILD and the third metal layer 1700 disposed on the third protective layer 1430 to cover the fourth island part ISL4. In some embodiments, the fourth protective layer 1440 may completely cover the upper surface of the third metal layer 1700, but the disclosure is not limited thereto. In some embodiments, the fourth protective layer 1440 may be formed to cover the fourth island part ISL4 to provide a flat surface, but the disclosure is not limited thereto.

Hereinafter, a display device 1 according to other embodiments of the disclosure will be described. In the following description, the same or similar elements will be denoted by a same or similar reference numerals, and redundant descriptions will be omitted or briefly described.

Figure 28:
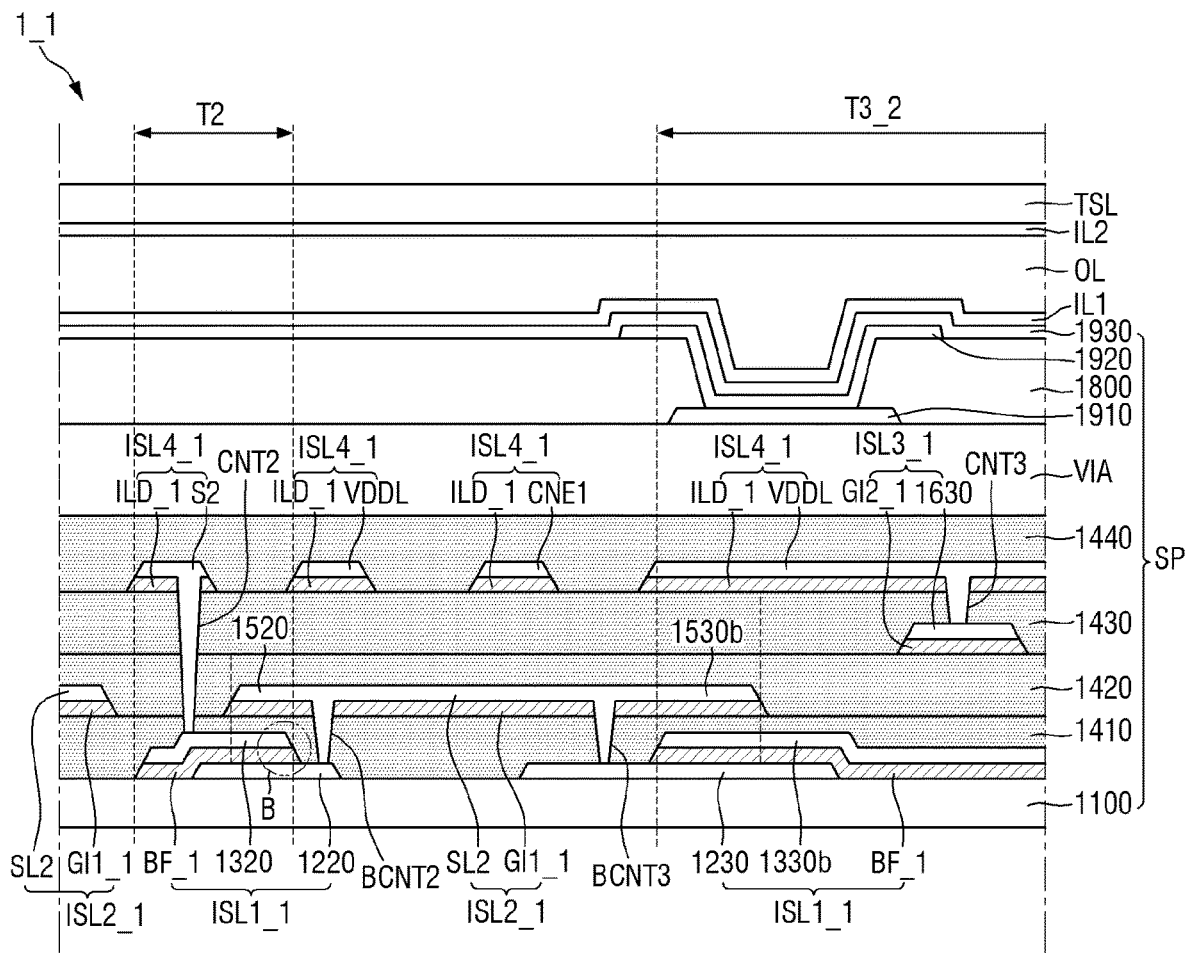
FIG. 28 is a schematic cross-sectional view of a sub-pixel of a display device according to another embodiment of the disclosure.
Figure 29:
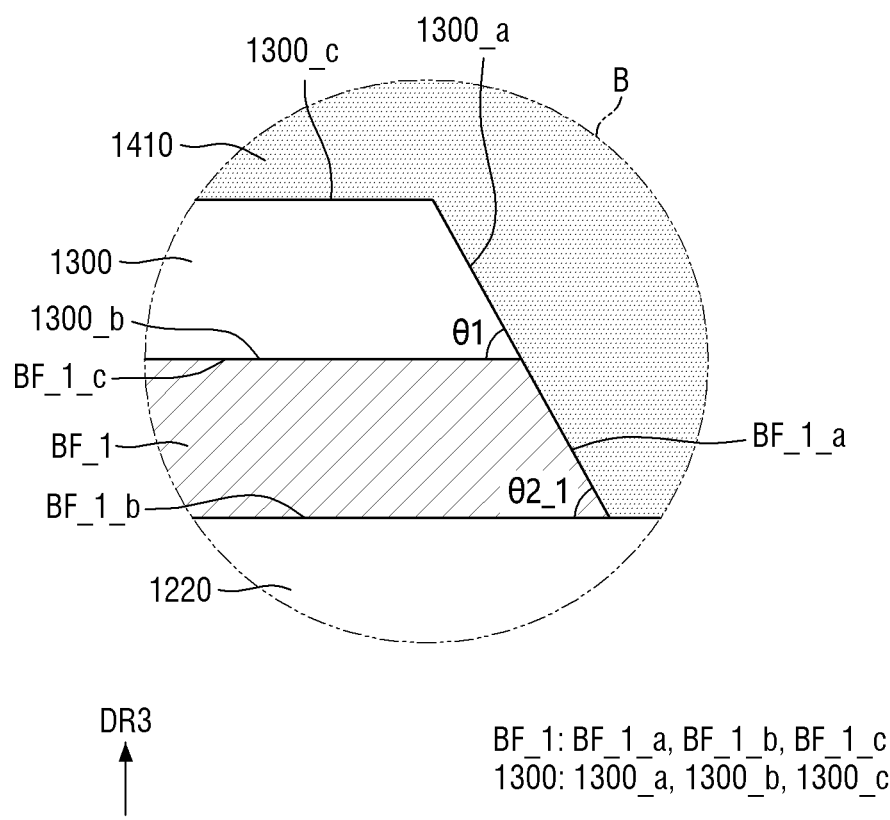
FIG. 29 is a schematic enlarged view of area B of FIG. 28.
Figure 30:
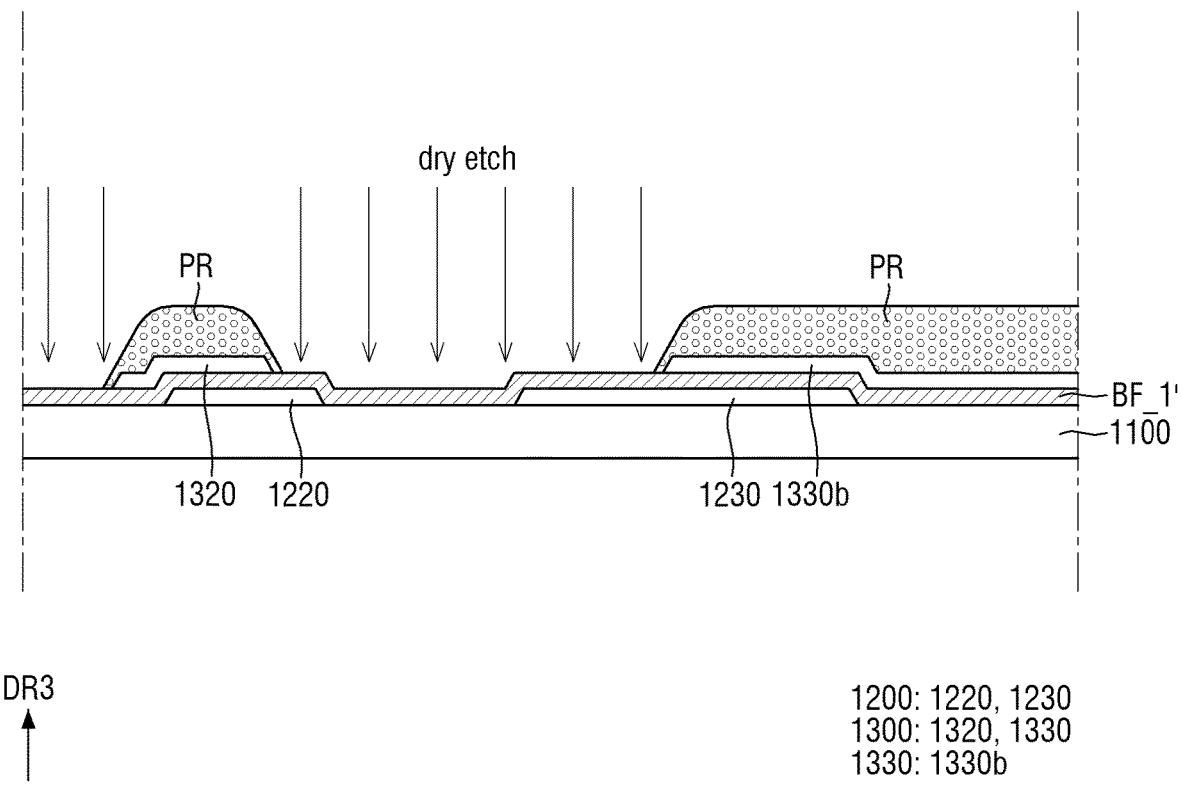
FIGS. 30 and 31 are schematic cross-sectional views for illustrating a method of fabricating the display device according to the embodiment of FIG. 28.
Figure 31:
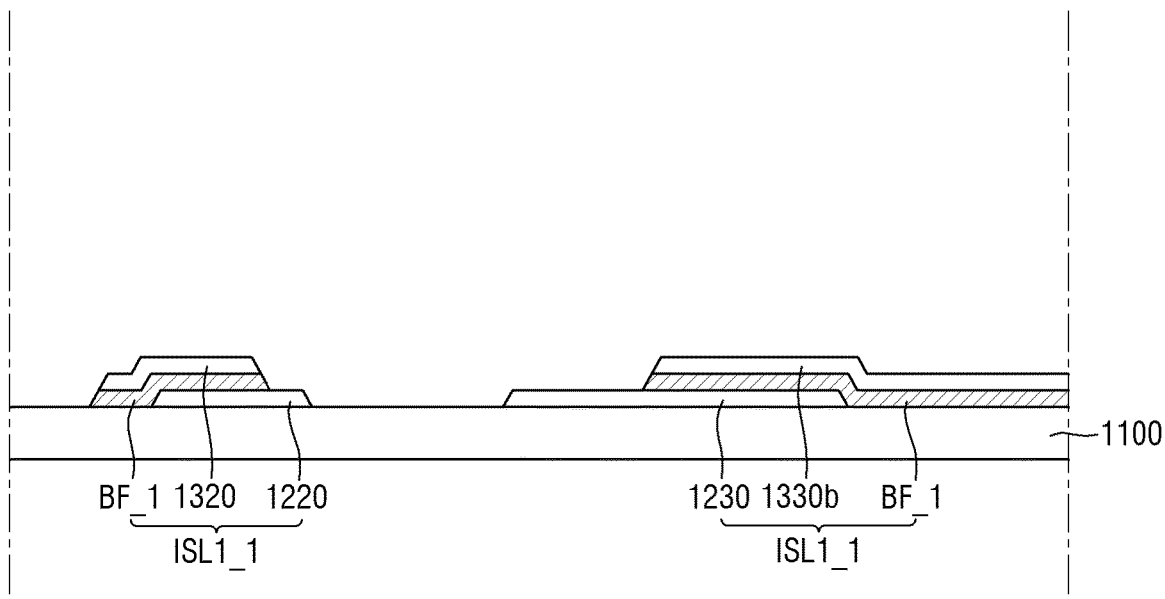

FIG. 28 is a schematic cross-sectional view of a sub-pixel of a display device according to another embodiment of the disclosure. FIG. 29 is a schematic enlarged view of area B of FIG. 28. FIGS. 30 and 31 are schematic cross-sectional views for illustrating a method of fabricating the display device according to the embodiment of FIG. 28.

Referring to FIG. 28, in a display device 1_1 according to this embodiment, the side profile of the island part may form a straight line or may be partially bent toward the outer side of the island part. Specifically, the angle formed between the lower surface of the buffer layer BF_1 and the side surface of the buffer layer BF_1 of a first island part ISL1_1 may be equal to or less than the angle formed between the lower surface of the semiconductor layer 1300 and the side surface of the semiconductor layer 1300. The angle formed between the lower surface of a first gate insulating layer GI1_1 and the side surface of the first gate insulating layer GI1_1 of a second island part ISL2_1 may be equal to or less than the angle formed between the lower surface of the first metal layer 1500 and the side surface of the first metal layer 1500. The angle formed between the lower surface of a second gate insulating layer GI2_1 and the side surface of the second gate insulating layer GI2_1 of a third island part ISL3_1 may be equal to or less than the angle formed between the lower surface of the second metal layer 1600 and the side surface of the second metal layer 1600. The angle formed between the lower surface of an interlayer dielectric layer ILD_1 and the side surface of the interlayer dielectric layer ILD_1 of a fourth island part ISL4_1 may be equal to or less than the angle formed between the lower surface of the third metal layer 1700 and the side surface of the third metal layer 1700. The side profile of the first island part ISL1_1 may be substantially identical to the side profile of the second island part ISL2_1, the side profile of the third island part ISL3_1, and the side profile of the fourth island part ISL4_1. In the following description, the side profile of the island part will be described based on the side profile of the first island part ISL1_1.

The side profile of the first island part ISL1_1 may be formed by connecting the side surfaces of the buffer layer BF_1 with the side surfaces of the semiconductor layer 1300. Referring to FIG. 29, as described above, the semiconductor layer 1300 is a result of the wet etching process performed on the semiconductor material layer 1300', and a side surfaces 1300_$a$ of the semiconductor layer 1300 may be inclined. Specifically, the angle θ1 between the lower surface 1300_$b$ of the semiconductor layer 1300 and the side surfaces 1300_$a$ of the semiconductor layer 1300 may be in a range of about 49° to about 79°. On the other hand, the angle θ2_1 between side surfaces BF_1_$a$ of the buffer layer BF_1 and lower surface BF_1_$b$ of the buffer layer BF may be equal to or less than the angle θ1 between the lower surface 1300_$b$ of the semiconductor layer 1300 and the side surfaces 1300_$a$ of the semiconductor layer 1300. Specifically, an angle θ2_1 between the side surfaces BF_1_$a$ of the buffer layer BF_1 and the lower surface BF_1_$b$ of the buffer layer BF may be equal to or less than about 49°. This may be due to the process of fabricating the display device 1_1 according to the embodiment of FIG. 28 to be described later.

Hereinafter, a process of forming the first island part ISL1_1 of the display device 1_1 according to the embodiment of FIG. 28 will be described. The process of forming the first island part ISL1_1 is substantially identical to the process of forming the second island part ISL2_1, the third island part ISL3_1, and the fourth island part ISL4_1 and, therefore, the redundant descriptions will be omitted.

Referring to FIGS. 30 to 31, a photoresist pattern PR is formed on the semiconductor layer 1300, and a buffer material layer BF_1' is etched using a photoresist pattern PR as an etch stop layer to form a buffer layer BF_1. For example, a photosensitive organic material is applied on the semiconductor layer 1300, it is exposed to light and developed to form a photoresist pattern PR on the semiconductor layer 1300, and a part of the buffer material layer BF_1' that is not covered by the photoresist pattern PR may undergo a dry etch process. In this instance, damage to the semiconductor layer 1300 that may occur while etching the buffer material layer BF_1' can be mitigated. The side profile of the island part may be formed by forming a photoresist pattern PR on the semiconductor layer 1300, and etching the buffer material layer BF_1' by using the photoresist pattern PR as an etch stop layer to form the buffer layer BF_1.

Figure 32:
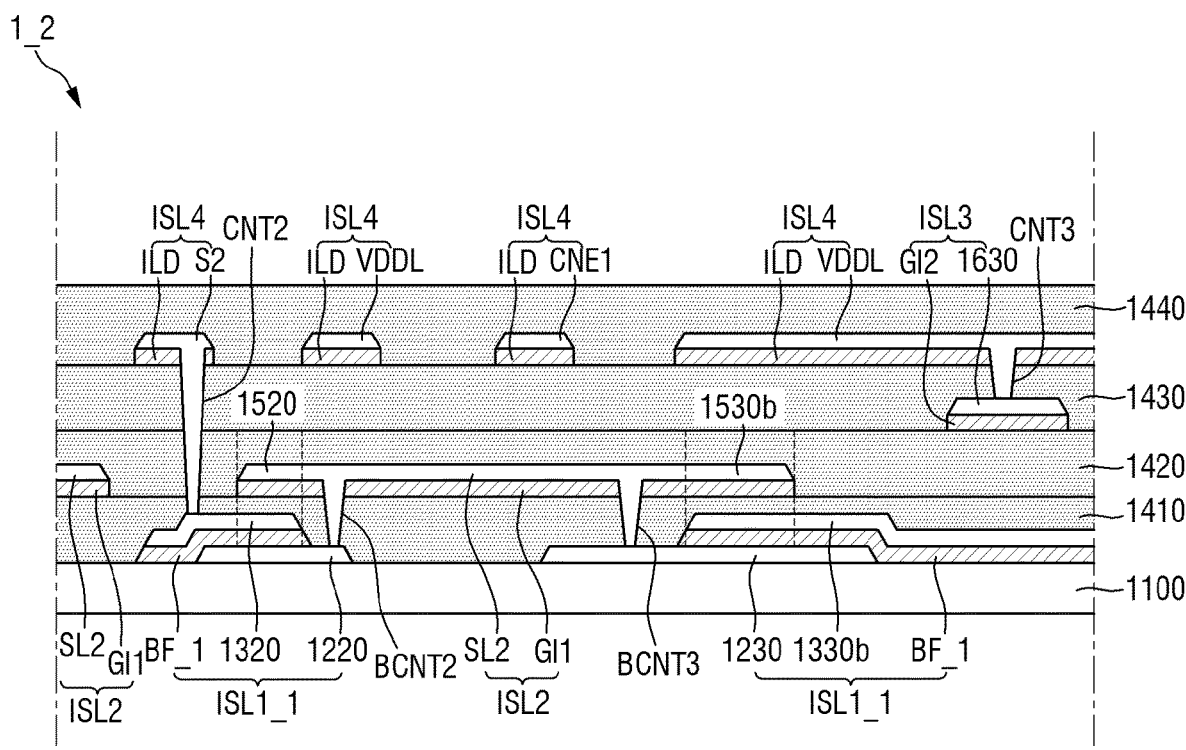
FIG. 32 is a schematic cross-sectional view of a sub-pixel of a display device according to yet another embodiment of the disclosure.

FIG. 32 is a schematic cross-sectional view of a sub-pixel of a display device according to yet another embodiment of the disclosure.

A display device 1_2 according to the embodiment of FIG. 32 is different from the display device 1 according to the embodiment of FIG. 1 at least in that only the side profile of a first island part ISL1_1 may form a straight line or may be partially bent toward the outer side of the island part. Specifically, the angle formed between the lower surface of a buffer layer BF_1 and the side surfaces of the buffer layer BF_1 of the first island part ISL1_1 may be equal to or less than the angle formed between the lower surface of the semiconductor layer 1300 and the side surfaces of the semiconductor layer 1300. This may be because the first island part ISL1_1 is formed via the process of fabricating the display device 1_1 according to the embodiment of FIG. 28 while the second island part ISL2, the third island part IS3, and the fourth island part ISL4 are formed via the process of fabricating the display device 1 according to the embodiment of FIG. 1.

In some embodiments, only the side profile of the first island part ISL1_1 may be formed in a straight line or may be partially be bent toward the outer side of the island part. It should be understood, however, that the disclosure is not limited thereto. For example, only the side profile of the second island part ISL2 may be formed in a straight line or may be partially bent toward the outer side of the island part.

Figure 33:
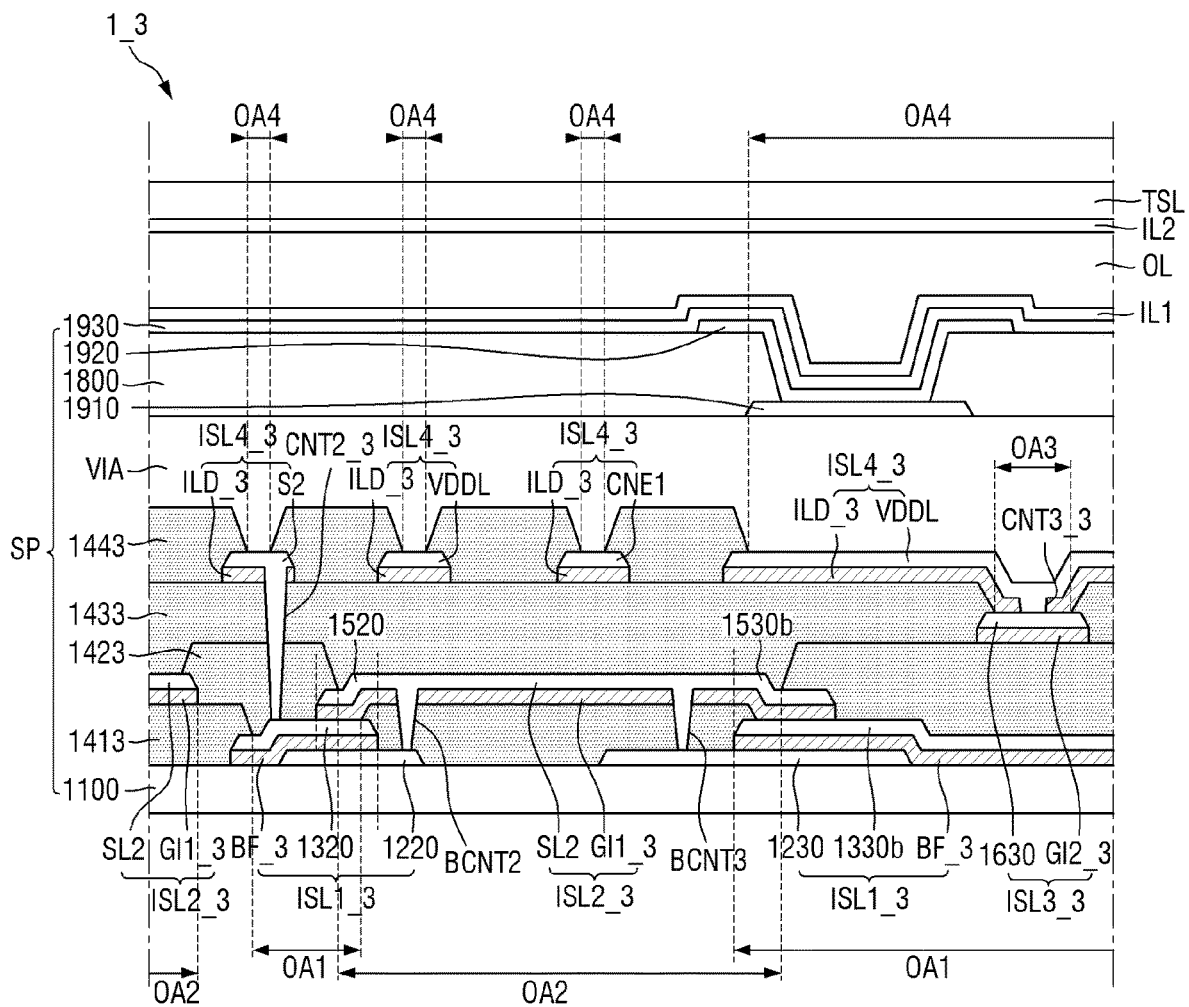
FIG. 33 is a schematic cross-sectional view of a sub-pixel of a display device according to yet another embodiment of the disclosure.
Figure 34:
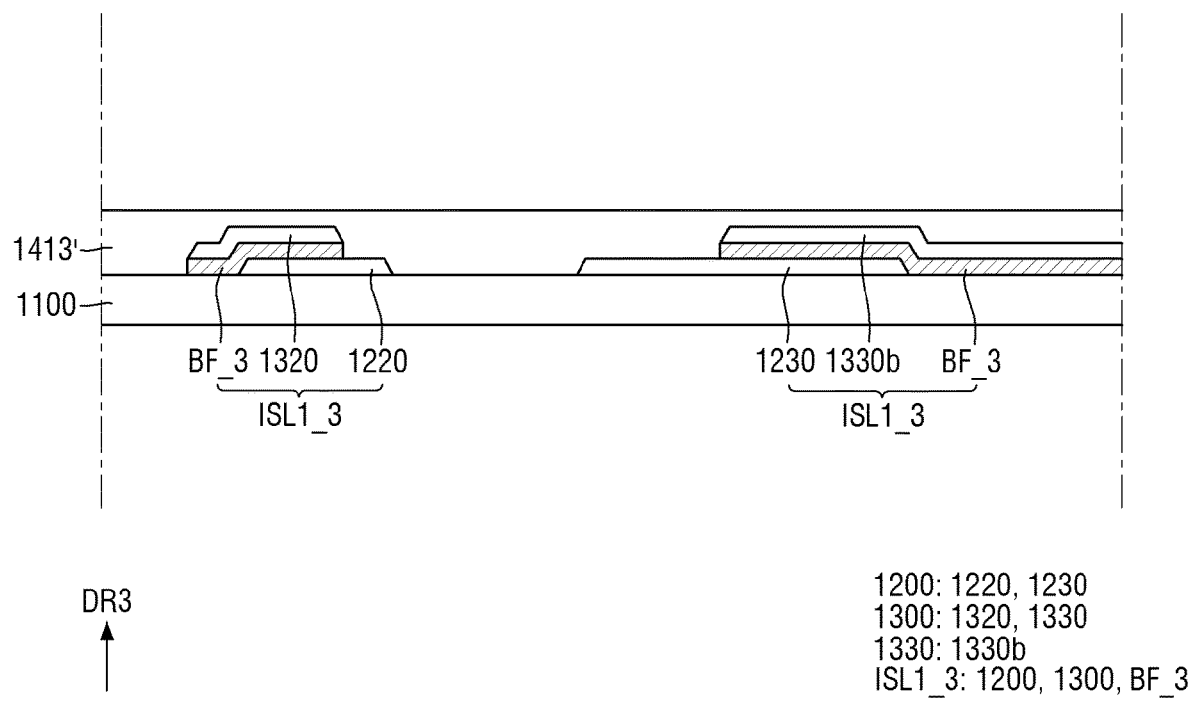
FIGS. 34 to 36 are schematic cross-sectional views showing some processing steps of a method of fabricating the display device according to the embodiment of FIG. 33.
Figure 35:
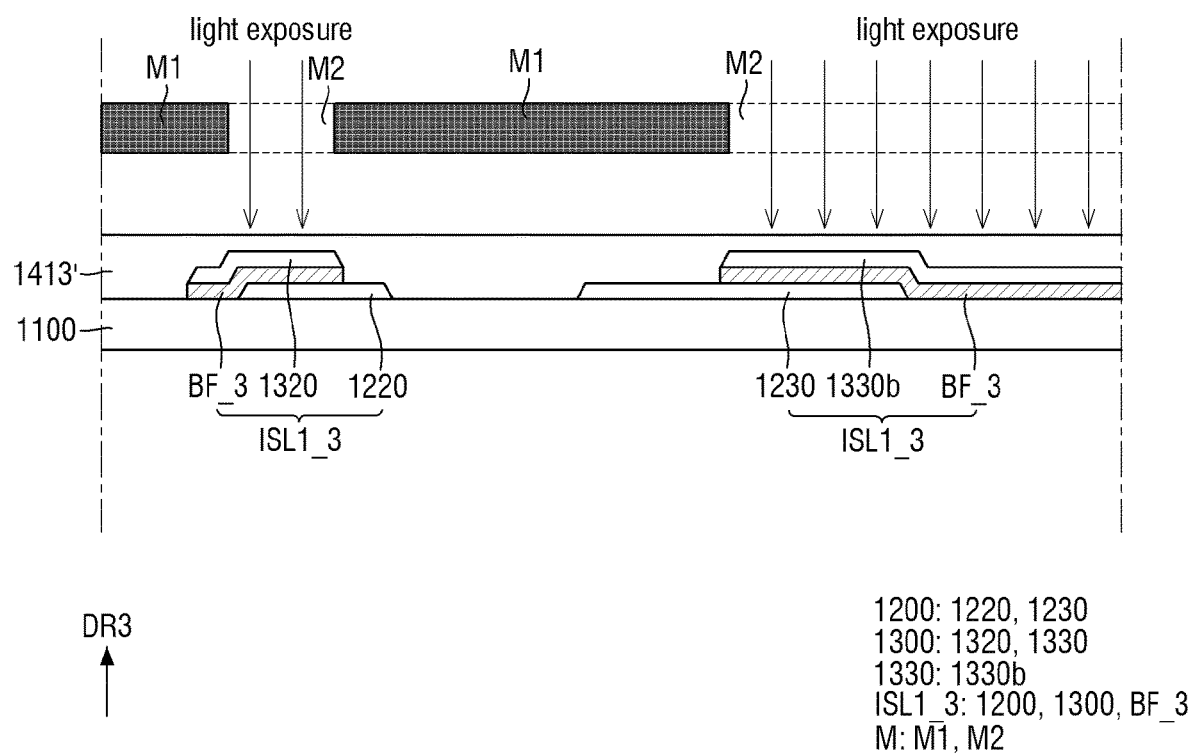
Figure 36:
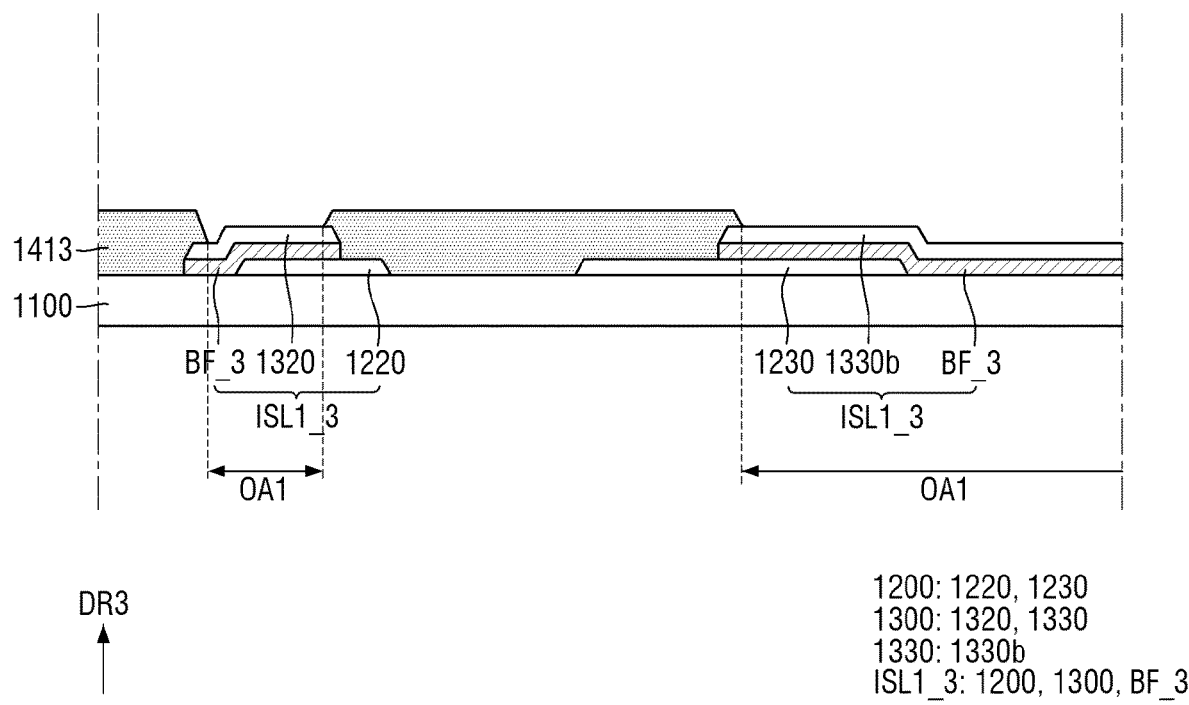

FIG. 33 is a schematic cross-sectional view of a sub-pixel of a display device according to yet another embodiment of the disclosure. FIGS. 34 to 36 are schematic cross-sectional views illustrating some processing steps of a method of fabricating the display device according to the embodiment of FIG. 33.

In the example shown in FIG. 33, a protective layer 1403 of a display device 1_3 according to the embodiment may form an open area OA in which a part of the upper surface of each of a semiconductor layer 1300, a first metal layer 1500, a second metal layer 1600, and a third metal layer 1700 is exposed. Specifically, a first protective layer 1413 may expose a part of the upper surface of the semiconductor layer 1300, a second protective layer 1423 may expose a part of the upper surface of the first metal layer 1500, a third protective layer 1433 may expose a part of the upper surface of the second metal layer 1600, and a fourth protective layer 1443 may expose a part of the upper surface of the third metal layer 1700.

According to this embodiment, the first protective layer 1413 may form a first open area OA1 exposing the part of the upper surface of the semiconductor layer 1300, and a first gate insulating layer GI1_3 may directly contact the part of the upper surface of the semiconductor layer 1300 exposed in the first open area OA1. Accordingly, a first island part ISL1_3 and a second island part ISL2_3 may be spaced apart from each other in the third direction DR3 with the first protective layer 1413 therebetween, and may partially contact each other in the third direction DR3. Accordingly, the value of the capacitor formed under the second metal layer 1600 can be increased.

The second protective layer 1423 may form a second open area OA2 exposing a part of the upper surface of the first metal layer 1500. Accordingly, although not shown in the drawings, the second island part ISL2_3 and a third island part ISL3_3 may be spaced apart from each other in the third direction DR3 with the second protective layer 1423 therebetween, and may partially contact each other in the third direction DR3. The second protective layer 1423 may cover a part of the upper surface of the semiconductor layer 1300 exposed by the first open area OA1 that does not contact the first gate insulating layer GI1_3. In this instance, a second contact hole CNT2_3 may penetrate through the third protective layer 1433 and the second protective layer 1423 to electrically connect a second source electrode S2 with a second active area 1320.

The third protective layer 1433 may form a third open area OA3 exposing a part of the upper surface of the second metal layer 1600, and an interlayer dielectric layer ILD_3 may directly contact a part of the upper surface of the second metal layer 1600 exposed by the third open area OA3. Accordingly, a third island part ISL3_3 and a fourth island part ISL4_3 may be spaced apart from each other in the third direction DR3 with the third protective layer therebetween, and may partially contact each other in the third direction DR3. In this instance, a third contact hole CNT3_3 may penetrate through the interlayer dielectric layer ILD_3 to electrically connect the first supply voltage line VDDL with the third capacitor electrode 1630. Accordingly, the value of the capacitor formed under the third metal layer 1700 can be increased. The third protective layer 1433 may cover the upper surface of the first metal layer 1500 exposed by the second open area OA2.

The fourth protective layer 1443 may form a fourth open area OA4 exposing a part of the upper surface of the third metal layer 1700. A via insulating layer VIA on the fourth protective layer 1443 may cover the upper surface of the third metal layer 1700 exposed by the fourth open area OA4. Accordingly, in case that a conductive metal layer is additionally disposed on the fourth protective layer 1443, the value of the capacitor formed under the metal layer can be increased.

Hereinafter, a process of forming the first open area OA1 in the method of fabricating the display device 1 according to the embodiment of FIG. 33 will be described. The process of forming the first open area OA1 is substantially identical to the process of forming the second open area OA2, the third exposed area OA3, and the fourth exposed area OA4 and, therefore, the redundant descriptions will be omitted.

Referring to FIGS. 34 to 36, a first protective material layer 1413' is formed over the first island part ISL1_3 formed on the substrate 1100, and a part of the first protective material layer 1413' is exposed to light and developed using a mask M including a first mask M1 and a second mask M2, so that a first protective layer 1413 including a first open area OA1 is formed. For example, since the first protective material layer 1413' may include a photosensitive organic material, a light-transmitting portion of the mask is located in line with a position where the first open area OA1 is to be formed, and a light-blocking portion of the mask is located above the other position, so that a part of the first protective material layer 1413' is exposed to light and developed. As a result, the first protective layer 1413 including the first open area OA1 can be formed.

Figure 37:
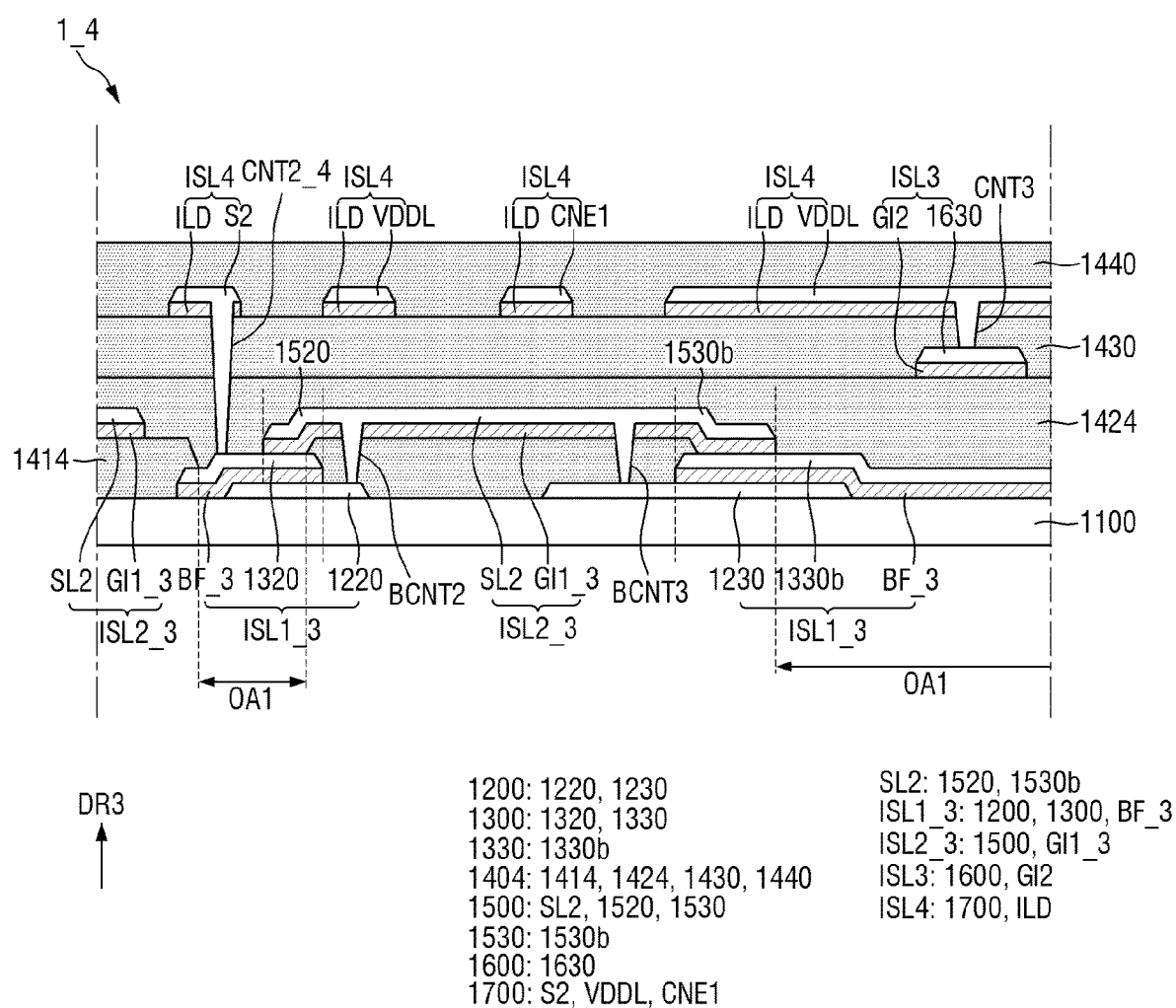
FIG. 37 is a schematic cross-sectional view of a sub-pixel of a display device according to yet another embodiment of the disclosure.

FIG. 37 is a schematic cross-sectional view of a sub-pixel of a display device according to yet another embodiment of the disclosure.

A display device 1_4 according to the embodiment of FIG. 37 is different from the display device 1 according to the embodiment of FIG. 1 at least in that a protective layer 1404 includes an open area OA in which only some of the upper surface of a semiconductor layer 1300, the upper surface of a first metal layer 1500, the upper surface of a second metal layer 1600, the upper surface of a third metal layer 1700 are exposed. Specifically, a first protective layer 1414 may form the first open area OA1 exposing a part of the upper surface of the semiconductor layer 1300. This may be because the first protective layer 1414 is formed via the process of fabricating the display device 1 according to the embodiment of FIG. 33 while a second protective layer 1424, the third protective layer 1430, and the fourth protective layer 1440 are formed via the process of fabricating the display device 1 according to the embodiment of FIG. 1.

In some embodiments, only the first protective layer 1414 may form the first open area OA1, but the disclosure is not limited thereto. For example, only the second protective layer 1424 may form a second open area OA2.

Figure 38:
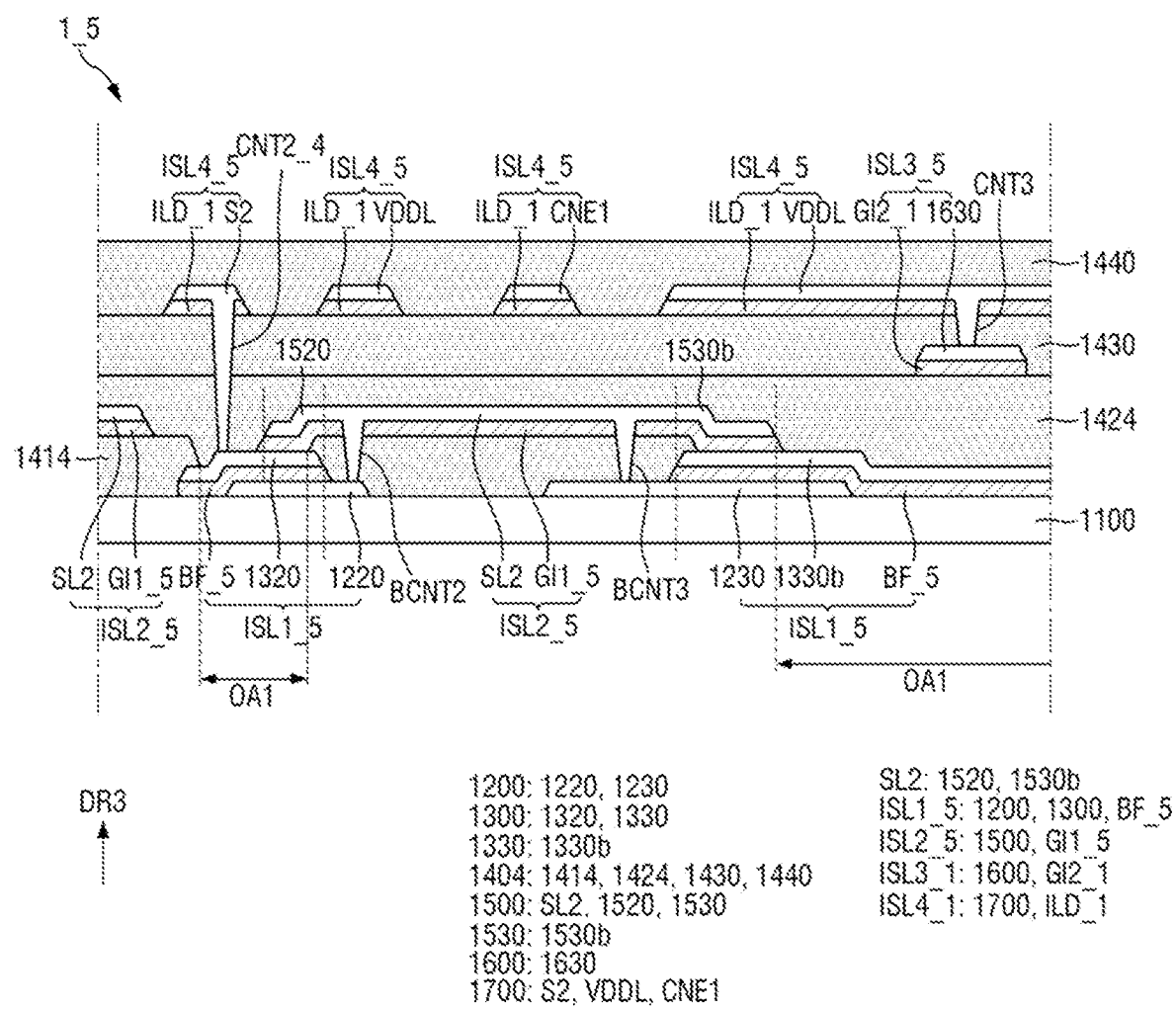
FIG. 38 is a schematic cross-sectional view of a sub-pixel of a display device according to yet another embodiment of the disclosure.

FIG. 38 is a schematic cross-sectional view of a sub-pixel of a display device according to yet another embodiment of the disclosure.

A display device 1_5 according to the embodiment of FIG. 38 is different from the display device 1 according to the embodiment of FIG. 1 at least in that a protective layer 1404 includes an open area OA in which only some of the upper surface of a semiconductor layer 1300, the upper surface of a first metal layer 1500, the upper surface of a second metal layer 1600, the upper surface of a third metal layer 1700 are exposed. Specifically, the first protective layer 1414 may form the first open area OA1 exposing a part of the upper surface of the semiconductor layer 1300. This may be because a first island part ISL1_5, a second island part ISL2_5, a third island part ISL3_5, and the fourth island part ISL4_5 are formed via the process of fabricating the display device 1_1 according to the embodiment of FIG. 28, the first protective layer 1414 is formed via the process of fabricating the display device 1 according to the embodiment of FIG. 33, and the second protective layer 1424, the third protective layer 1430, and the fourth protective layer 1440 are formed via the process of fabricating the display device 1 according to the embodiment of FIG. 1.

In some embodiments, only the first protective layer 1414 may form the first open area OA1, but the disclosure is not limited thereto. For example, only the second protective layer 1424 may form a second open area OA2.

Figure 39:
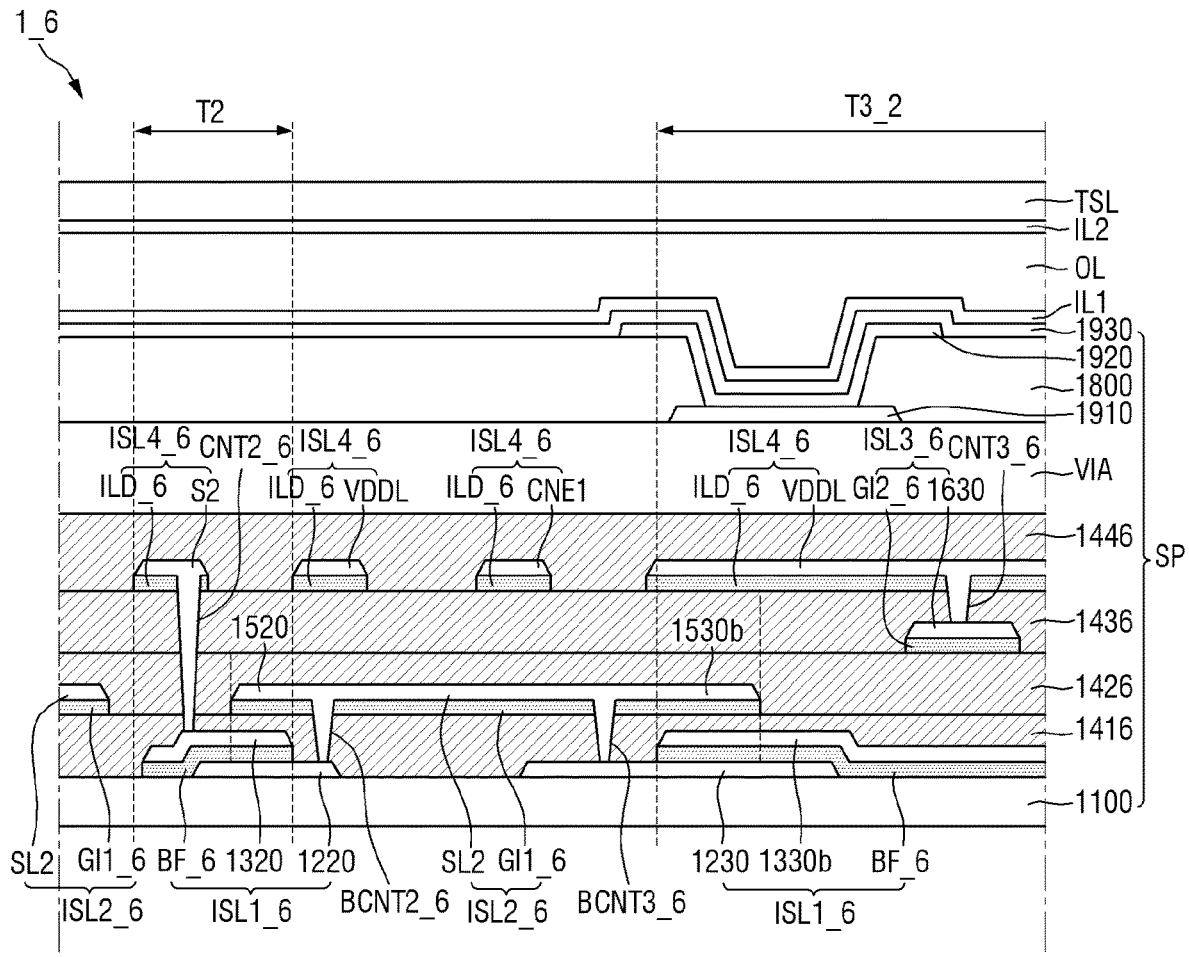
FIG. 39 is a schematic cross-sectional view of a sub-pixel of a display device according to yet another embodiment of the disclosure.

FIG. 39 is a schematic cross-sectional view of a sub-pixel of a display device according to yet another embodiment of the disclosure.

A display device 1_6 according to the embodiment of FIG. 39 is different from the display device 1 according to the embodiment of FIG. 1 at least in that a buffer layer BF_6, a first gate insulating layer GI1_6, a second gate insulating layer GI2_6, and an interlayer dielectric layer ILD_6 may include an organic insulating material, and a first protective layer 1416, a second protective layer 1426, a third protective layer 1436, and a fourth protective layer 1446 may include an inorganic insulating material.

In some embodiments, the buffer layer BF_6, the first gate insulating layer GI1_6, the second gate insulating layer GI2_6, and the interlayer dielectric layer ILD_6 may include polyimide, polyamide, acrylic resin, benzocyclobutene, hexamethyldisiloxane, phenol resins, etc., and the first protective layer 1416, the second protective layer 1426, the third protective layer 1436, and the fourth protective layer 1446 may include silicon oxide, silicon nitride, etc.

With the above configuration, in the display device 1_6 according to this embodiment, a protective layer 1406 including an inorganic insulating material, and the insulating layers BF_6, GI1_6, GI2_6, and ILD_6 including an organic insulating material are mixed, so that a multi-layered structure including the inorganic insulating material and the organic insulating material is formed. Accordingly, it is possible to improve the reliability of the device by increasing the shock resistance resulting from external shocks.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
    a protective layer comprising:
        a first area located on a substrate;
        a second area located on the first area;
        a third area located on the second area; and
        a fourth area located on the third area;
    a first island part disposed in the first area of the protective layer, the first island part comprising:
        a buffer layer disposed on the substrate; and
        a semiconductor layer disposed on the buffer layer;
    a second island part disposed in the second area of the protective layer, the second island part comprising:
        a first gate insulating layer disposed on the first area; and
        a first metal layer disposed on the first gate insulating layer;
    a third island part disposed in the third area of the protective layer, the third island part comprising:
        a second gate insulating layer disposed on the second area; and
        a second metal layer disposed on the second gate insulating layer-; and
    a fourth island part disposed in the fourth area of the protective layer, the fourth island part comprising:
        an interlayer dielectric layer disposed on the third area; and
        a third metal layer disposed on the interlayer dielectric layer, wherein
    the buffer layer of the first island part has a profile conforming to a profile of the semiconductor layer in a plan view,
    the first gate insulating layer of the second island part has a profile conforming to a profile of the first metal in a plan view,
    the second gate insulating layer of the third island part has a profile conforming to a profile of the second metal layer in a plan view, and
    the interlayer dielectric layer of the fourth island part has a profile conforming to a profile of the third metal layer in a plan view.

2. The display device of claim 1, wherein
    the first island part further comprises a bottom metal layer disposed between the substrate and the buffer layer, and
    a part of the first metal layer of the second island part is electrically connected to the bottom metal layer.

3. The display device of claim 1, wherein
    the protective layer comprises an organic insulating material, and
    the buffer layer, the first gate insulating layer, the second gate insulating layer, and the interlayer dielectric layer comprise an inorganic insulating material.

4. The display device of claim 3, wherein the first area, the second area, the third area, and the fourth area of the protective layer comprise a same material.

5. The display device of claim 3, wherein at least two of the first area, the second area, the third area, and the fourth area of the protective layer comprise different materials.

6. The display device of claim 1, wherein
the first island part and the second island part are spaced apart from each other, the first area of the protective layer being disposed between the first and second island parts,
the second island part and the third island part are spaced apart from each other, the second area of the protective layer being disposed between the second and third island parts, and
the third island part and the fourth island part are spaced apart from each other, the third area of the protective layer being disposed between the third and fourth island parts.

7. The display device of claim 1, wherein
the buffer layer of the first island part completely overlaps the semiconductor layer in a plan view,
the first gate insulating layer of the second island part completely overlaps the first metal layer in a plan view,
the second gate insulating layer of the third island part completely overlaps the second metal layer in a plan view, and
the interlayer dielectric layer of the fourth island part completely overlaps the third metal layer in a plan view.

8. The display device of claim 1, wherein
the protective layer comprises an inorganic insulating material, and
the buffer layer, the first gate insulating layer, the second gate insulating layer, and the interlayer dielectric layer comprise an organic insulating material.

9. The display device of claim 1, wherein
the first area, the second area, the third area, and the fourth area of the protective layer correspond to a first layer, a second layer, a third layer, and a fourth layer of the protective layer, respectively, and
the first protective layer is disposed on the first island part and overlaps the first island part in a plan view, the second protective layer is disposed on the second island part and overlaps the second island part in a plan view, the third protective layer is disposed on the third island part and overlaps the third island part in a plan view, and the fourth protective layer is disposed on the fourth island part and overlaps the fourth island part in a plan view.

10. The display device of claim 1, wherein
the first area, the second area, the third area, and the fourth area of the protective layer correspond to a first layer, a second layer, a third layer, and a fourth layer of the protective layer, respectively, and
the first island part is disposed between the substrate and the first protective layer in a thickness direction of the display device, the second island part is disposed between the first protective layer and the second protective layer in the thickness direction of the display device, the third island part is disposed between the second protective layer and the third protective layer in the thickness direction of the display device, and the fourth island part is disposed between the third protective layer and the fourth protective layer in the thickness direction of the display device.

11. The display device of claim 1, wherein
the first area, the second area, the third area, and the fourth area of the protective layer correspond to a first layer, a second layer, a third layer, and a fourth layer of the protective layer, respectively,
the second layer directly contacts each of the first layer and the third layer, and
the fourth layer directly contacts the third layer.

12. A display device comprising:
a first inorganic insulating layer disposed on a substrate;
a first conductive layer disposed on the first inorganic insulating layer;
a first organic insulating layer disposed on the first conductive layer;
a second inorganic insulating layer disposed on the first organic insulating layer;
a second conductive layer disposed on the second inorganic insulating layer; and
a second organic insulating layer disposed on the second conductive layer, wherein
the first inorganic insulating layer has a profile conforming to a profile of the first conductive layer in a plan view,
the second inorganic insulating layer has a profile conforming to a profile of the second conductive layer in a plan view,
a side surface of the first inorganic insulating layer and a side surface of the first conductive layer contact the first organic insulating layer, and
a side surface of the second inorganic insulating layer and a side surface of the second conductive layer contact the second organic insulating layer.

13. The display device of claim 12, further comprising:
a third inorganic insulating layer disposed on the second organic insulating layer;
a third conductive layer disposed on the third inorganic insulating layer;
a third organic insulating layer disposed on the third conductive layer;
a fourth inorganic insulating layer disposed on the third organic insulating layer;
a fourth conductive layer disposed on the fourth inorganic insulating layer; and
a fourth organic insulating layer disposed on the fourth conductive layer, wherein the third inorganic insulating layer has a profile conforming to a profile of the third conductive layer in a plan view,
the fourth inorganic insulating layer has a profile conforming to a profile of the fourth conductive layer in a plan view,
a side surface of the third inorganic insulating layer and a side surface of the third conductive layer contact the third organic insulating layer, and
a side surface of the fourth inorganic insulating layer and a side surface of the fourth conductive layer contact the fourth organic insulating layer.

14. The display device of claim 13, wherein
the first organic insulating layer includes a first open area exposing a part of the first conductive layer,
the second organic insulating layer includes a second open area exposing a part of the second conductive layer,
the third organic insulating layer includes a third open area exposing a part of the third conductive layer, and
the fourth organic insulating layer includes a fourth open area exposing a part of the fourth conductive layer.

15. The display device of claim 14, wherein a part of the first conductive layer exposed by the first open area directly contacts the second inorganic insulating layer.

16. The display device of claim 15, wherein a part of the first conductive layer that is exposed by the first open area and does not directly contact the second inorganic insulating layer, directly contacts the second organic insulating layer.

17. The display device of claim 15, wherein a part of the third conductive layer exposed by the third open area directly contacts the fourth inorganic insulating layer.

18. The display device of claim 12, further comprising:
a bottom metal layer disposed between the substrate and the first inorganic insulating layer, wherein
the first inorganic insulating layer exposes a part of the bottom metal layer, and the first organic insulating layer covers a part of the bottom metal layer exposed by the first inorganic insulating layer.

19. The display device of claim 13, wherein
the first inorganic insulating layer completely overlaps the first conductive layer in a plan view,
the second inorganic insulating layer completely overlaps the second conductive layer in a plan view,
the third inorganic insulating layer completely overlaps the third conductive layer in a plan view, and
the fourth inorganic insulating layer completely overlaps the fourth conductive layer in a plan view.

20. A display device comprising:
a protective layer disposed on a surface of a substrate and comprising an organic insulating material; and
a buffer layer, a semiconductor layer, a first gate insulating layer, a first metal layer, a second gate insulating layer, a second metal layer, an interlayer dielectric layer, and a third metal layer disposed sequentially in a first direction perpendicular to the surface of the substrate in the protective layer, wherein
each of the buffer layer, the semiconductor layer, the first gate insulating layer, the first metal layer, the second gate insulating layer, the second metal layer, the interlayer dielectric layer, and the third metal layer has a side surface that faces the protective layer, that is in direct contact with the protective layer, and that intersects a plane parallel to the surface of the substrate,
the side surface of the buffer layer is connected to the side surface of the semiconductor layer, the side surface of the first gate insulating layer being connected to the side surface of the first metal layer,
the side surface of the second gate insulating layer is connected to the side surface of the second metal layer, and
the side surface of the interlayer dielectric layer is connected to the side surface of the third metal layer.

21. The display device of claim 20, wherein
each of an angle between the side surface of the semiconductor layer and a plane perpendicular to the first direction, an angle between the side surface of the first metal layer and the plane perpendicular to the first direction, an angle between the side surface of the second metal layer and the plane perpendicular to the first direction, and an angle between the side surface of the third metal layer and the plane perpendicular to the first direction is in a range of about 49° to about 79°, and
each of an angle between the side surface of the buffer layer and the plane perpendicular to the first direction, an angle between the side surface of the first gate insulating layer and the plane perpendicular to the first direction, an angle between the side surface of the second gate insulating layer and the plane perpendicular to the first direction, and an angle between the side surface of the interlayer dielectric layer and the plane perpendicular to the first direction is in a range of about 79° to about 90°.

22. The display device of claim 20, wherein
each of an angle between the side surface of the semiconductor layer and a plane perpendicular to the first direction, an angle between the side surface of the first metal layer and the plane perpendicular to the first direction, an angle between the side surface of the second metal layer and the plane perpendicular to the first direction, and an angle between the side surface of the third metal layer and the plane perpendicular to the first direction is in a range of about 49° to about 79°, and
each of an angle between the side surface of the buffer layer and the plane perpendicular to the first direction, an angle between the side surface of the first gate insulating layer and the plane perpendicular to the first direction, an angle between the side surface of the second gate insulating layer and the plane perpendicular to the first direction, and an angle between the side surface of the interlayer dielectric layer and the plane perpendicular to the first direction is equal to or less than about 49°.

23. The display device of claim 20, wherein the side surface of each of the buffer layer, the semiconductor layer, the first gate insulating layer, the first metal layer, the second gate insulating layer, the second metal layer, the interlayer dielectric layer, and the third metal layer corresponds to an outer periphery of the buffer layer, the semiconductor layer, the first gate insulating layer, the first metal layer, the second gate insulating layer, the second metal layer, the interlayer dielectric layer, and the third metal layer, respectively.

* * * * *